US011562979B2

(12) United States Patent
Matsui et al.

(10) Patent No.: US 11,562,979 B2
(45) Date of Patent: Jan. 24, 2023

(54) POWER MODULE AND METHOD OF MANUFACTURING THE SAME, AND POWER CONVERSION APPARATUS

(71) Applicant: Mitsubishi Electric Corporation, Tokyo (JP)

(72) Inventors: Chika Matsui, Tokyo (JP); Junji Fujino, Tokyo (JP); Satoshi Kondo, Tokyo (JP); Masao Uchigasaki, Tokyo (JP)

(73) Assignee: MITSUBISHI ELECTRIC CORPORATION, Tokyo (JP)

(*) Notice: Subject to any disclaimer, the term of this patent is extended or adjusted under 35 U.S.C. 154(b) by 40 days.

(21) Appl. No.: 17/057,343

(22) PCT Filed: Jun. 18, 2019

(86) PCT No.: PCT/JP2019/024141
§ 371 (c)(1),
(2) Date: Nov. 20, 2020

(87) PCT Pub. No.: WO2020/004153
PCT Pub. Date: Jan. 2, 2020

(65) Prior Publication Data
US 2021/0217724 A1 Jul. 15, 2021

(30) Foreign Application Priority Data

Jun. 27, 2018 (JP) .............................. JP2018-121663
Dec. 6, 2018 (JP) .............................. JP2018-229024

(51) Int. Cl.
H01L 23/00 (2006.01)
H01L 21/56 (2006.01)
H01L 23/31 (2006.01)

(52) U.S. Cl.
CPC .............. *H01L 24/49* (2013.01); *H01L 21/56* (2013.01); *H01L 23/3121* (2013.01);
(Continued)

(58) Field of Classification Search
CPC ............................................... H01L 2224/4917
See application file for complete search history.

(56) References Cited

U.S. PATENT DOCUMENTS

2008/0258316 A1 10/2008 Tamba et al.
2010/0308457 A1* 12/2010 Ishii ........................ H01L 24/49
257/784

(Continued)

FOREIGN PATENT DOCUMENTS

JP 2000012576 A 1/2000
JP 2005064248 A 3/2005

(Continued)

OTHER PUBLICATIONS

International Search Report (PCT/ISA/210) and translation and Written Opinion (PCT/ISA/237) dated Aug. 13, 2019, by the Japan Patent Office as the International Searching Authority for International Application No. PCT/JP2019/024141.

*Primary Examiner* — Yu-Hsi D Sun
(74) *Attorney, Agent, or Firm* — Buchanan Ingersoll & Rooney PC

(57) ABSTRACT

A power module includes a plurality of conductive wire groups and a sealing member. The plurality of conductive wire groups each include a first bonded portion and a second bonded portion. A maximum gap between intermediate portions of a pair of conductive wire groups adjacent to each other is larger than a first gap between the first bonded portions of the pair of conductive wire groups adjacent to each other. The maximum gap between the intermediate portions of the pair of conductive wire groups adjacent to each other is larger than a second gap between the second (Continued)

bonded portions of the pair of conductive wire groups adjacent to each other. Therefore, the power module is improved in reliability.

10 Claims, 38 Drawing Sheets

(52) U.S. Cl.
CPC .............. *H01L 24/48* (2013.01); *H01L 24/73* (2013.01); *H01L 24/92* (2013.01); *H01L 2224/48139* (2013.01); *H01L 2224/4909* (2013.01); *H01L 2224/4917* (2013.01); *H01L 2224/49175* (2013.01); *H01L 2224/73265* (2013.01); *H01L 2224/92247* (2013.01); *H01L 2924/19107* (2013.01)

(56) References Cited

U.S. PATENT DOCUMENTS

| 2015/0333039 | A1* | 11/2015 | Liu | ................. H01L 23/528 257/773 |
|---|---|---|---|---|
| 2017/0207146 | A1 | 7/2017 | Ouyang et al. | |

FOREIGN PATENT DOCUMENTS

| JP | 2007157958 A | 6/2007 |
|---|---|---|
| JP | 2008270455 A | 11/2008 |
| JP | 2010283053 A | 12/2010 |
| JP | 2011151214 A | 8/2011 |
| JP | 2016219509 A | 12/2016 |
| JP | 2017034152 A | 2/2017 |
| JP | 2017157604 A | 9/2017 |
| JP | 2018073923 A | 5/2018 |

* cited by examiner

POWER MODULE AND METHOD OF MANUFACTURING THE SAME, AND POWER CONVERSION APPARATUS

TECHNICAL FIELD

The present invention relates to a power module and a method of manufacturing the same, and a power conversion apparatus.

BACKGROUND ART

Japanese Patent Laying-Open No. 2008-270455 (PTL 1) discloses a power module including an insulated gate bipolar transistor (IGBT) chip, an emitter pattern, a plurality of conductive wires, and a sealing member composed of an epoxy resin. The plurality of conductive wires electrically connect the IGBT chip and the emitter pattern to each other. The sealing member seals the IGBT chip, the emitter pattern, and the plurality of conductive wires. The sealing member is provided by direct potting.

CITATION LIST

Patent Literature

PTL 1: Japanese Patent Laying-Open No. 2008-270455

SUMMARY OF INVENTION

Technical Problem

In order to allow a power module to handle a higher current without increase in size thereof, the number of conductive wires should be increased and a gap between a pair of conductive wires adjacent to each other should be made smaller. Since the gap between the pair of the conductive wires adjacent to each other, however, is small, air bubbles introduced into the sealing member in providing the sealing member may remain in the sealing member below the plurality of conductive wires. The air bubbles lower insulating performance of the sealing member and lowers reliability of the power module. The present invention was made in view of the problem above, and an object thereof is to provide a power module improved in reliability and a method of manufacturing the same and a power conversion apparatus.

Solution to Problem

A power module according to a first aspect of the present invention includes a first conductive member, a second conductive member, a plurality of conductive wire groups, and a sealing member. The plurality of conductive wire groups electrically connect the first conductive member and the second conductive member spaced away from the first conductive member in a first direction to each other. The sealing member seals at least a part of the first conductive member, at least a part of the second conductive member, and the plurality of conductive wire groups. The plurality of conductive wire groups are arranged in parallel in a second direction that intersects with the first direction. The plurality of conductive wire groups each include a first bonded portion bonded to the first conductive member and a second bonded portion bonded to the second conductive member. In a plan view of the first conductive member, a maximum gap in the second direction between intermediate portions of a pair of the conductive wire groups adjacent to each other is larger than a first gap in the second direction between the first bonded portions of the pair of conductive wire groups adjacent to each other. The intermediate portions are located between the first bonded portion and the second bonded portion. In the plan view of the first conductive member, the maximum gap in the second direction between the intermediate portions of the pair of conductive wire groups adjacent to each other is larger than a second gap in the second direction between the second bonded portions of the pair of conductive wire groups adjacent to each other.

A power module in a second aspect of the present invention includes a first conductive member, a second conductive member spaced away from the first conductive member in a first direction, a conductive wire group that electrically connects the first conductive member and the second conductive member to each other, and a sealing member that seals at least a part of the first conductive member, at least a part of the second conductive member, and the conductive wire group. The conductive wire group is constituted of a first conductive wire and a second conductive wire alternately arranged in a second direction that intersects with the first direction. The conductive wire group includes a first bonded portion bonded to the first conductive member and a second bonded portion bonded to the second conductive member. In a first plan view in the second direction, a first height of a first top of the first conductive wire from a first line that connects the first bonded portion and the second bonded portion to each other is larger than a second height of a first portion of the second conductive wire from the first line. The first portion is a portion of the second conductive wire on a second line that passes through the first top and is perpendicular to the first line in the first plan view. A difference between the first height and the second height is larger than a minimum gap between the first conductive wire and the second conductive wire adjacent to each other, between the first bonded portion and the second bonded portion in a second plan view in a third direction perpendicular to the first direction and the second direction.

A method of manufacturing a power module in the first aspect of the present invention includes electrically connecting a first conductive member and a second conductive member spaced away from the first conductive member in a first direction to each other through a plurality of conductive wire groups. The plurality of conductive wire groups are arranged in parallel in a second direction that intersects with the first direction. The method of manufacturing a power module in the first aspect of the present invention further includes sealing at least a part of the first conductive member, at least a part of the second conductive member, and the plurality of conductive wire groups with a sealing member. The plurality of conductive wire groups each include a first bonded portion bonded to the first conductive member and a second bonded portion bonded to the second conductive member. In a plan view of the first conductive member, a maximum gap in the second direction between intermediate portions of a pair of the conductive wire groups adjacent to each other is larger than a first gap in the second direction between the first bonded portions of the pair of conductive wire groups adjacent to each other. The intermediate portions are located between the first bonded portion and the second bonded portion. In the plan view of the first conductive member, the maximum gap in the second direction between the intermediate portions of the pair of conductive wire groups adjacent to each other is larger than a second gap in the second direction between the second bonded portions of the pair of conductive wire groups adjacent to each other.

A method of manufacturing a power module according to the second aspect of the present invention includes electrically connecting a first conductive member and a second conductive member spaced away from the first conductive member in a first direction to each other through a conductive wire group. The conductive wire group is constituted of a first conductive wire and a second conductive wire alternately arranged in a second direction that intersects with the first direction. The method of manufacturing a power module according to the second aspect of the present invention includes sealing at least a part of the first conductive member, at least a part of the second conductive member, and the conductive wire group with a sealing member. The conductive wire group includes a first bonded portion bonded to the first conductive member and a second bonded portion bonded to the second conductive member. In a first plan view in the second direction, a first height of a first top of the first conductive wire from a first line that connects the first bonded portion and the second bonded portion to each other is larger than a second height of a first portion of the second conductive wire from the first line. The first portion is a portion of the second conductive wire on a second line that passes through the first top and is perpendicular to the first line in the first plan view. A difference between the first height and the second height is larger than a minimum gap between the first conductive wire and the second conductive wire adjacent to each other, between the first bonded portion and the second bonded portion in a second plan view in a third direction perpendicular to the first direction and the second direction.

A power conversion apparatus according to the present invention includes a main conversion circuit and a control circuit. The main conversion circuit includes the power module according to the first or second aspect of the present invention and can convert input electric power and output resultant electric power. The control circuit can output a control signal for controlling the main conversion circuit to the main conversion circuit.

Advantageous Effects of Invention

According to the power module and the method of manufacturing the same and the power conversion apparatus in the first aspect of the present invention, in the plan view of the first conductive member, the maximum gap in the second direction between the intermediate portions of the pair of conductive wire groups adjacent to each other is larger than the first gap in the second direction between the first bonded portions of the pair of conductive wire groups adjacent to each other and larger than the second gap in the second direction between the second bonded portions of the pair of conductive wire groups adjacent to each other. Therefore, air bubbles that were introduced in the sealing member in providing the sealing member and remain below the plurality of conductive wires readily pass between the pair of conductive wire groups adjacent to each other and escape to the outside of the sealing member. Lowering in insulating performance of the sealing member is prevented. The power module and the power conversion apparatus according to the first aspect of the present invention are improved in reliability. According to the method of manufacturing a power module in the first aspect of the present invention, the power module improved in reliability is obtained.

According to the power module and the method of manufacturing the same and the power conversion apparatus in the second aspect of the present invention, the difference between the first height of the first top of the first conductive wire and the second height of the first portion of the second conductive wire is larger than the minimum gap between the first conductive wire and the second conductive wire adjacent to each other, between the first bonded portion and the second bonded portion in the second plan view in the third direction perpendicular to the first direction and the second direction. The first conductive wire and the second conductive wire are alternately arranged in the second direction. Therefore, a gap between the first conductive wire and the second conductive wire can efficiently be widened without increasing the minimum gap. Air bubbles that were introduced in the sealing member in providing the sealing member and remain below the plurality of conductive wires readily pass between the pair of conductive wire groups adjacent to each other and escape to the outside of the sealing member. Lowering in insulating performance of the sealing member is prevented. The power module and the power conversion apparatus according to the second aspect of the present invention are improved in reliability. According to the method of manufacturing a power module in the second aspect of the present invention, the power module improved in reliability is obtained.

DESCRIPTION OF EMBODIMENTS

Figure 1:
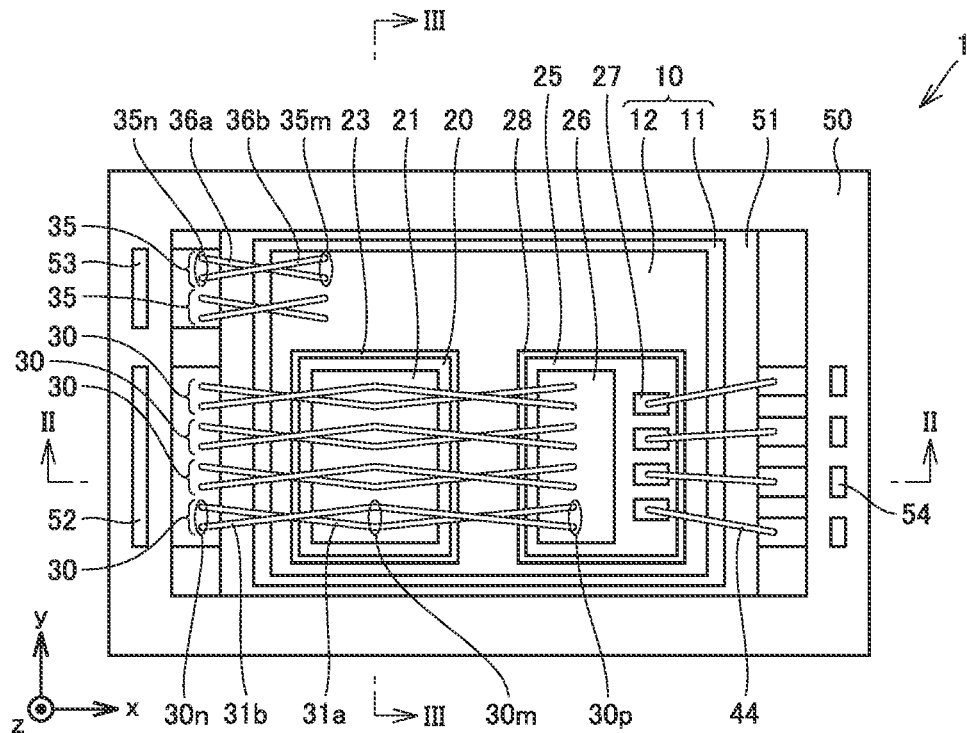
FIG. 1 is a schematic plan view of a power module according to a first embodiment.

Embodiments of the present invention will be described below. The same elements have the same reference characters allotted and description thereof will not be repeated.

First Embodiment

A power module 1 in a first embodiment will be described with reference to FIGS. 1 to 14.

Figure 2:
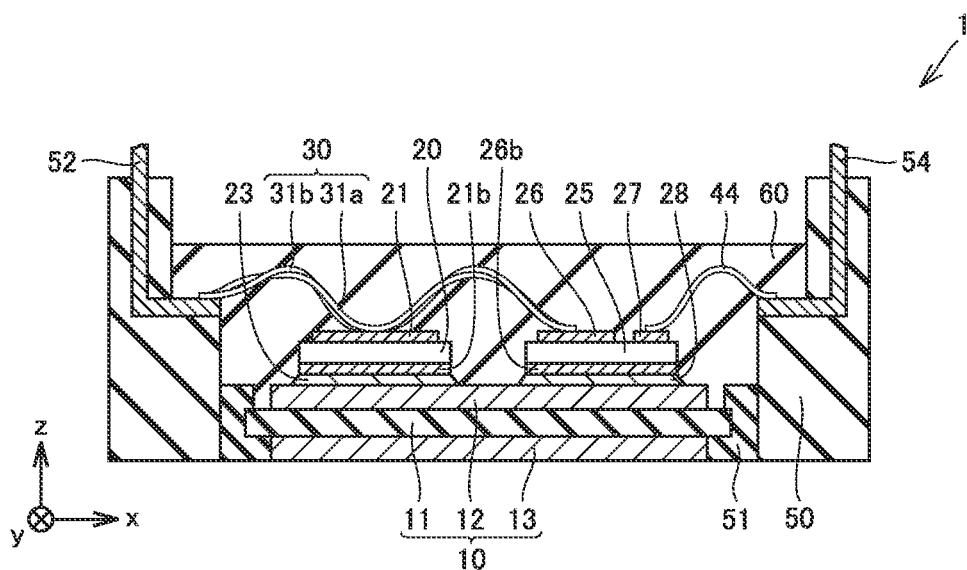
FIG. 2 is a schematic cross-sectional view along the line II-II shown in FIG. 1, of the power module according to the first embodiment.
Figure 3:
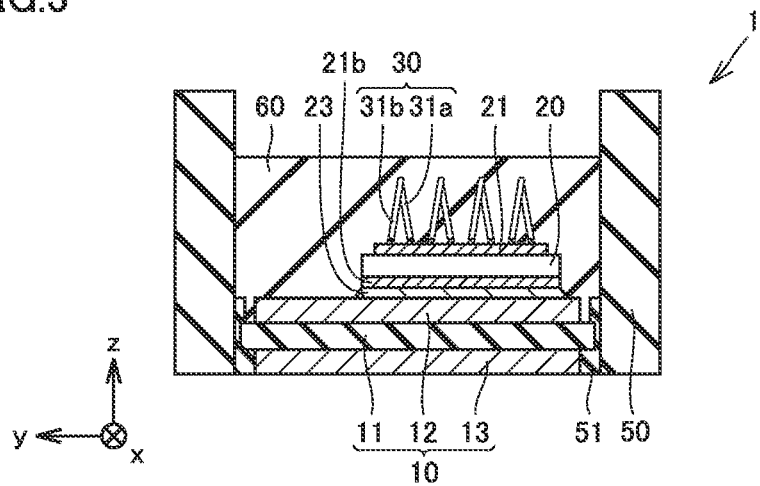
FIG. 3 is a schematic cross-sectional view along the line shown in FIG. 1, of the power module according to the first embodiment.

As shown in FIGS. 1 to 3, power module 1 includes a circuit substrate 10. Circuit substrate 10 extends in a first direction (an x direction) and a second direction (a y direction) intersecting with the first direction. Specifically, the second direction is perpendicular to the first direction. Circuit substrate 10 includes an insulating substrate 11, a first conductive layer 12, and a second conductive layer 13. Insulating substrate 11 includes a first main surface and a second main surface opposite to the first main surface.

Insulating substrate 11 is formed of an inorganic ceramic material such as alumina ($Al_2O_3$), aluminum nitride (AlN), silicon nitride ($Si_3N_4$), silicon dioxide ($SiO_2$), or boron nitride (BN). Insulating substrate 11 is an insulating resin substrate such as a glass epoxy substrate.

First conductive layer 12 is provided on the first main surface of insulating substrate 11. First conductive layer 12 is formed, for example, of a metal material such as copper or aluminum. Second conductive layer 13 is provided on the second main surface of insulating substrate 11. First conductive layer 13 is formed, for example, of a metal material such as copper or aluminum.

As shown in FIGS. 1 to 3, power module 1 includes a first semiconductor element 20 and a second semiconductor element 25. First semiconductor element 20 and second semiconductor element 25 are arranged along the first direction (the x direction). First semiconductor element 20 and second semiconductor element 25 are each a power semiconductor element such as an insulated gate bipolar transistor (IGBT), a metal oxide semiconductor field effect transistor (MOSFET), or a diode. First semiconductor element 20 and second semiconductor element 25 are formed, for example, of silicon (Si) or a wide bandgap semiconductor material such as silicon carbide (SiC), gallium nitride (GaN), or diamond. First semiconductor element 20 and second semiconductor element 25 may be identical to or different from each other in at least one of a type and a material.

In the present embodiment, first semiconductor element 20 is a diode. First semiconductor element 20 includes a first front electrode 21 and a first back electrode 21b. In the present embodiment, second semiconductor element 25 is an IGBT. Second semiconductor element 25 includes a second front electrode 26, a third front electrode 27, and a second back electrode 26b. Second front electrode 26 is, for example, an emitter electrode. Third front electrode 27 includes, for example, a gate electrode and a temperature sensor electrode. Second back electrode 26b is, for example, a collector electrode.

First semiconductor element 20 is mounted on first conductive layer 12. First back electrode 21b is joined to first conductive layer 12 by a first conductive joint member 23. Second semiconductor element 25 is mounted on first conductive layer 12 at a distance from first semiconductor element 20 in the first direction (the x direction). Second back electrode 26b is joined to first conductive layer 12 by a second conductive joint member 28. First conductive joint member 23 and second conductive joint member 28 are each, for example, solder or a conductive adhesive containing a metal filler such as a silver filler or a copper filler dispersed in a resin. First conductive joint member 23 and second conductive joint member 28 are each a sintered joint member formed, for example, by firing metal nanoparticles such as silver nanoparticles or copper nanoparticles at a low temperature not higher than 300° C.

As shown in FIGS. 1 to 3, power module 1 includes a case 50. Case 50 is formed, for example, of an electrically insulating resin such as a polyphenylene sulfide (PPS) resin, an epoxy resin, a polyimide resin, an acrylic resin, or a liquid crystal polymer (LCP). Case 50 includes a first lead terminal 52, a second lead terminal 53, and a third lead terminal 54. First lead terminal 52, second lead terminal 53, and third lead terminal 54 are formed, for example, of a metal material such as copper or aluminum. First lead terminal 52, second lead terminal 53, and third lead terminal 54 are each drawn to the outside of power module 1 through the inside of case 50.

Circuit substrate 10 is joined to case 50 by a joint member 51 such as a silicone resin adhesive. A gap between circuit substrate 10 and case 50 is filled with joint member 51 so that leakage of sealing member 60 through the gap between circuit substrate 10 and case 50 is prevented.

As shown in FIGS. 1 to 3, power module 1 further includes a plurality of first conductive wire groups 30, a plurality of second conductive wire groups 35, and a plurality of third conductive wires 44.

The plurality of first conductive wire groups 30 are arranged in parallel in the second direction (the y direction). The plurality of first conductive wire groups 30 each extend mainly along the first direction (the x direction). The plurality of first conductive wire groups 30 each include a plurality of first conductive wires 31a and 31b. In the present embodiment, the plurality of first conductive wire groups 30 each include two first conductive wires 31a and 31b. For example, the plurality of first conductive wires 31a and 31b each have a diameter of 0.4 mm.

The plurality of second conductive wire groups 35 are arranged in parallel in the second direction (the y direction) that intersects with the first direction (the x direction). The plurality of second conductive wire groups 35 each extend mainly along the first direction (the x direction). The plurality of second conductive wire groups 35 each include a plurality of second conductive wires 36a and 36b. In the present embodiment, the plurality of second conductive wire groups 35 each include two second conductive wires 36a and 36b. For example, the plurality of second conductive wires 36a and 36b each have a diameter of 0.4 mm.

The plurality of third conductive wires 44 mainly extend along the first direction (the x direction). For example, the plurality of third conductive wires 44 each have a diameter of 0.15 mm. Third front electrode 27 of second semiconductor element 25 and third lead terminal 54 are electrically connected to each other through the plurality of third conductive wires 44. The plurality of first conductive wire groups 30 (the plurality of first conductive wires 31a and 31b), the plurality of second conductive wire groups 35 (the plurality of second conductive wires 36a and 36b), and the plurality of third conductive wires 44 are, for example, aluminum wires, copper wires, copper wires coated with aluminum, or gold wires.

First front electrode 21 of first semiconductor element 20 and first lead terminal 52 are electrically connected to each other through first conductive wire groups 30. The plurality of first conductive wire groups 30 each include a bonded portion 30m bonded to first front electrode 21 of first semiconductor element 20 and a bonded portion 30n bonded to first lead terminal 52. The plurality of first conductive wires 31a and 31b in bonded portion 30m are equal to each other in potential. The plurality of first conductive wires 31a and 31b in bonded portion 30n are equal to each other in potential. Bonded portion 30m and bonded portion 30n are equal to each other in potential difference between the plurality of first conductive wires 31a and 31b.

In bonded portion 30m, the plurality of first conductive wires 31a and 31b included in the plurality of first conductive wire groups 30 may be arranged at a regular pitch (for example, 0.8 mm) in the second direction (the y direction). In bonded portion 30n, the plurality of first conductive wires 31a and 31b included in the plurality of first conductive wire groups 30 may be arranged at a regular pitch (for example, 0.8 mm) in the second direction (the y direction).

Figure 4:
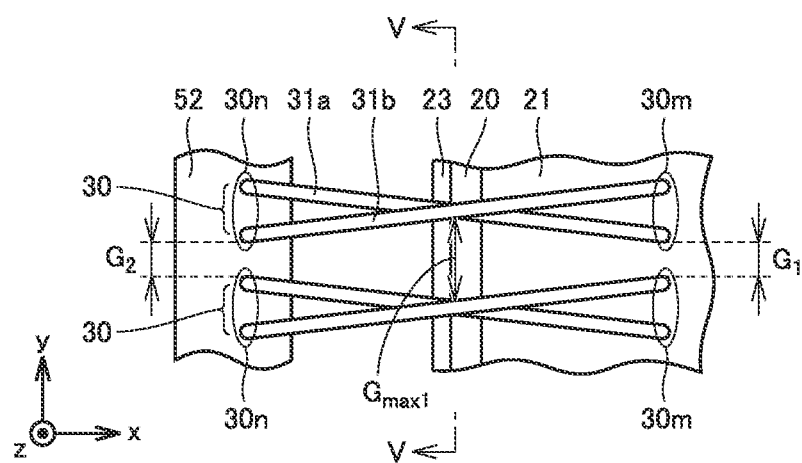
FIG. 4 is a partially enlarged schematic plan view of the power module according to the first embodiment.

As shown in FIG. 4, in a plan view of first front electrode 21, a maximum gap $G_{max1}$ in the second direction (the y direction) between first intermediate portions of the pair of first conductive wire groups 30 adjacent to each other is larger than a gap $G_1$ in the second direction (they direction) between bonded portions 30m of the pair of first conductive wire groups 30 adjacent to each other. The first intermediate portion of first conductive wire group 30 is located between bonded portion 30m and bonded portion 30n of first conductive wire group 30. In the plan view of first front electrode 21, each of the plurality of first conductive wire groups 30 is narrower in width in the first intermediate portion of first conductive wire group 30 than in bonded portion 30m of first conductive wire group 30. In the plan view of first front electrode 21, the first intermediate portion of first conductive wire group 30 is located on an inner side in the second direction (the y direction) relative to bonded portion 30m.

Maximum gap $G_{max1}$ is, for example, at least 1.2 time as large as gap $G_1$. Maximum gap $G_{max1}$ is, for example, at least 1.3 time as large as gap $G_1$. Maximum gap $G_{max1}$ is, for example, at least 1.5 time as large as gap $G_1$. Maximum gap $G_{max1}$ is, for example, at least 2.0 times as large as gap $G_1$. Maximum gap $G_{max1}$ is, for example, not shorter than 1.05 mm. Maximum gap $G_{max1}$ is, for example, not shorter than 1.10 mm. Maximum gap $G_{max1}$ is, for example, not shorter than 1.20 mm.

In the plan view of first front electrode 21, maximum gap $G_{max1}$ in the second direction (the y direction) between the first intermediate portions of the pair of first conductive wire groups 30 adjacent to each other is larger than a gap $G_2$ in the second direction (they direction) between bonded portions 30n of the pair of first conductive wire groups 30 adjacent to each other. In the plan view of first front electrode 21, each of the plurality of first conductive wire groups 30 is narrower in width in the first intermediate portion of first conductive wire group 30 than in bonded portion 30n of first conductive wire group 30. In the plan view of first front electrode 21, the first intermediate portion of first conductive wire group 30 is located on the inner side in the second direction (the y direction) relative to bonded portion 30n. Maximum gap $G_{max1}$ is, for example, at least 1.2 time as large as gap $G_2$. Maximum gap $G_{max1}$ is, for example, at least 1.3 time as large as gap $G_2$. Maximum gap $G_{max1}$ is, for example, at least 1.5 time as large as gap $G_2$. Maximum gap $G_{max1}$ is, for example, at least 2.0 times as large as gap $G_2$.

Therefore, air bubbles that were introduced in sealing member 60 in providing sealing member 60 and remain below the plurality of first conductive wires 31a and 31b readily pass between the pair of first conductive wire groups 30 adjacent to each other and escape to the outside of sealing member 60. Lowering in insulating performance of sealing member 60 is prevented. Power module 1 is improved in reliability.

Figure 6:
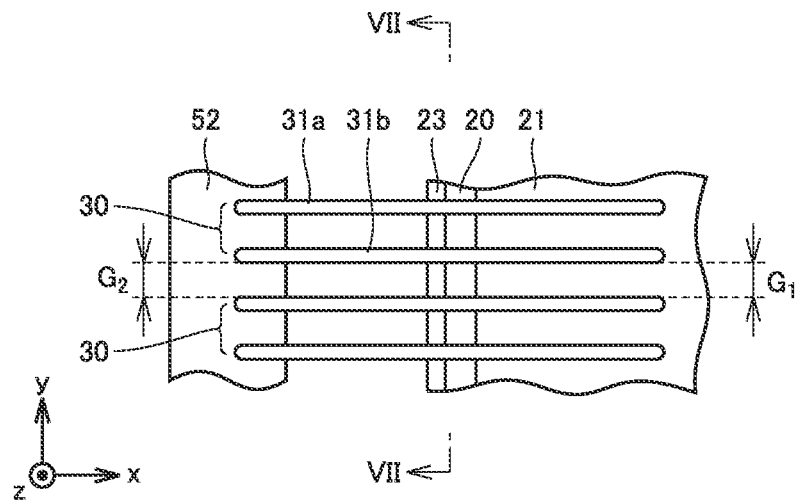
FIG. 6 is a partially enlarged schematic plan view of a power module according to a comparative example.
Figure 7:
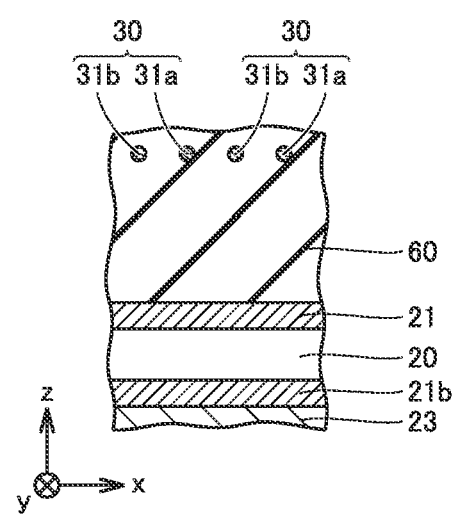
FIG. 7 is a partially enlarged schematic cross-sectional view along the line VII-VII shown in FIG. 6, of the power module according to the comparative example.

In contrast, in a power module according to a comparative example shown in FIGS. 6 and 7, a gap between the pair of first conductive wires 31a and 31b adjacent to each other is smaller than in power module 1 in the present embodiment. Therefore, air bubbles that were introduced in sealing member 60 in providing sealing member 60 may remain in sealing member 60 below the plurality of first conductive wires 31a and 31b. The air bubbles lower insulating performance of sealing member 60 and lower reliability of the power module.

Specifically, in power module 1, as shown in FIGS. 1 and 4, the plurality of first conductive wires 31a and 31b intersect with each other at the first intermediate portion of first conductive wire group 30. In the plan view of first front electrode 21, the plurality of first conductive wires 31a and 31b intersect with each other at one location. In the plan view of first front electrode 21, tops of the plurality of first conductive wires 31a and 31b included in each of the plurality of first conductive wire groups 30 overlap each other. The top of first conductive wire 31a is located below the top of first conductive wire 31b. The top of the conductive wire herein means a highest portion of the conductive wire in a third direction (a z direction) perpendicular to the first direction (the x direction) and the second direction (the y direction).

First conductive wire 31a and first conductive wire 31b intersect with each other at the top of first conductive wire 31a and the top of first conductive wire 31b. In the plan view of first front electrode 21, a gap between the tops of the pair of first conductive wire groups 30 adjacent to each other is larger than gap $G_1$ in the second direction (they direction) between bonded portions 30m of the pair of first conductive wire groups 30 adjacent to each other. In the plan view of first front electrode 21, the gap between the tops of the pair of first conductive wire groups 30 adjacent to each other is larger than gap $G_2$ in the second direction (the y direction) between bonded portions 30n of the pair of first conductive wire groups 30 adjacent to each other.

First conductive wire 31a may be in contact with first conductive wire 31b adjacent thereto. First conductive wire 31a may be spaced away from first conductive wire 31b adjacent thereto. When a gap between first conductive wire 31a and first conductive wire 31b is too large due to one of first conductive wire 31a and first conductive wire 31b being too close to first conductive layer 12, a distance between one of first conductive wire 31a and first conductive wire 31b and first conductive layer 12 becomes short and insulating performance of power module 1 is lowered. When the gap between first conductive wire 31a and first conductive wire 31b is too large due to one of first conductive wire 31a and first conductive wire 31b being too distant from first conductive layer 12, a distance between one of first conductive wire 31a and first conductive wire 31b and an upper surface of sealing member 60 becomes short and insulating performance of power module 1 is lowered. Therefore, first conductive wire 31a may be spaced away from first conductive wire 31b by a distance not longer than the diameter of first conductive wire 31a.

Figure 5:
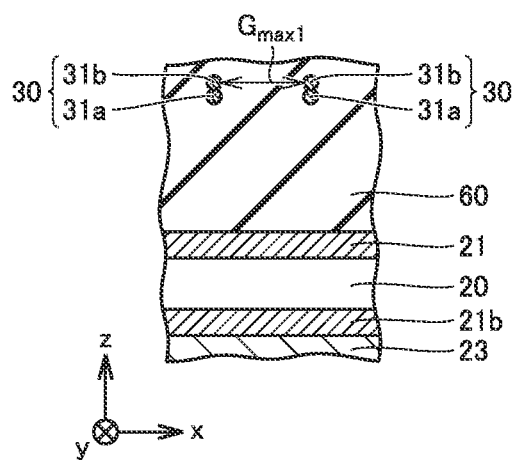
FIG. 5 is a partially enlarged schematic cross-sectional view along the line V-V shown in FIG. 4, of the power module according to the first embodiment.

The plurality of first conductive wires 31a and 31b included in each of the plurality of first conductive wire groups 30 are different in length from each other. As shown in FIG. 5, portions of the pair of first conductive wire groups 30 adjacent to each other where maximum gap $G_{max1}$ is defined are equal to each other in height (for example, heights of the tops of the pair of first conductive wire groups 30 adjacent to each other).

Figure 12:
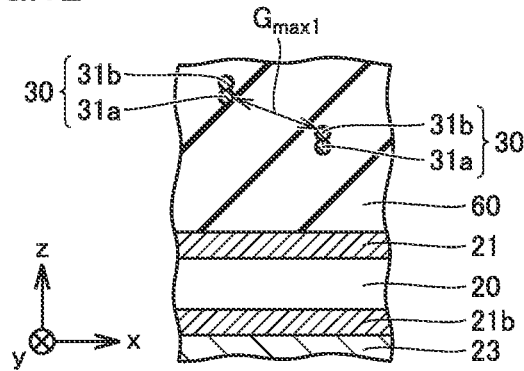
FIG. 12 is a partially enlarged schematic cross-sectional view of the power module according to a first modification of the first embodiment.

As shown in FIG. 12, portions of the pair of first conductive wire groups 30 adjacent to each other where maximum gap $G_{max1}$ is defined may be different from each other in height (for example, heights of the tops of the pair of first conductive wire groups 30 adjacent to each other). Therefore, the gap between the pair of first conductive wire groups 30 adjacent to each other is further larger. Air bubbles that were introduced in sealing member 60 in providing sealing member 60 and remain below the plurality of first conductive wires 31a and 31b more readily pass between the pair of first conductive wire groups 30 adjacent to each other and escape to the outside of sealing member 60.

First front electrode 21 of first semiconductor element 20 and second front electrode 26 of second semiconductor element 25 are electrically connected to each other through first conductive wire groups 30. The plurality of first conductive wire groups 30 each include bonded portion 30m bonded to first front electrode 21 of first semiconductor element 20 and a bonded portion 30p bonded to second front electrode 26 of second semiconductor element 25. The plurality of first conductive wires 31a and 31b in bonded portion 30m are equal to each other in potential. The plurality of first conductive wires 31a and 31b in bonded portion 30p are equal to each other in potential. Bonded portion 30m and bonded portion 30p are equal to each other in potential difference between the plurality of first conductive wires 31a and 31b.

In bonded portion 30m, the plurality of first conductive wires 31a and 31b included in the plurality of first conductive wire groups 30 may be arranged at a regular pitch (for example, 0.8 mm) in the second direction (the y direction). In bonded portion 30p, the plurality of first conductive wires 31a and 31b included in the plurality of first conductive wire groups 30 may be arranged at a regular pitch (for example, 0.8 mm) in the second direction (the y direction).

Figure 8:
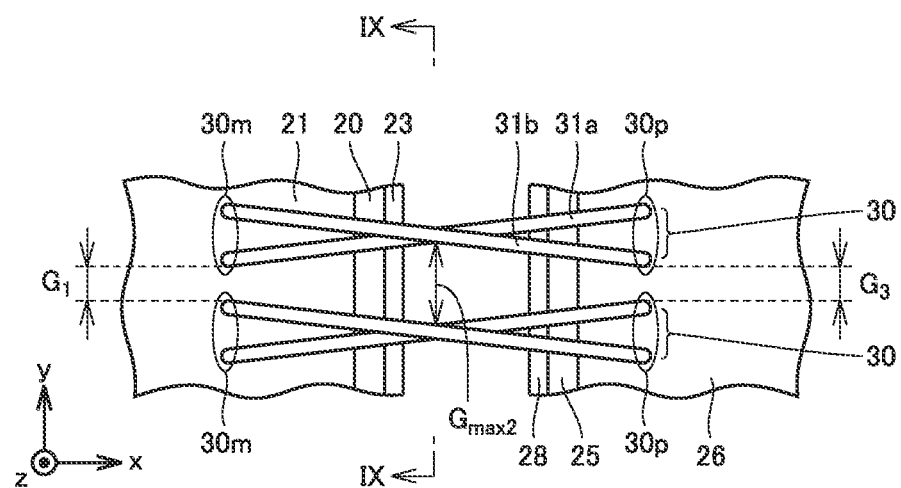
FIG. 8 is a partially enlarged schematic plan view of the power module according to the first embodiment.

As shown in FIG. 8, in the plan view of first front electrode 21, a maximum gap $G_{max2}$ in the second direction (the y direction) between second intermediate portions of the pair of first conductive wire groups 30 adjacent to each other is larger than gap $G_1$ in the second direction (the y direction) between bonded portions 30m of the pair of first conductive wire groups 30 adjacent to each other. The second intermediate portion of first conductive wire group 30 is located between bonded portion 30m of first conductive wire group 30 and bonded portion 30p of first conductive wire group 30. In the plan view of first front electrode 21, each of the plurality of first conductive wire groups 30 is narrower in width in the second intermediate portion of first conductive wire group 30 than in bonded portion 30m of first conductive wire group 30. In the plan view of first front electrode 21, the second intermediate portion of first conductive wire group 30 is located on the inner side in the second direction (the y direction) relative to bonded portion 30m.

Maximum gap $G_{max2}$ is, for example, at least 1.2 time as large as gap $G_1$. Maximum gap $G_{max2}$ is, for example, at least 1.3 time as large as gap $G_1$. Maximum gap $G_{max2}$ is, for example, at least 1.5 time as large as gap $G_1$. Maximum gap $G_{max2}$ is, for example, at least 2.0 times as large as gap $G_1$. Maximum gap $G_{max2}$ is, for example, not shorter than 1.05 mm. Maximum gap $G_{max2}$ is, for example, not shorter than 1.10 mm. Maximum gap $G_{max2}$ is, for example, not shorter than 1.20 mm.

In the plan view of first front electrode 21, maximum gap $G_{max2}$ in the second direction (the y direction) between the second intermediate portions of the pair of first conductive wire groups 30 adjacent to each other is larger than a gap $G_3$ in the second direction (they direction) between bonded portions 30p of the pair of first conductive wire groups 30 adjacent to each other. In the plan view of first front electrode 21, each of the plurality of first conductive wire groups 30 is narrower in width in the second intermediate portion of first conductive wire group 30 than in bonded portion 30p of first conductive wire group 30. In the plan view of first front electrode 21, the second intermediate portion of first conductive wire group 30 is located on the inner side in the second direction (the y direction) relative to bonded portion 30p. Maximum gap $G_{max2}$ is, for example, at least 1.2 time as large as gap $G_3$. Maximum gap $G_{max2}$ is, for example, at least 1.3 time as large as gap $G_3$. Maximum gap $G_{max2}$ is, for example, at least 1.5 time as large as gap $G_3$. Maximum gap $G_{max2}$ is, for example, at least 2.0 times as large as gap $G_3$.

Therefore, air bubbles that were introduced in sealing member 60 in providing sealing member 60 and remain below the plurality of first conductive wires 31a and 31b readily pass between the pair of first conductive wire groups 30 adjacent to each other and escape to the outside of sealing member 60. Lowering in insulating performance of sealing member 60 is prevented. Power module 1 is improved in reliability.

Specifically, as shown in FIGS. 1 and 8, the plurality of first conductive wires 31a and 31b intersect with each other at the second intermediate portion of first conductive wire group 30. In the plan view of first front electrode 21, the plurality of first conductive wires 31a and 31b intersect with each other at one location. In the plan view of first front electrode 21, tops of the plurality of first conductive wires 31a and 31b included in each of the plurality of first conductive wire groups 30 overlap each other. The top of first conductive wire 31a is located below the top of first conductive wire 31b.

First conductive wire 31a and first conductive wire 31b intersect with each other at the top of first conductive wire 31a and the top of first conductive wire 31b. In the plan view of first front electrode 21, a gap between the tops of the pair of first conductive wire groups 30 adjacent to each other is larger than gap $G_1$ in the second direction (they direction) between bonded portions 30m of the pair of first conductive wire groups 30 adjacent to each other. In the plan view of first front electrode 21, the gap between the tops of the pair of first conductive wire groups 30 adjacent to each other is larger than gap $G_3$ in the second direction (the y direction) between bonded portions 30p of the pair of first conductive wire groups 30 adjacent to each other.

Figure 9:
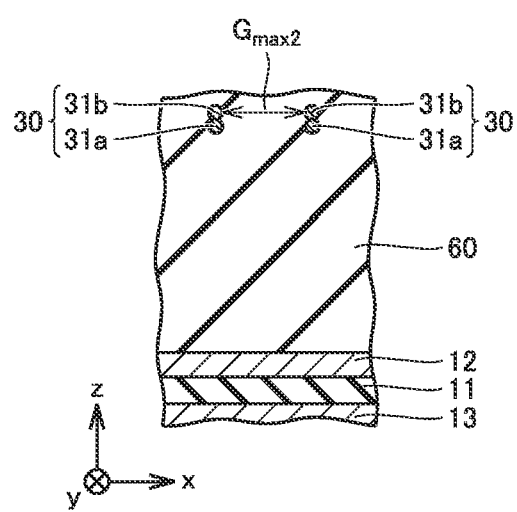
FIG. 9 is a partially enlarged schematic cross-sectional view along the line IX-IX shown in FIG. 8, of the power module according to the first embodiment.

First conductive wire 31a may be in contact with or spaced away from first conductive wire 31b adjacent thereto. The plurality of first conductive wires 31a and 31b included in each of the plurality of first conductive wire groups 30 are different from each other in length. As shown in FIG. 9, portions of the pair of first conductive wire groups 30 adjacent to each other where maximum gap $G_{max2}$ is defined are equal to each other in height (for example, heights of the tops of the pair of first conductive wire groups 30 adjacent to each other).

Figure 13:
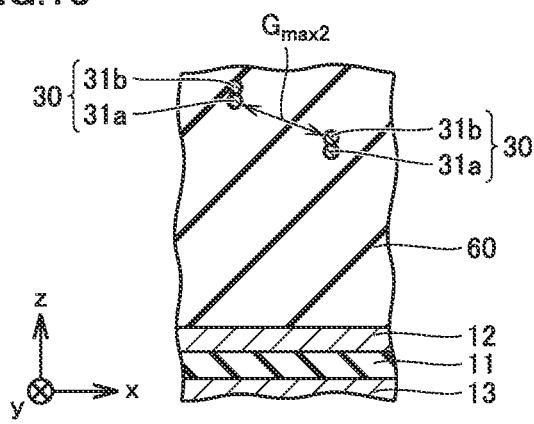
FIG. 13 is a partially enlarged schematic cross-sectional view of the power module according to the first modification of the first embodiment.

As shown in FIG. 13, portions of the pair of first conductive wire groups 30 adjacent to each other where maximum gap $G_{max2}$ is defined may be different from each other in height (for example, heights of the tops of the pair of first conductive wire groups 30 adjacent to each other). Therefore, the gap between the pair of first conductive wire groups 30 adjacent to each other is further larger. Air bubbles that were introduced in sealing member 60 in providing sealing member 60 and remain below the plurality of first conductive wires 31a and 31b more readily pass between the pair of first conductive wire groups 30 adjacent to each other and escape to the outside of sealing member 60.

First conductive layer 12 and second lead terminal 53 are electrically connected to each other through second conductive wire groups 35. The plurality of second conductive wire groups 35 each include a bonded portion 35m bonded to first conductive layer 12 and a bonded portion 35n bonded to second lead terminal 53. The plurality of second conductive wires 36a and 36b in bonded portion 35m are equal to each other in potential. The plurality of second conductive wires 36a and 36b in bonded portion 35n are equal to each other in potential. Bonded portion 35m and bonded portion 35n are equal to each other in potential difference between the plurality of second conductive wires 36a and 36b.

In bonded portion 35m, the plurality of second conductive wires 36a and 36b included in the plurality of second conductive wire groups 35 may be arranged at a regular pitch (for example, 0.8 mm) in the second direction (the y direction). In bonded portion 35n, the plurality of second conductive wires 36a and 36b included in the plurality of second conductive wire groups 35 may be arranged at a regular pitch (for example, 0.8 mm) in the second direction (the y direction).

Figure 10:
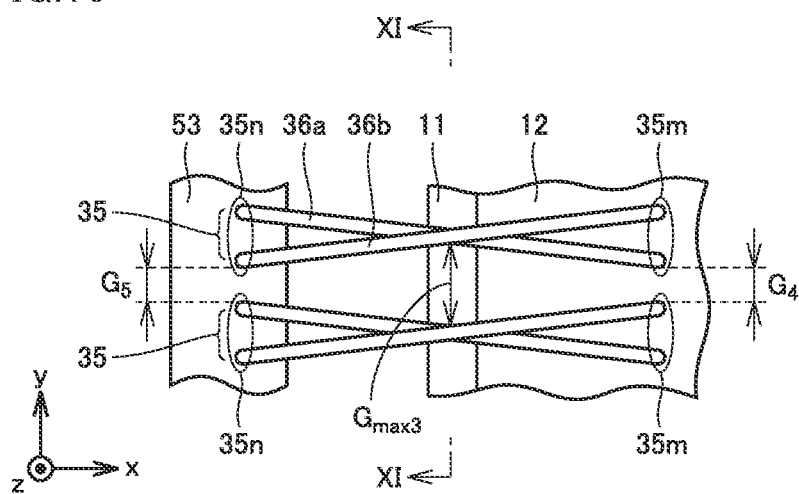
FIG. 10 is a partially enlarged schematic plan view of the power module according to the first embodiment.

As shown in FIG. 10, in the plan view of first conductive layer 12, a maximum gap $G_{max3}$ in the second direction (the y direction) between third intermediate portions of the pair of second conductive wire groups 35 adjacent to each other is larger than a gap $G_4$ in the second direction (the y direction) between bonded portions 35m of the pair of second conductive wire groups 35 adjacent to each other. The third intermediate portion of second conductive wire group 35 is located between bonded portion 35m and bonded portion 35n of second conductive wire group 35. In the plan view of first conductive layer 12, each of the plurality of second conductive wire groups 35 is narrower in width in the third intermediate portion of second conductive wire group 35 than in bonded portion 35m of second conductive wire group 35. In the plan view of first conductive layer 12, the third intermediate portion of second conductive wire group 35 is located on the inner side in the second direction (the y direction) relative to bonded portion 35m.

Maximum gap $G_{max3}$ is, for example, at least 1.2 time as large as gap $G_4$. Maximum gap $G_{max3}$ is, for example, at least 1.3 time as large as gap $G_4$. Maximum gap $G_{max3}$ is, for example, at least 1.5 time as large as gap $G_4$. Maximum gap $G_{max3}$ is, for example, at least 2.0 times as large as gap $G_4$. Maximum gap $G_{max3}$ is, for example, not shorter than 1.05 mm. Maximum gap $G_{max3}$ is, for example, not shorter than 1.10 mm. Maximum gap $G_{max3}$ is, for example, not shorter than 1.20 mm.

In the plan view of first conductive layer 12, maximum gap $G_{max3}$ in the second direction (the y direction) between the third intermediate portions of the pair of second conductive wire groups 35 adjacent to each other is larger than a gap $G_5$ in the second direction (the y direction) between bonded portions 35n of the pair of second conductive wire groups 35 adjacent to each other. In the plan view of first conductive layer 12, each of the plurality of second conductive wire groups 35 is narrower in width in the third intermediate portion of second conductive wire group 35 than in bonded portion 35n of second conductive wire group 35. In the plan view of first conductive layer 12, the third intermediate portion of second conductive wire group 35 is located on the inner side in the second direction (the y direction) relative to bonded portion 35n. Maximum gap $G_{max3}$ is, for example, at least 1.2 time as large as gap $G_5$. Maximum gap $G_{max3}$ is, for example, at least 1.3 time as large as gap $G_5$. Maximum gap $G_{max3}$ is, for example, at least 1.5 time as large as gap $G_5$. Maximum gap $G_{max3}$ is, for example, at least 2.0 times as large as gap $G_5$.

Therefore, air bubbles that were introduced in sealing member 60 in providing sealing member 60 and remain below the plurality of second conductive wires 36a and 36b readily pass between the pair of second conductive wire groups 35 adjacent to each other and escape to the outside of sealing member 60. Lowering in insulating performance of sealing member 60 is prevented. Power module 1 is improved in reliability.

Specifically, as shown in FIGS. 1 and 10, the plurality of second conductive wires 36a and 36b intersect with each other at the third intermediate portion of second conductive wire group 35. In the plan view of first conductive layer 12, the plurality of second conductive wires 36a and 36b intersect with each other at one location. In the plan view of first conductive layer 12, tops of the plurality of second conductive wires 36a and 36b included in each of the plurality of second conductive wire groups 35 overlap each other. The top of second conductive wire 36a is located below the top of second conductive wire 36b.

Second conductive wire 36a and second conductive wire 36b intersect with each other at the top of second conductive wire 36a and the top of second conductive wire 36b. In the plan view of first conductive layer 12, a gap between the tops of the pair of second conductive wire groups 35 adjacent to each other is larger than gap $G_4$ in the second direction (the y direction) between bonded portions 35m of the pair of second conductive wire groups 35 adjacent to each other. In the plan view of first conductive layer 12, the gap between the tops of the pair of second conductive wire groups 35 adjacent to each other is larger than gap $G_5$ in the second direction (the y direction) between bonded portions 35n of the pair of second conductive wire groups 35 adjacent to each other.

Second conductive wire 36a may be in contact with second conductive wire 36b adjacent thereto. Second conductive wire 36a may be spaced away from second conductive wire 36b adjacent thereto. When a gap between second conductive wire 36a and second conductive wire 36b is too large due to one of second conductive wire 36a and second conductive wire 36b being too close to first conductive layer 12, a distance between one of second conductive wire 36a and second conductive wire 36b and first conductive layer 12 becomes short and insulating performance of power module 1 is lowered. When the gap between second conductive wire 36a and second conductive wire 36b is too large due to one of second conductive wire 36a and second conductive wire 36b being too distant from first conductive layer 12, a distance between one of second conductive wire 36a and second conductive wire 36b and the upper surface of sealing member 60 becomes short and insulating performance of power module 1 is lowered. Therefore, second conductive wire 36a may be spaced away from second conductive wire 36b by a distance not longer than a diameter of second conductive wire 36a.

Figure 11:
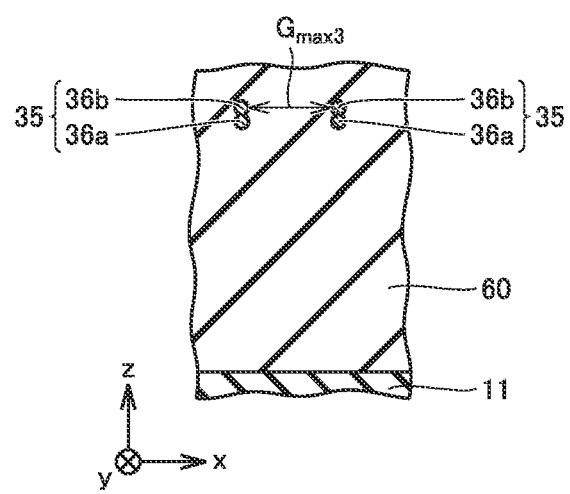
FIG. 11 is a partially enlarged schematic cross-sectional view along the line XI-XI shown in FIG. 10, of the power module according to the first embodiment.

The plurality of second conductive wires 36a and 36b included in each of the plurality of second conductive wire groups 35 are different from each other in length. As shown in FIG. 11, portions of the pair of second conductive wire groups 35 adjacent to each other where maximum gap $G_{max3}$ is defined are equal to each other in height (for example, heights of the tops of the pair of second conductive wire groups 35 adjacent to each other).

Figure 14:
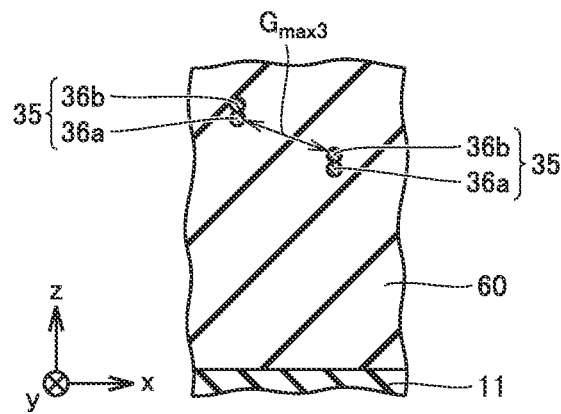
FIG. 14 is a partially enlarged schematic cross-sectional view of the power module according to the first modification of the first embodiment.

As shown in FIG. 14, portions of the pair of second conductive wire groups 35 adjacent to each other where maximum gap $G_{max3}$ is defined may be different from each other in height (for example, heights of the tops of the pair of second conductive wire groups 35 adjacent to each other). Therefore, the gap between the pair of second conductive wire groups 35 adjacent to each other is further larger. Air bubbles that were introduced in sealing member 60 in providing sealing member 60 and remain below the plurality of second conductive wires 36a and 36b more readily pass between the pair of second conductive wire groups 35 adjacent to each other and escape to the outside of sealing member 60.

Power module 1 further includes sealing member 60. Sealing member 60 seals first semiconductor element 20, second semiconductor element 25, the plurality of first conductive wire groups 30, the plurality of second conductive wire groups 35, and the plurality of third conductive wires 44. Sealing member 60 further seals a part of first lead terminal 52, a part of second lead terminal 53, and a part of third lead terminal 54.

Sealing member 60 is formed of an insulating resin. Sealing member 60 is formed, for example, of an insulating resin that can directly be potted such as an epoxy resin or a silicone resin or an insulating resin such as silicone gel. In one example, sealing member 60 is provided by direct potting. In another example, sealing member 60 is provided by injecting a sealing material into a mold where circuit substrate 10 has been set.

Sealing member 60 may contain fine particles or fillers. Fine particles or fillers may be dispersed in the insulating resin. Fine particles or fillers are formed of an inorganic ceramic material such as silicon dioxide ($SiO_2$), alumina ($Al_2O_3$), aluminum nitride (AlN), boron nitride (BN), silicon nitride ($Si_3N_4$), diamond (C), silicon carbide (SiC), or boron oxide ($B_2O_3$). Fine particles or fillers have a maximum diameter not smaller than 30 μm and not larger than 200 μm. By adding fine particles or fillers to the insulating resin, a thermal expansion coefficient of sealing member 60 can be adjusted. Fine particles or fillers may be higher in thermal conductivity than an insulating resin material which is a main component of sealing member 60 and may improve thermal conduction of sealing member 60.

A method of manufacturing power module 1 in the first embodiment will be described with reference to FIGS. 1 to 3 and 15 to 18.

Figure 15:
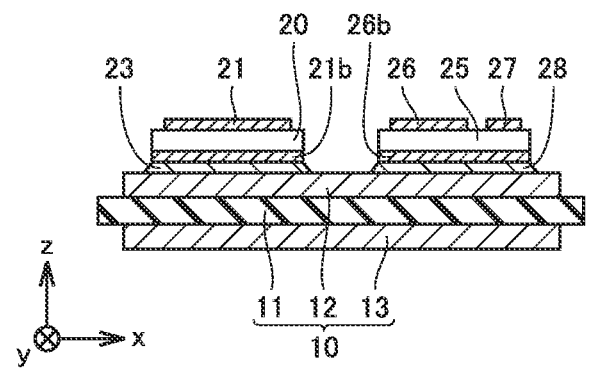
FIG. 15 is a schematic cross-sectional view showing one step in a method of manufacturing a power module according to the first embodiment and a second embodiment.

As shown in FIG. 15, the method of manufacturing power module 1 in the present embodiment includes mounting first semiconductor element 20 and second semiconductor element 25 on circuit substrate 10. Specifically, circuit substrate 10 is prepared. For example, circuit substrate 10 is prepared by bonding first conductive layer 12 to the first main surface of insulating substrate 11 and bonding second conductive layer 13 to the second main surface of insulating substrate 11. Then, first semiconductor element 20 and second semiconductor element 25 are mounted on circuit substrate 10 by means of first conductive joint member 23 and second conductive joint member 28. For example, when first conductive joint member 23 and second conductive joint member 28 are solder, first semiconductor element 20 and second semiconductor element 25 are soldered to first conductive layer 12 of circuit substrate 10 by reflow soldering.

Figure 16:
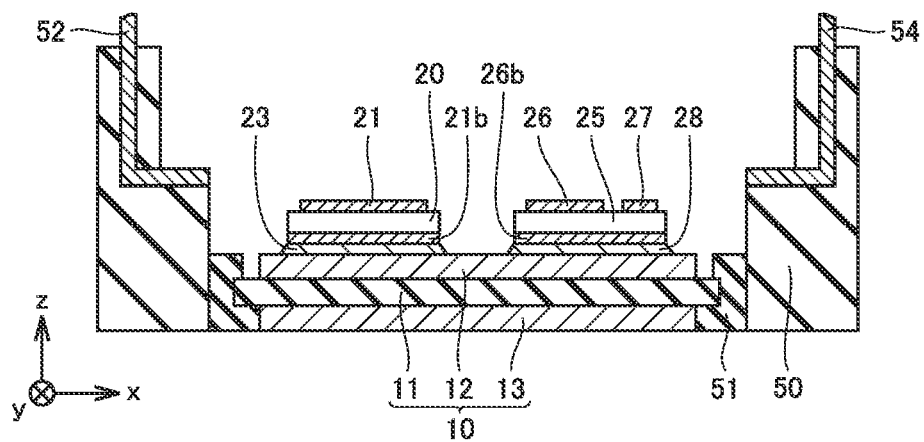
FIG. 16 is a schematic cross-sectional view showing a step next to the step shown in FIG. 15, in the method of manufacturing a power module according to the first embodiment and the second embodiment.

As shown in FIG. 16, the method of manufacturing power module 1 in the present embodiment includes attaching circuit substrate 10 to case 50. For example, circuit substrate 10 is joined to case 50 with joint member 51 such as a silicone resin adhesive.

Figure 17:
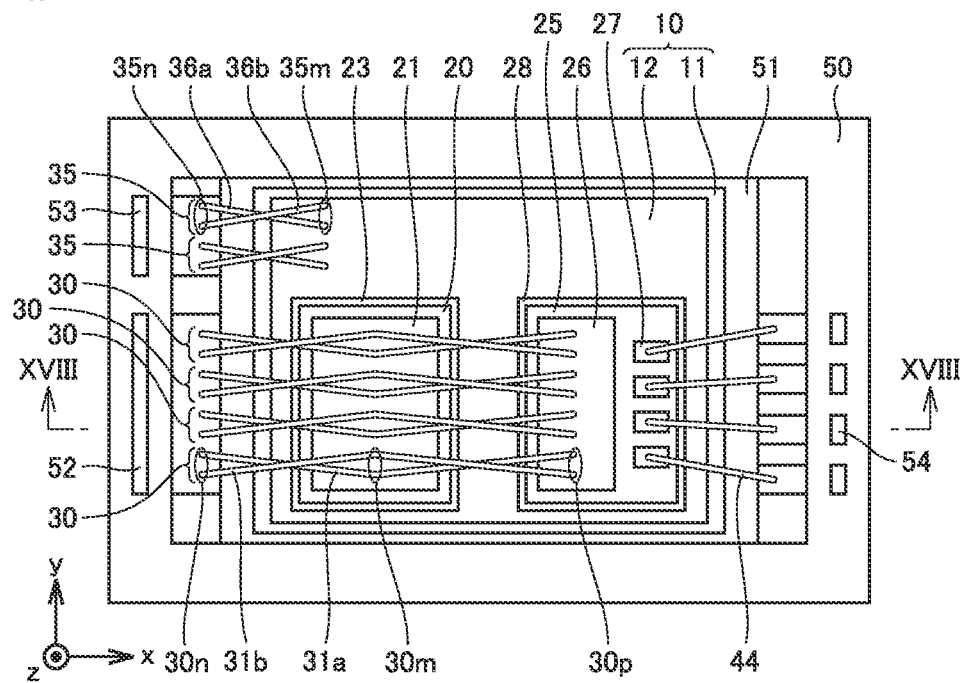
FIG. 17 is a schematic plan view showing a step next to the step shown in FIG. 16, in the method of manufacturing a power module according to the first embodiment.
Figure 18:
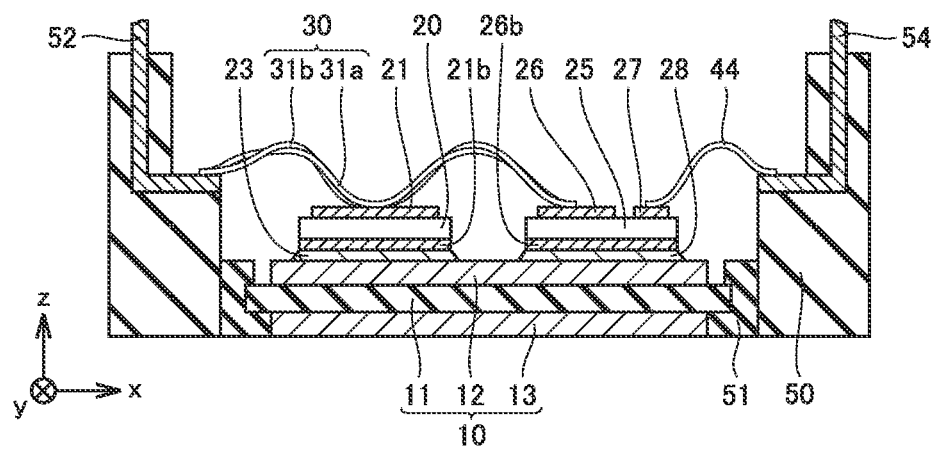
FIG. 18 is a schematic cross-sectional view along the line XVIII-XVIII shown in FIG. 17, of the method of manufacturing a power module according to the first embodiment.

As shown in FIGS. 17 and 18, the method of manufacturing power module 1 in the present embodiment includes electrically connecting first front electrode 21 of first semiconductor element 20 and first lead terminal 52 to each other through the plurality of first conductive wire groups 30. The plurality of first conductive wire groups 30 are arranged in parallel in the second direction (the y direction). The plurality of first conductive wire groups 30 each include the plurality of first conductive wires 31a and 31b. The plurality of first conductive wire groups 30 each include bonded portion 30m bonded to first front electrode 21 of first semiconductor element 20 and bonded portion 30n bonded to first lead terminal 52. Specifically, the plurality of first conductive wires 31a and 31b are bonded to first front electrode 21 and first lead terminal 52 with a wire bonder (not shown).

As shown in FIG. 4, in the plan view of first front electrode 21, maximum gap $G_{max1}$ in the second direction (the y direction) between the first intermediate portions of the pair of first conductive wire groups 30 adjacent to each other is larger than gap $G_1$ in the second direction (the y direction) between bonded portions 30m of the pair of first conductive wire groups 30 adjacent to each other. The first intermediate portion of first conductive wire group 30 is located between bonded portion 30m and bonded portion 30n of first conductive wire group 30. In the plan view of first front electrode 21, each of the plurality of first conductive wire groups 30 is narrower in width in the first intermediate portion of first conductive wire group 30 than in bonded portion 30m of first conductive wire group 30. In the plan view of first front electrode 21, the first intermediate portion of first conductive wire group 30 is located on the inner side in the second direction (the y direction) relative to bonded portion 30m.

In the plan view of first front electrode 21, maximum gap $G_{max1}$ in the second direction (the y direction) between the first intermediate portions of the pair of first conductive wire groups 30 adjacent to each other is larger than gap $G_2$ in the second direction (they direction) between bonded portions 30n of the pair of first conductive wire groups 30 adjacent to each other. In the plan view of first front electrode 21, each of the plurality of first conductive wire groups 30 is narrower in width in the first intermediate portion of first conductive wire group 30 than in bonded portion 30n of first conductive wire group 30. In the plan view of first front electrode 21, the first intermediate portion of first conductive wire group 30 is located on the inner side in the second direction (the y direction) relative to bonded portion 30n.

Specifically, in the method of manufacturing power module 1 in the present embodiment, electrically connecting first front electrode 21 of first semiconductor element 20 and second front electrode 26 of second semiconductor element 25 to each other through the plurality of first conductive wire groups 30 includes causing the plurality of first conductive wires 31a and 31b to intersect with each other at the second intermediate portion of first conductive wire group 30.

As shown in FIGS. 17 and 18, the method of manufacturing power module 1 in the present embodiment includes electrically connecting first front electrode 21 of first semiconductor element 20 and second front electrode 26 of second semiconductor element 25 to each other through the plurality of first conductive wire groups 30. The plurality of first conductive wire groups 30 are arranged in parallel in the second direction (the y direction). The plurality of first conductive wire groups 30 each include the plurality of first conductive wires 31a and 31b. The plurality of first conductive wire groups 30 each include bonded portion 30m bonded to first front electrode 21 of first semiconductor element 20 and bonded portion 30p bonded to second front electrode 26 of second semiconductor element 25. Specifically, the plurality of first conductive wires 31a and 31b are bonded to first front electrode 21 and second front electrode 26 with a wire bonder (not shown).

As shown in FIG. 8, in the plan view of first front electrode 21, maximum gap $G_{max2}$ in the second direction (the y direction) between the second intermediate portions of the pair of first conductive wire groups 30 adjacent to each other is larger than gap $G_1$ in the second direction (the y direction) between bonded portions 30m of the pair of first conductive wire groups 30 adjacent to each other. The second intermediate portion is located between bonded portion 30m and bonded portion 30p. In the plan view of first front electrode 21, each of the plurality of first conductive wire groups 30 is narrower in width in the second intermediate portion of first conductive wire group 30 than in bonded portion 30m of first conductive wire group 30. In the plan view of first front electrode 21, the second intermediate portion of first conductive wire group 30 is located on the inner side in the second direction (the y direction) relative to bonded portion 30m.

In the plan view of first front electrode 21, maximum gap $G_{max2}$ in the second direction (the y direction) between the second intermediate portions of the pair of first conductive wire groups 30 adjacent to each other is larger than gap $G_3$ in the second direction (they direction) between bonded portions 30p of the pair of first conductive wire groups 30 adjacent to each other. In the plan view of first front electrode 21, each of the plurality of first conductive wire groups 30 is narrower in width in the second intermediate portion of first conductive wire group 30 than in bonded portion 30p of first conductive wire group 30. In the plan view of first front electrode 21, the second intermediate portion of first conductive wire group 30 is located on the inner side in the second direction (the y direction) relative to bonded portion 30p.

Specifically, in the method of manufacturing power module 1 in the present embodiment, electrically connecting first front electrode 21 of first semiconductor element 20 and second front electrode 26 of second semiconductor element 25 to each other through the plurality of first conductive wire groups 30 includes causing the plurality of first conductive wires 31a and 31b to intersect with each other at the second intermediate portion of first conductive wire group 30.

As shown in FIGS. 17 and 18, the method of manufacturing power module 1 in the present embodiment includes electrically connecting first conductive layer 12 and second lead terminal 53 to each other through the plurality of second conductive wire groups 35. The plurality of second conductive wire groups 35 are arranged in parallel in the second direction (the y direction). The plurality of second conductive wire groups 35 each include the plurality of second conductive wires 36a and 36b. The plurality of second conductive wire groups 35 each include bonded portion 35m bonded to first conductive layer 12 and bonded portion 35n bonded to second lead terminal 53. Specifically, the plurality of second conductive wires 36a and 36b are bonded to first conductive layer 12 and second lead terminal 53 with a wire bonder (not shown).

As shown in FIG. 10, in the plan view of first conductive layer 12, maximum gap $G_{max3}$ in the second direction (the y direction) between the third intermediate portions of the pair of second conductive wire groups 35 adjacent to each other is larger than gap $G_4$ in the second direction (the y direction) between bonded portions 35m of the pair of second conductive wire groups 35 adjacent to each other. The third intermediate portion of second conductive wire group 35 is located between bonded portion 35m and bonded portion 35n of second conductive wire group 35. In the plan view of first conductive layer 12, each of the plurality of second conductive wire groups 35 is narrower in width in the third intermediate portion of second conductive wire group 35 than in bonded portion 35m of second conductive wire group 35. In the plan view of second conductive layer 12, the third intermediate portion of second conductive wire group 35 is located on the inner side in the second direction (the y direction) relative to bonded portion 35m.

In the plan view of first conductive layer 12, maximum gap $G_{max3}$ in the second direction (the y direction) between the third intermediate portions of the pair of second conductive wire groups 35 adjacent to each other is larger than gap $G_5$ in the second direction (the y direction) between bonded portions 35n of the pair of second conductive wire groups 35 adjacent to each other. In the plan view of first conductive layer 12, each of the plurality of second conductive wire groups 35 is narrower in width in the third intermediate portion of second conductive wire group 35 than in bonded portion 35n of second conductive wire group 35. In the plan view of first conductive layer 12, the third intermediate portion of second conductive wire group 35 is located on the inner side in the second direction (the y direction) relative to bonded portion 35n.

Specifically, in the method of manufacturing power module 1 in the present embodiment, electrically connecting first conductive layer 12 and second lead terminal 53 to each other through the plurality of second conductive wire groups 35 includes causing the plurality of second conductive wires 36a and 36b to intersect with each other at the third intermediate portion of second conductive wire group 35.

As shown in FIGS. 17 and 18, the method of manufacturing power module 1 in the present embodiment includes electrically connecting third front electrode 27 of second semiconductor element 25 and third lead terminal 54 to each other through the plurality of third conductive wires 44. Specifically, the plurality of third conductive wires 44 are bonded to third front electrode 27 of second semiconductor element 25 and third lead terminal 54 with a wire bonder (not shown). A step of bonding the plurality of first conductive wire groups 30, the plurality of second conductive wire groups 35, and the plurality of third conductive wires 44 may be performed before a step of attaching circuit substrate 10 to case 50.

The method of manufacturing power module 1 in the present embodiment includes sealing first semiconductor element 20, second semiconductor element 25, a part of first lead terminal 52, a part of second lead terminal 53, a part of third lead terminal 54, the plurality of first conductive wire groups 30, the plurality of second conductive wire groups 35, and the plurality of third conductive wires 44 with sealing member 60. Power module 1 shown in FIGS. 1 to 3 is thus obtained.

In a first example of the step of sealing with sealing member 60, for example, a sealing material is held in a pressure-reduced atmosphere at 500 Pa and defoamed. An insulating resin that can directly be potted such as an epoxy resin or a silicone resin is adopted as the sealing material. The sealing material is supplied into case 50 by direct potting. The insulating resin that can directly be potted has a viscosity, for example, not lower than 5 Pa·S. The insulating resin that can directly be potted has a viscosity, for example, not lower than 7 Pa·S. The insulating resin that can directly be potted has a viscosity, for example, not lower than 10 Pa·S. The insulating resin that can directly be potted has a viscosity, for example, not higher than 30 Pa·S. As the viscosity of the sealing material is higher, air bubbles are more likely to be introduced in the sealing material in providing sealing member 60 and air bubbles are less likely to escape from the sealing material. The viscosity of the insulating resin herein is measured at a temperature not lower than 40° C. and not higher than 90° C.

Then, the sealing material is heated at a temperature, for example, not lower than 40° C. and not higher than 90° C. The heated sealing material is supplied into case 50 and provided in case 50. The sealing material is defoamed. For example, the sealing material may be defoamed by holding the sealing material in a pressure-reduced atmosphere. Specifically, case 50 containing the sealing material is held in the reduced-pressure atmosphere, for example, not lower than 700 Pa and not higher than 1500 Pa. The sealing material may be defoamed, for example, by being vibrated. Specifically, case 50 containing the sealing material is vibrated. The sealing material is vibrated at a frequency, for example, not lower than 10 Hz and not higher than 1 kHz. Then, the sealing material is cured. Sealing member 60 is thus provided.

In a second example of the step of sealing with sealing member 60, sealing member 60 is provided by transfer molding without using case 50. Specifically, the sealing material is held in a pressure-reduced atmosphere, for example, at 500 Pa and defoamed. Circuit substrate 10 on which first semiconductor element 20 and second semiconductor element 25 are mounted, a part of first lead terminal 52, a part of second lead terminal 53, a part of third lead terminal 54, the plurality of first conductive wire groups 30, the plurality of second conductive wire groups 35, and the plurality of third conductive wires 44 are set in a mold. The sealing material is injected into the mold. An insulating resin lower in viscosity than the insulating resin that can directly be potted is adopted as the sealing material. The sealing material has a viscosity, for example, not lower than 0.2 Pa·S. The sealing material has a viscosity, for example, not higher than 2.0 Pa·S. The sealing material is, for example, silicone gel. As in the first example, the sealing material is cured by being defoamed. Sealing member 60 is thus provided.

As shown in FIG. 4, in the plan view of first front electrode 21, maximum gap $G_{max1}$ in the second direction (the y direction) between the first intermediate portions of the pair of first conductive wire groups 30 adjacent to each other is larger than gap $G_1$ in the second direction (the y direction) between bonded portions 30*m* of the pair of first conductive wire groups 30 adjacent to each other and larger than gap $G_2$ in the second direction (the y direction) between bonded portions 30*n* of the pair of first conductive wire groups 30 adjacent to each other. The first intermediate portion of first conductive wire group 30 is located between bonded portion 30*m* and bonded portion 30*n* of first conductive wire group 30. Therefore, air bubbles that were introduced in sealing member 60 in providing sealing member 60 and remain below the plurality of first conductive wires 31*a* and 31*b* readily pass between the pair of first conductive wire groups 30 adjacent to each other and escape to the outside of sealing member 60. Lowering in insulating performance of sealing member 60 is prevented. Power module 1 improved in reliability is obtained.

As shown in FIG. 8, in the plan view of first front electrode 21, maximum gap $G_{max2}$ in the second direction (the y direction) between the second intermediate portions of the pair of first conductive wire groups 30 adjacent to each other is larger than gap $G_1$ in the second direction (the y direction) between bonded portions 30*m* of the pair of first conductive wire groups 30 adjacent to each other and larger than gap $G_3$ in the second direction (the y direction) between bonded portions 30*p* of the pair of first conductive wire groups 30 adjacent to each other. The second intermediate portion of first conductive wire group 30 is located between bonded portion 30*m* and bonded portion 30*p* of first conductive wire group 30. Therefore, air bubbles that were introduced in sealing member 60 in providing sealing member 60 and remain below the plurality of first conductive wires 31*a* and 31*b* readily pass between the pair of first conductive wire groups 30 adjacent to each other and escape to the outside of sealing member 60. Lowering in insulating performance of sealing member 60 is prevented. Power module 1 improved in reliability is obtained.

As shown in FIG. 10, in the plan view of first conductive layer 12, maximum gap $G_{max3}$ in the second direction (the y direction) between the third intermediate portions of the pair of second conductive wire groups 35 adjacent to each other is larger than gap $G_4$ in the second direction (the y direction) between bonded portions 35*m* of the pair of second conductive wire groups 35 adjacent to each other and larger than gap $G_5$ in the second direction (the y direction) between bonded portions 35*n* of the pair of second conductive wire groups 35 adjacent to each other. The third intermediate portion of second conductive wire group 35 is located between bonded portion 35*m* and bonded portion 35*n* of second conductive wire group 35. Therefore, air bubbles that were introduced in sealing member 60 in providing sealing member 60 and remain below the plurality of second conductive wires 36*a* and 36*b* readily pass between the pair of second conductive wire groups 35 adjacent to each other and escape to the outside of sealing member 60. Lowering in insulating performance of sealing member 60 is prevented. Power module 1 improved in reliability is obtained.

Figure 19:
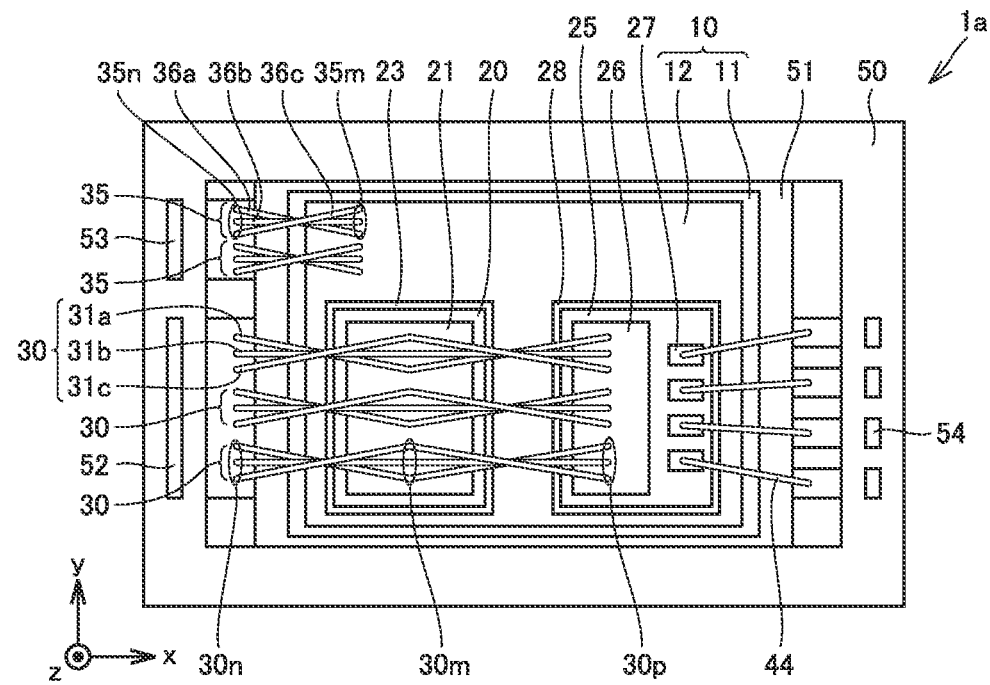
FIG. 19 is a schematic plan view of a power module according to a second modification of the first embodiment.

As in a power module 1*a* shown in FIG. 19, the plurality of first conductive wire groups 30 may each include three or more first conductive wires 31*a*, 31*b*, and 31*c*. The plurality of second conductive wire groups 35 may each include three or more second conductive wires 36*a*, 36*b*, and 36*c*.

Figure 20:
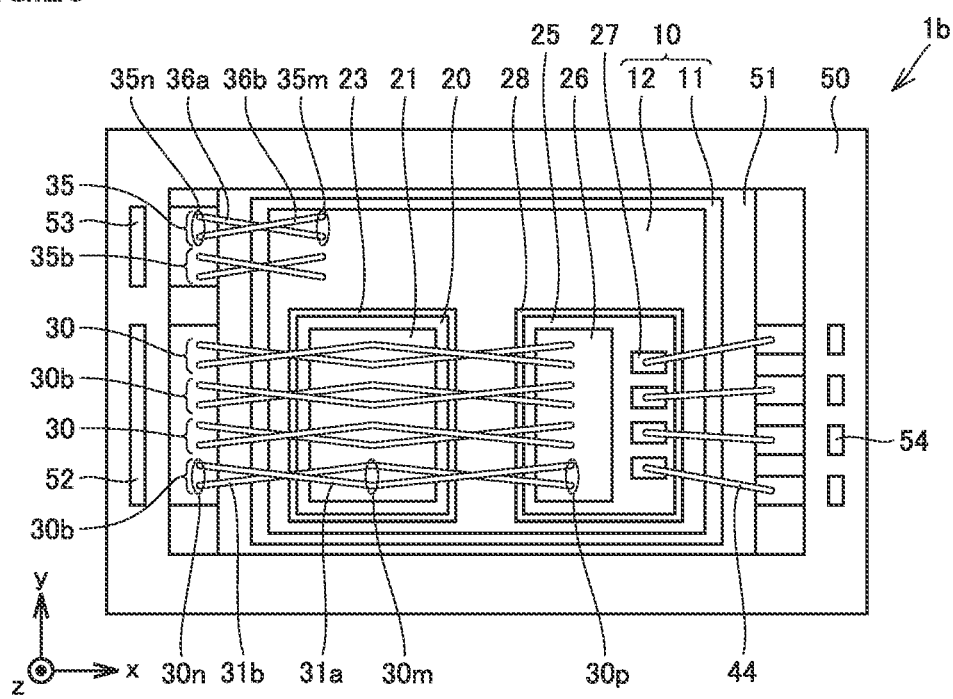
FIG. 20 is a schematic plan view of a power module according to a third modification of the first embodiment.

As in a power module 1*b* shown in FIG. 20, a pair of first conductive wire groups 30 and 30*b* adjacent to each other may include first conductive wire group 30 and a first conductive wire group 30*b*. In first conductive wire group 30, first conductive wire 31*a* is located below first conductive wire 31*b*. In first conductive wire group 30*b*, first conductive wire 31*b* is located below first conductive wire 31*a*.

A pair of second conductive wire groups 35 and 35*b* adjacent to each other may include second conductive wire group 35 and a second conductive wire group 35*b*. In second conductive wire group 35, second conductive wire 36a is located below second conductive wire 36b. In second conductive wire group 35b, second conductive wire 36b is located below second conductive wire 36a.

Figure 21:
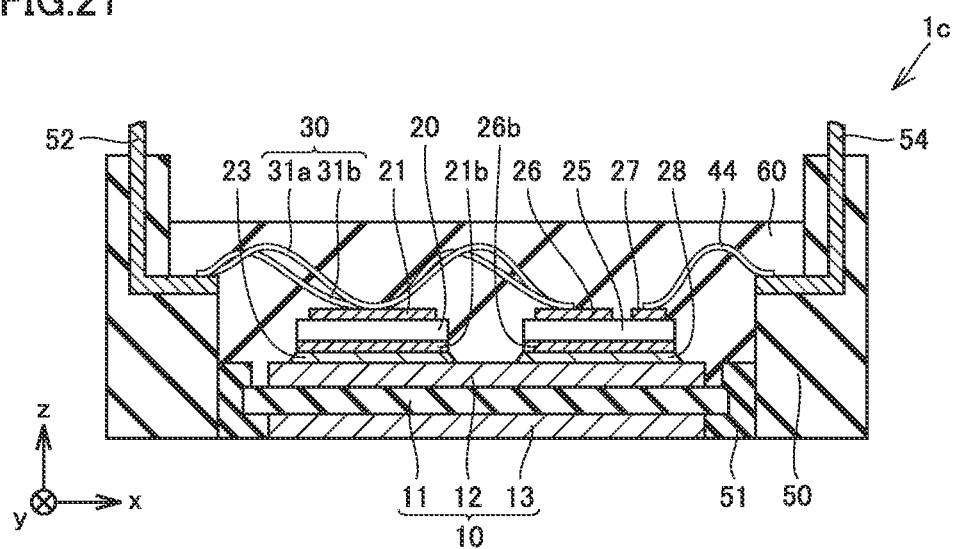
FIG. 21 is a schematic cross-sectional view of a power module according to a fourth modification of the first embodiment.

As in a power module 1c shown in FIG. 21, in the plan view of first front electrode 21, positions of the tops of the plurality of first conductive wires 31a and 31b may be different from each other and the plurality of first conductive wires 31a and 31b may be equal to each other in length. In the plan view of first conductive layer 12, positions of the tops of the plurality of second conductive wires 36a and 36b may be different from each other and the plurality of second conductive wires 36a and 36b may be equal to each other in length.

Figure 22:
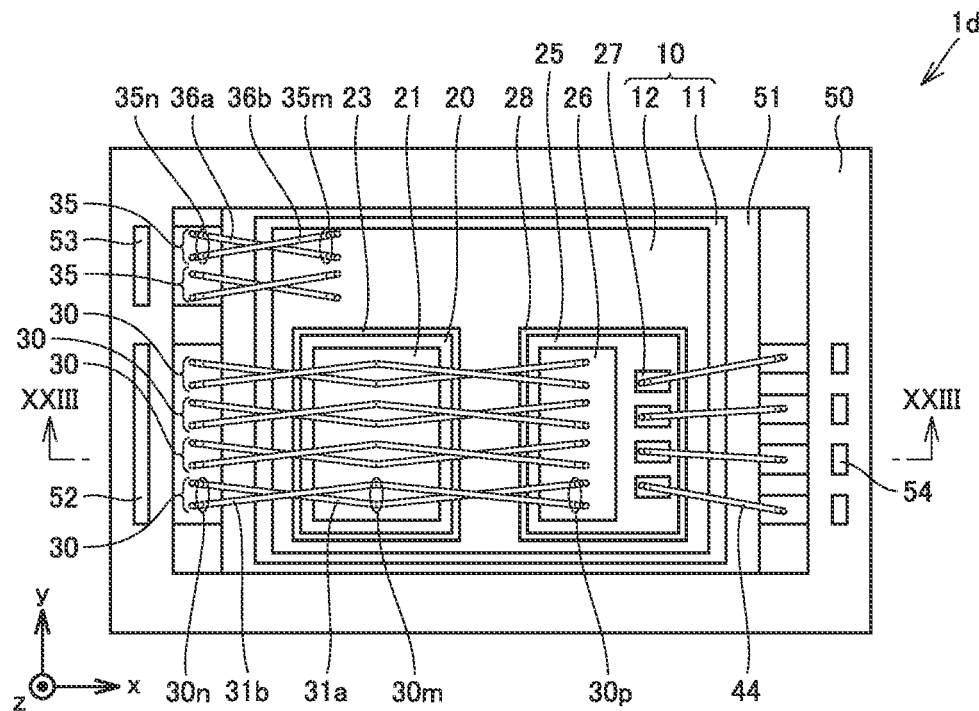
FIG. 22 is a schematic plan view of a power module according to a fifth modification of the first embodiment.
Figure 23:
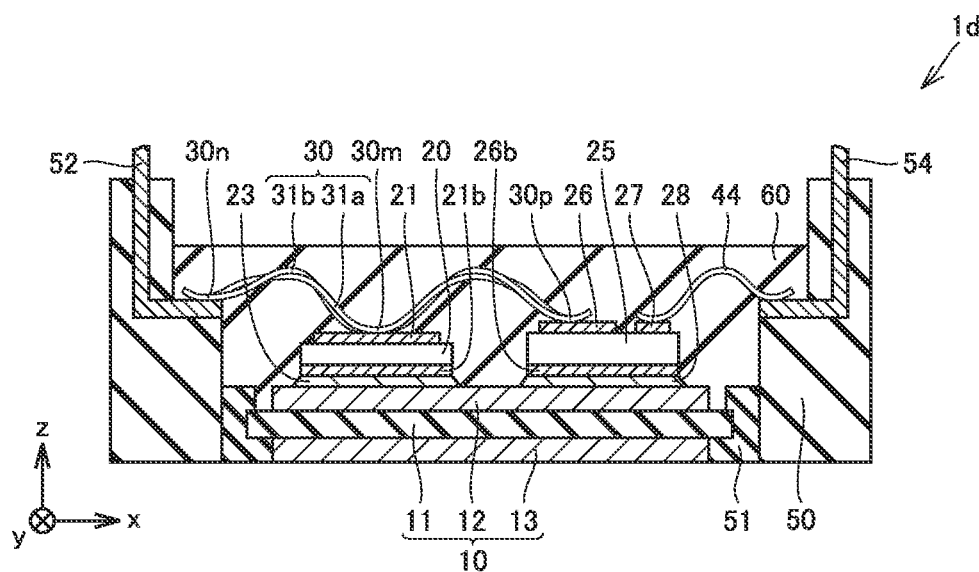
FIG. 23 is a schematic cross-sectional view of the power module according to the fifth modification of the first embodiment.
Figure 24:
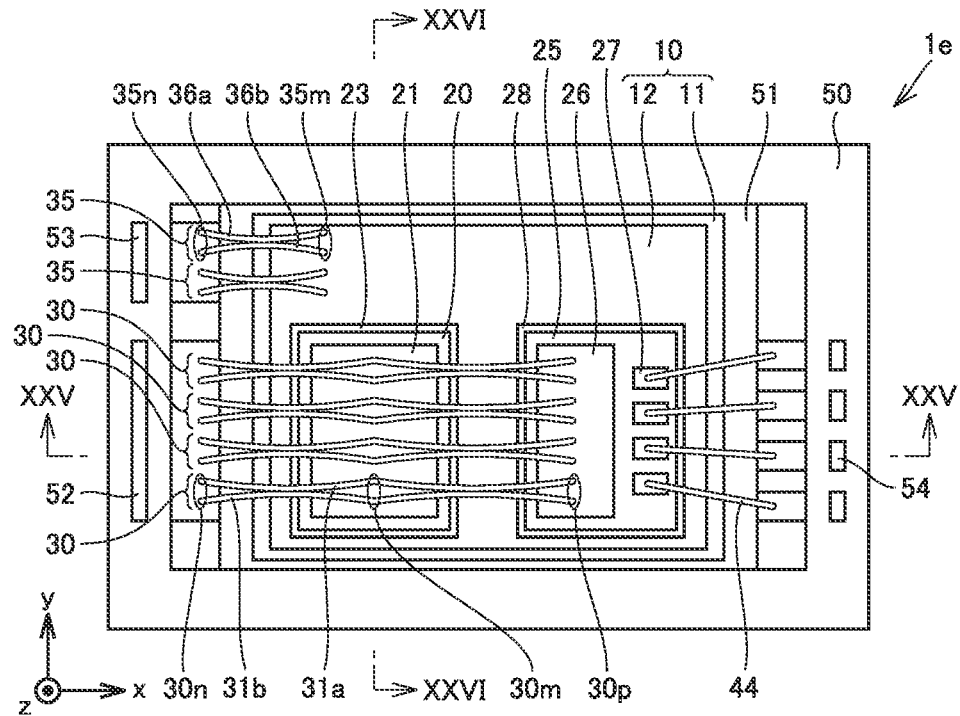
FIG. 24 is a schematic plan view of a power module according to the second embodiment.
Figure 25:
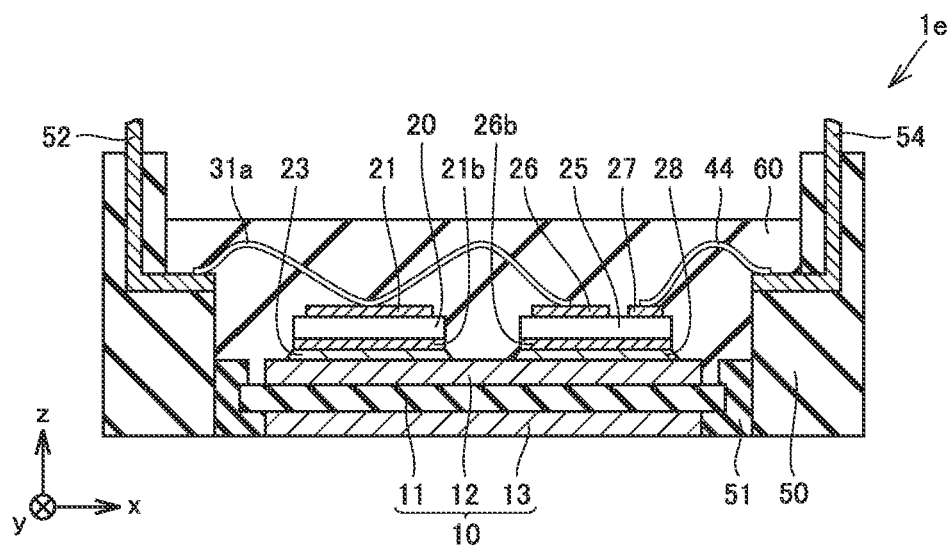
FIG. 25 is a schematic cross-sectional view along the line XXV-XXV shown in FIG. 24, of the power module according to the second embodiment.

As in a power module 1d shown in FIGS. 22 and 23, bonded portions 30n and 30p may be spaced away from opposing ends of first conductive wire group 30. Bonded portions 30n and 30p may be spaced away from opposing ends of first conductive wires 31a and 31b. Bonded portions 35m and 35n may be spaced away from opposing ends of second conductive wire group 35. Bonded portions 35m and 35n may be spaced away from opposing ends of second conductive wires 36a and 36b.

As in power module 1d shown in FIGS. 22 and 23, two semiconductor elements (first semiconductor element 20 and second semiconductor element 25) may be different from each other in thickness and first front electrode 21 may be located at a height different from second front electrode 26. In one example, as shown in FIG. 23, a first thickness of first semiconductor element 20 is smaller than a second thickness of second semiconductor element 25. First front electrode 21 is lower than second front electrode 26. In the plan view of first front electrode 21, tops of the plurality of first conductive wires 31a and 31b included in each of the plurality of first conductive wire groups 30 overlap each other. First conductive wire 31a and first conductive wire 31b intersect with each other at the top of first conductive wire 31a and the top of first conductive wire 31b.

For example, when first conductive wire 31a simply intersects with first conductive wire 31b in an example where second front electrode 26 is higher than first front electrode 21, first conductive wire 31a and first conductive wire 31b intersect with each other in a portion proximal to second front electrode 26. Therefore, air bubbles that remain below first conductive wires 31a and 31b are less likely to escape to the outside of sealing member 60. In contrast, in power module 1d, first conductive wire 31a and first conductive wire 31b are deformed and then first conductive wire 31a and first conductive wire 31b intersect with each other, so that first conductive wire 31a and first conductive wire 31b intersect with each other at the top of first conductive wire 31a and the top of first conductive wire 31b. Therefore, air bubbles that remain below first conductive wires 31a and 31b are likely to escape to the outside of sealing member 60.

Though power modules 1 to 1d in the present embodiment each include two semiconductor elements (first semiconductor element 20 and second semiconductor element 25), they may each include at least one semiconductor element. For example, though power modules 1 to 1d in the present embodiment are each a 1-in-1 type power module including a pair of a diode (first semiconductor element 20) and an IGBT (second semiconductor element 25), they each may be a 2-in-1 type power module including two pairs of a diode (first semiconductor element 20) and an IGBT (second semiconductor element 25b) or a 6-in-1 type power module including six pairs of a diode (first semiconductor element 20) and an IGBT (second semiconductor element 25).

Effects of power modules 1 to 1d and a method of manufacturing the same in the present embodiment will be described.

Power modules 1 to 1d in the present embodiment each include a first conductive member (first front electrode 21; first front electrode 21; first conductive layer 12), a second conductive member (first lead terminal 52; second front electrode 26; second lead terminal 53) spaced away from the first conductive member in the first direction (the x direction), a plurality of conductive wire groups (the plurality of first conductive wire groups 30 and 30b; the plurality of first conductive wire groups 30 and 30b; the plurality of second conductive wire groups 35 and 35b), and sealing member 60. The plurality of conductive wire groups electrically connect the first conductive member and the second conductive member to each other. Sealing member 60 seals at least a part of the first conductive member, at least a part of the second conductive member, and the plurality of conductive wire groups.

The plurality of conductive wire groups are arranged in parallel in the second direction (the y direction) perpendicular to the first direction (the x direction). The plurality of conductive wire groups each include a plurality of conductive wires (the plurality of first conductive wires 31a, 31b, and 31c; the plurality of first conductive wires 31a, 31b, and 31c; the plurality of second conductive wires 36a, 36b, and 36c). The plurality of conductive wire groups each include a first bonded portion (bonded portion 30m; bonded portion 30m; bonded portion 35m) bonded to the first conductive member and a second bonded portion (bonded portion 30n; bonded portion 30p; bonded portion 35n) bonded to the second conductive member (first lead terminal 52; second front electrode 26; second lead terminal 53).

In the plan view of the first conductive member, a maximum gap (maximum gap $G_{max1}$; maximum gap $G_{max2}$; maximum gap $G_{max3}$) in the second direction (the y direction) between the intermediate portions (the first intermediate portions; the second intermediate portions; the third intermediate portions) of a pair of conductive wire groups (the pair of first conductive wire groups 30 and 30b; the pair of first conductive wire groups 30 and 30b; the pair of second conductive wire groups 35 and 35b) adjacent to each other is larger than a first gap (gap $G_1$; gap $G_1$; gap $G_4$) in the second direction between the first bonded portions of the pair of conductive wire groups adjacent to each other. The intermediate portion is located between the first bonded portion and the second bonded portion. In the plan view of the first conductive member, a maximum gap (maximum gap $G_{max1}$; maximum gap $G_{max2}$; maximum gap $G_{max3}$) in the second direction between the intermediate portions of the pair of conductive wire groups adjacent to each other is larger than a second gap (gap $G_2$; gap $G_3$; gap $G_5$) in the second direction between the second bonded portions of the pair of conductive wire groups adjacent to each other.

Therefore, air bubbles that were introduced in sealing member 60 in providing sealing member 60 and remain below the plurality of conductive wires readily pass between the pair of conductive wire groups adjacent to each other and escape to the outside of sealing member 60. Lowering in insulating performance of sealing member 60 is prevented. Power modules 1 to 1d in the present embodiment are improved in reliability.

In power modules 1 to 1d in the present embodiment, the number of conductive wires can be increased and the gap between the pair of conductive wires adjacent to each other can be made smaller. Therefore, power modules 1 to 1d can handle a higher current while they are small in size. Furthermore, since power modules 1 to 1d in the present embodiment each include a structure that can allow elimination of a step of checking for air bubbles, they can achieve improved production efficiency.

The method of manufacturing power modules 1 to 1d in the present embodiment includes electrically connecting the first conductive member (first front electrode 21; first front electrode 21; first conductive layer 12) and the second conductive member (first lead terminal 52; second front electrode 26; second lead terminal 53) spaced away from the first conductive member in the first direction (the x direction) to each other through the plurality of conductive wire groups (the plurality of first conductive wire groups 30 and 30b; the plurality of first conductive wire groups 30 and 30b; the plurality of second conductive wire groups 35 and 35b). The plurality of conductive wire groups are arranged in parallel in the second direction (the y direction) intersecting with the first direction. The plurality of conductive wire groups each include a plurality of conductive wires (the plurality of first conductive wires 31a, 31b, and 31c; the plurality of first conductive wires 31a, 31b, and 31c; the plurality of second conductive wires 36a, 36b, and 36c).

The method of manufacturing power modules 1 to 1d in the present embodiment further includes sealing at least a part of the first conductive member, at least a part of the second conductive member, and the plurality of conductive wire groups with sealing member 60. The plurality of conductive wire groups each include a first bonded portion (bonded portion 30m; bonded portion 30m; bonded portion 35m) bonded to the first conductive member and a second bonded portion (bonded portion 30n; bonded portion 30p; bonded portion 35n) bonded to the second conductive member.

In the plan view of the first conductive member, a maximum gap (maximum gap $G_{max1}$; maximum gap $G_{max2}$; maximum gap $G_{max3}$) in the second direction (the y direction) between intermediate portions (the first intermediate portions; the second intermediate portions; the third intermediate portions) of the pair of conductive wire groups adjacent to each other is larger than a first gap (gap $G_1$; gap $G_1$; gap $G_4$) in the second direction between the first bonded portions of the pair of conductive wire groups adjacent to each other. The intermediate portion is located between the first bonded portion and the second bonded portion. In the plan view of the first conductive member, a maximum gap (maximum gap $G_{max1}$; maximum gap $G_{max2}$; maximum gap $G_{max3}$) in the second direction (the y direction) between intermediate portions of the pair of conductive wire groups adjacent to each other is larger than a second gap (gap $G_2$; gap $G_3$; gap $G_5$) in the second direction between the second bonded portions of the pair of conductive wire groups adjacent to each other.

Therefore, air bubbles that were introduced in sealing member 60 in providing sealing member 60 and remain below the plurality of conductive wires readily pass between the pair of conductive wire groups adjacent to each other and escape to the outside of sealing member 60. Lowering in insulating performance of sealing member 60 is prevented. According to the method of manufacturing power modules 1 to 1d in the present embodiment, power modules 1 to 1d improved in reliability are obtained.

According to the method of manufacturing power modules 1 to 1d in the present embodiment, the number of conductive wires can be increased and a gap between the pair of conductive wires adjacent to each other can be made smaller. Therefore, small power modules 1 to 1d capable of handling a higher current are obtained. According to the method of manufacturing power modules 1 to 1d in the present embodiment, since the step of checking for air bubbles can be eliminated, power modules 1 to 1d are obtained at improved production efficiency.

Second Embodiment

A power module 1e in a second embodiment will be described with reference to FIGS. 24 to 32. Power module 1e in the present embodiment is similar in configuration to power module 1 in the first embodiment and mainly different in points below.

As shown in FIGS. 24 to 28, in power module 1e, in the plan view of first front electrode 21, the plurality of first conductive wires 31a and 31b are arranged in the second direction (the y direction). In the plan view of first front electrode 21, the plurality of first conductive wires 31a and 31b do not intersect with each other. In the plan view of first front electrode 21, in a portion of each of the plurality of first conductive wire groups 30 where maximum gap $G_{max1}$ is defined, the plurality of first conductive wires 31a and 31b are closer to each other in the second direction (the y direction) than in bonded portion 30m and bonded portion 30n.

Figure 26:
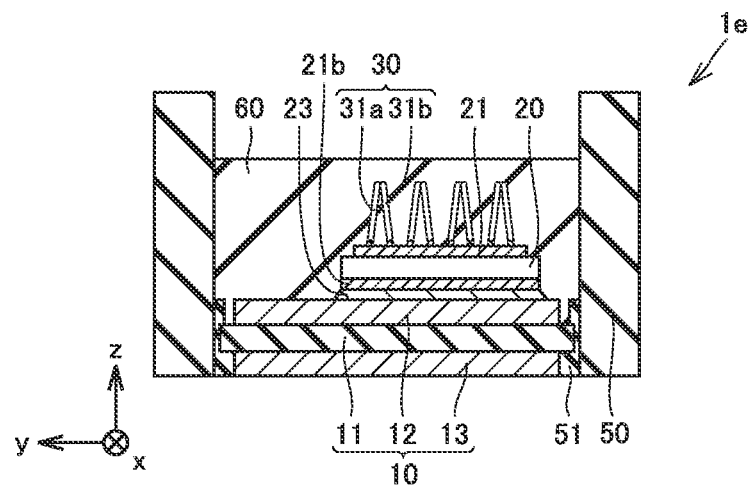
FIG. 26 is a schematic cross-sectional view along the line XXVI-XXVI shown in FIG. 24, of the power module according to the second embodiment.
Figure 27:
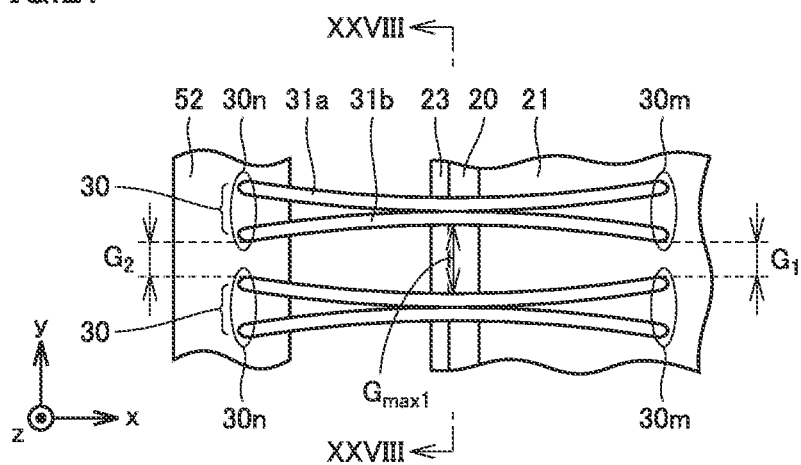
FIG. 27 is a partially enlarged schematic plan view of the power module according to the second embodiment.
Figure 28:
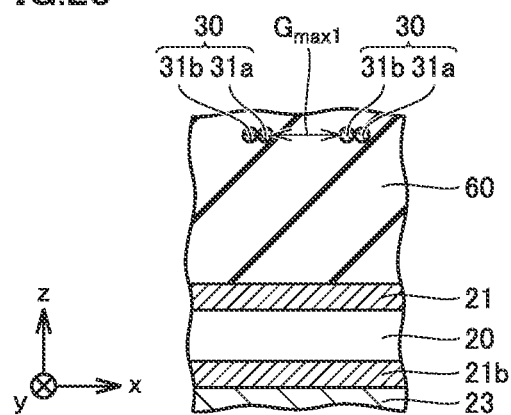
FIG. 28 is a partially enlarged schematic cross-sectional view along the line XXVIII-XXVIII shown in FIG. 27, of the power module according to the second embodiment.
Figure 29:
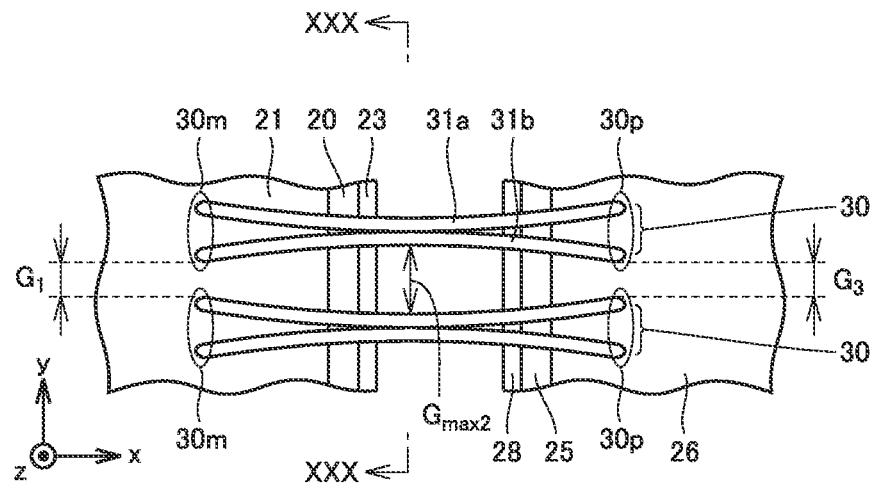
FIG. 29 is a partially enlarged schematic plan view of the power module according to the second embodiment.

First conductive wire 31a may be in contact with or spaced away from first conductive wire 31b adjacent thereto. In one example, the top of first conductive wire 31a is located as high as the top of first conductive wire 31b. As shown in FIGS. 26 and 28, portions of the pair of first conductive wire groups 30 adjacent to each other where maximum gap $G_{max1}$ is defined are equal to each other in height (for example, heights of the tops of the pair of first conductive wire groups 30 adjacent to each other).

Figure 33:
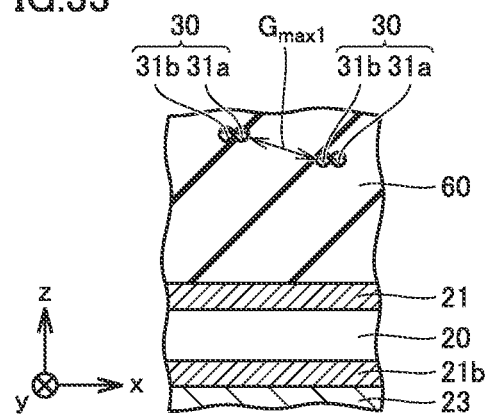
FIG. 33 is a partially enlarged schematic cross-sectional view of a power module according to a first modification of the second embodiment.

As shown in FIG. 33, portions of the pair of first conductive wire groups 30 adjacent to each other where maximum gap $G_{max1}$ is defined may be different from each other in height (for example, heights of the tops of the pair of first conductive wire groups 30 adjacent to each other). Therefore, the maximum gap between the pair of first conductive wire groups 30 adjacent to each other becomes further larger. Air bubbles that were introduced in sealing member 60 in providing sealing member 60 and remain below the plurality of first conductive wires 31a and 31b more readily pass between the pair of first conductive wire groups 30 adjacent to each other and escape to the outside of sealing member 60.

As shown in FIGS. 24, 25, 29, and 30, in power module 1e, in the plan view of first front electrode 21, the plurality of first conductive wires 31a and 31b are arranged in the second direction (the y direction). In the plan view of first front electrode 21, the plurality of first conductive wires 31a and 31b do not intersect with each other. In the plan view of first front electrode 21, in the portion of each of the plurality of first conductive wire groups 30 where maximum gap $G_{max2}$ is defined, the plurality of first conductive wires 31a and 31b are closer to each other in the second direction (the y direction) than in bonded portion 30m and bonded portion 30p.

Figure 30:
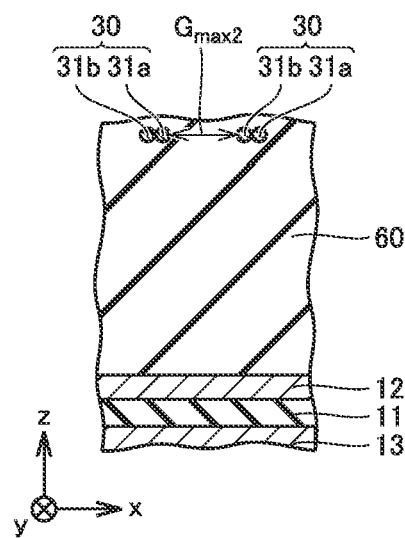
FIG. 30 is a partially enlarged schematic cross-sectional view along the line XXX-XXX shown in FIG. 29, of the power module according to the second embodiment.
Figure 31:
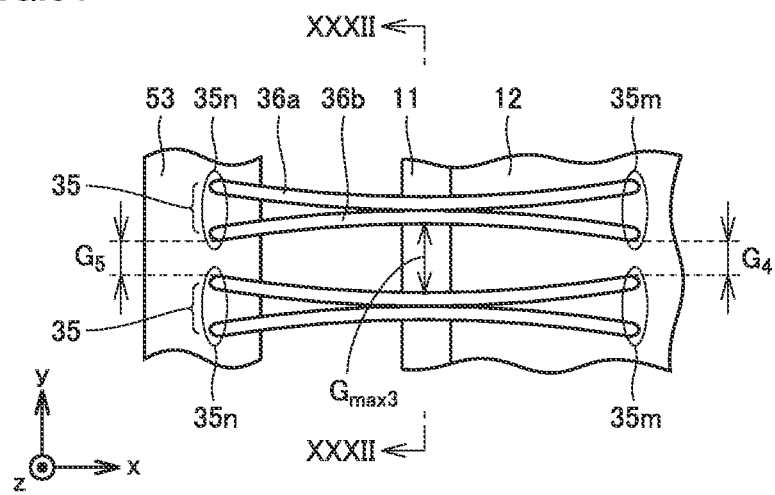
FIG. 31 is a partially enlarged schematic plan view of the power module according to the second embodiment.

First conductive wire 31a may be in contact with or spaced away from first conductive wire 31b adjacent thereto. In one example, the top of first conductive wire 31a is located as high as the top of first conductive wire 31b. As shown in FIG. 30, portions of the pair of first conductive wire groups 30 adjacent to each other where maximum gap $G_{max2}$ is defined are equal to each other in height (for example, heights of the tops of the pair of first conductive wire groups 30 adjacent to each other).

Figure 34:
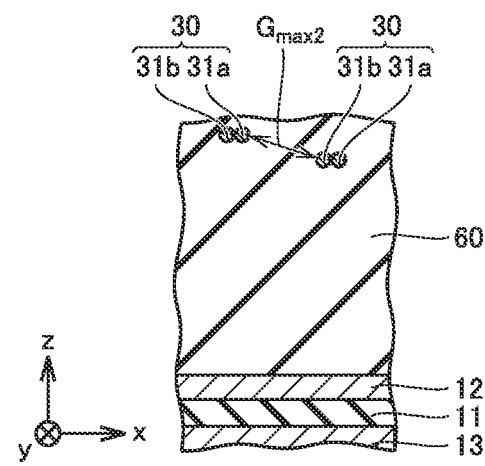
FIG. 34 is a partially enlarged schematic cross-sectional view of the power module according to the first modification of the second embodiment.

As shown in FIG. 34, portions of the pair of first conductive wire groups 30 adjacent to each other where maximum gap $G_{max2}$ is defined may be different from each other in height (for example, heights of the tops of the pair of first conductive wire groups 30 adjacent to each other). Therefore, the gap between the pair of first conductive wire groups 30 adjacent to each other becomes further larger. Air bubbles that were introduced in sealing member 60 in providing sealing member 60 and remain below the plurality of first conductive wires 31a and 31b more readily pass between the pair of first conductive wire groups 30 adjacent to each other and escape to the outside of sealing member 60.

As shown in FIGS. 24, 25, 31, and 32, in power module 1e, in the plan view of first conductive layer 12, the plurality of second conductive wires 36a and 36b are arranged in the second direction (the y direction). In the plan view of first conductive layer 12, the plurality of second conductive wires 36a and 36b do not intersect with each other. In the plan view of first conductive layer 12, in a portion of each of the plurality of second conductive wire groups 35 where maximum gap $G_{max3}$ is defined, the plurality of second conductive wires 36a and 36b are closer to each other in the second direction (the y direction) than in bonded portion 35m and bonded portion 35n.

Figure 32:
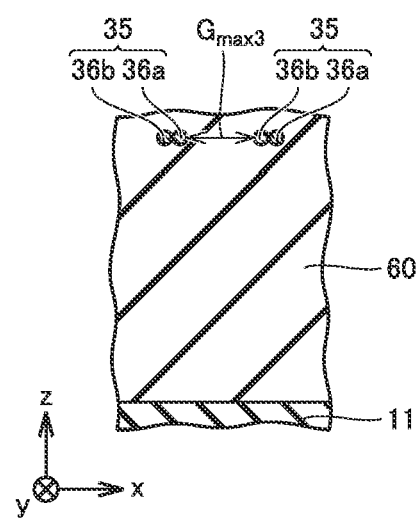
FIG. 32 is a partially enlarged schematic cross-sectional view along the line XXXII-XXXII shown in FIG. 31, of the power module according to the second embodiment.

Second conductive wire 36a may be in contact with or spaced away from second conductive wire 36b adjacent thereto. In one example, the top of second conductive wire 36a is located as high as the top of second conductive wire 36b. As shown in FIG. 32, portions of the pair of second conductive wire groups 35 adjacent to each other where maximum gap $G_{max3}$ is defined are equal to each other in height (for example, heights of the tops of the pair of second conductive wire groups 35 adjacent to each other).

Figure 35:
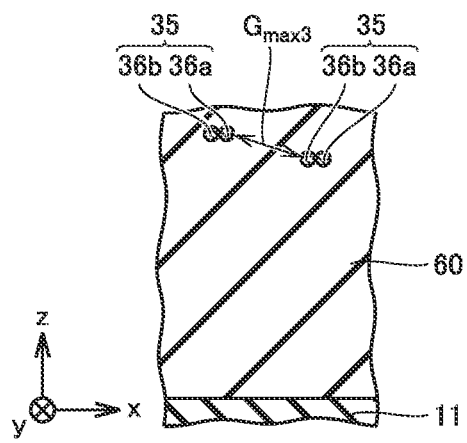
FIG. 35 is a partially enlarged schematic cross-sectional view of the power module according to the first modification of the second embodiment.

As shown in FIG. 35, portions of the pair of second conductive wire groups 35 adjacent to each other where maximum gap $G_{max3}$ is defined may be different from each other in height (for example, heights of the tops of the pair of second conductive wire groups 35 adjacent to each other). Therefore, the gap between the pair of second conductive wire groups 35 adjacent to each other becomes further larger. Air bubbles that were introduced in sealing member 60 in providing sealing member 60 and remain below the plurality of second conductive wires 36a and 36b more readily pass between the pair of second conductive wire groups 35 adjacent to each other and escape to the outside of sealing member 60.

A method of manufacturing power module 1e in the second embodiment will be described with reference to FIGS. 15, 16, 24, 25, and 36 to 38.

As shown in FIG. 15, the method of manufacturing power module 1e in the present embodiment includes mounting first semiconductor element 20 and second semiconductor element 25 on circuit substrate 10 as in the method of manufacturing power module 1 in the first embodiment. As shown in FIG. 16, the method of manufacturing power module 1e in the present embodiment includes attaching circuit substrate 10 to case 50 as in the method of manufacturing power module 1 in the first embodiment.

Figure 36:
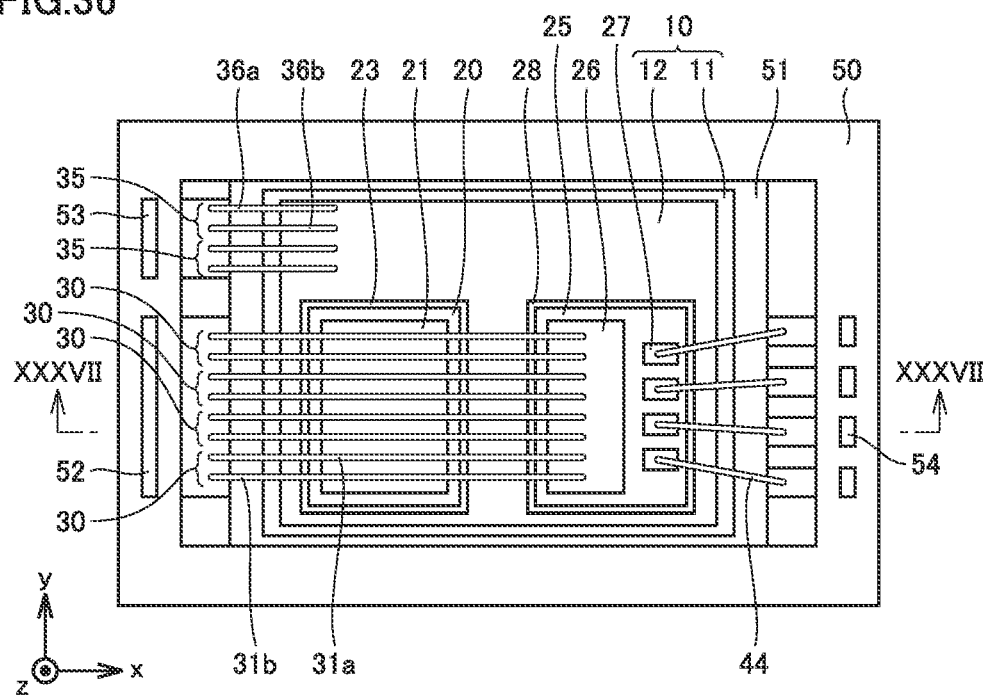
FIG. 36 is a schematic plan view showing a step next to the step shown in FIG. 16, in the method of manufacturing a power module according to the second embodiment.
Figure 37:
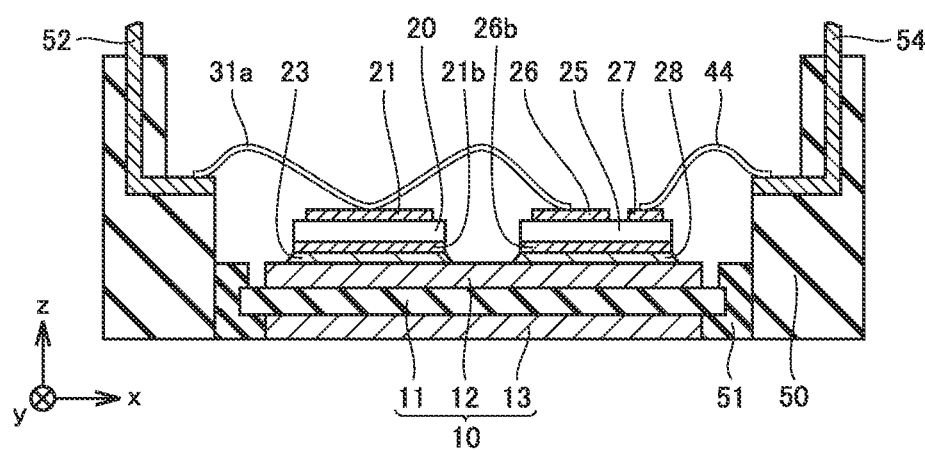
FIG. 37 is a schematic cross-sectional view along the line XXXVII-XXXVII shown in FIG. 36, in the method of manufacturing a power module according to the second embodiment.
Figure 38:
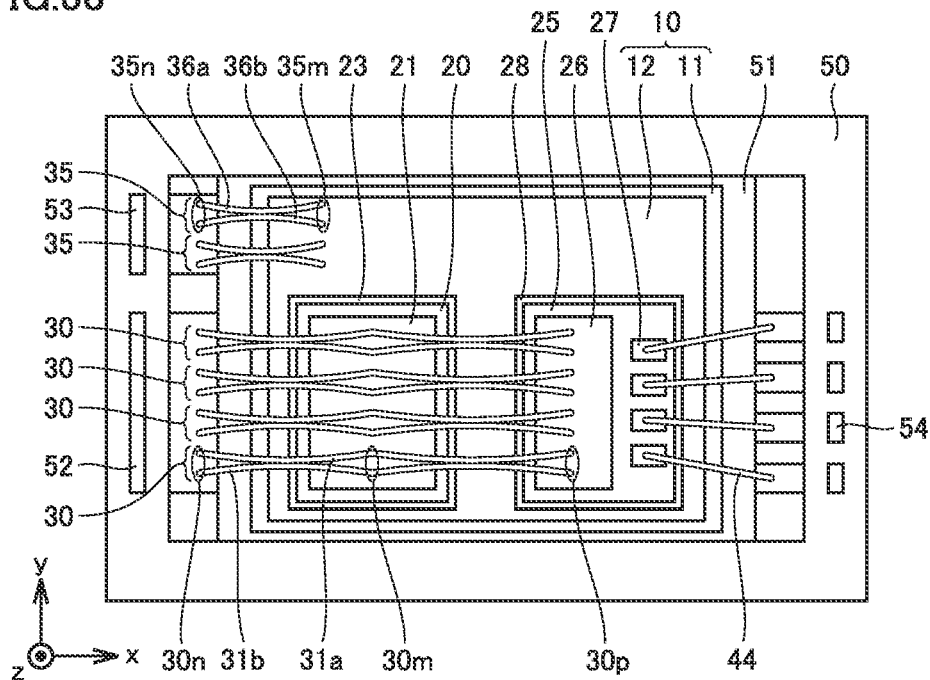
FIG. 38 is a schematic plan view showing a step next to the step shown in FIG. 36, in the method of manufacturing a power module according to the second embodiment.

As shown in FIGS. 36 to 38, the method of manufacturing power module 1e in the present embodiment includes electrically connecting first front electrode 21 of first semiconductor element 20 and first lead terminal 52 to each other through the plurality of first conductive wire groups 30. Electrically connecting first front electrode 21 of first semiconductor element 20 and first lead terminal 52 to each other through the plurality of first conductive wire groups 30 includes bringing the plurality of first conductive wires 31a and 31b closer to each other in the second direction (the y direction) in the portion of each of the plurality of first conductive wire groups 30 where maximum gap $G_{max1}$ is defined than in bonded portion 30m and bonded portion 30n in the plan view of first front electrode 21.

In the plan view of first front electrode 21, the plurality of first conductive wires 31a and 31b are arranged in the second direction (the y direction). In the plan view of first front electrode 21, the plurality of first conductive wires 31a and 31b do not intersect with each other. First conductive wire 31a may be in contact with or spaced away from first conductive wire 31b adjacent thereto.

One example of a step of electrically connecting first front electrode 21 of first semiconductor element 20 and first lead terminal 52 to each other through the plurality of first conductive wire groups 30 will be described. As shown in FIGS. 36 and 37, the plurality of first conductive wires 31a and 31b are bonded to first front electrode 21 and first lead terminal 52 with a wire bonder (not shown). In the plan view of first front electrode 21, the plurality of first conductive wires 31a and 31b are arranged, for example, in parallel to each other. Then, two first conductive wires 31a and 31b adjacent to each other are pinched by a jig (not shown) like tweezers. Two first conductive wires 31a and 31b adjacent to each other are deformed. As shown in FIG. 38, in the plan view of first front electrode 21, in the portion of each of the plurality of first conductive wire groups 30 where maximum gap $G_{max1}$ is defined, the plurality of first conductive wires 31a and 31b are closer to each other in the second direction (the y direction) than in bonded portion 30m and bonded portion 30n.

Another example of the step of electrically connecting first front electrode 21 of first semiconductor element 20 and first lead terminal 52 to each other through the plurality of first conductive wire groups 30 will be described. By controlling movement of a wire bonder (not shown), in the plan view of first front electrode 21, the plurality of first conductive wires 31a and 31b are bonded to first front electrode 21 and first lead terminal 52 while the plurality of first conductive wires 31a and 31b are brought closer to each other in the second direction (the y direction) in the portion of each of the plurality of first conductive wire groups 30 where maximum gap $G_{max1}$ is defined than in bonded portion 30m and bonded portion 30n. This another example allows manufacturing of power module 1e in smaller number of steps than in an example of the step of electrically connecting first front electrode 21 of first semiconductor element 20 and first lead terminal 52 to each other through the plurality of first conductive wire groups 30.

As shown in FIGS. 36 to 38, the method of manufacturing power module 1e in the present embodiment includes electrically connecting first front electrode 21 of first semiconductor element 20 and second front electrode 26 of second semiconductor element 25 to each other through the plurality of first conductive wire groups 30. Electrically connecting first front electrode 21 of first semiconductor element 20 and second front electrode 26 of second semiconductor element 25 to each other through the plurality of first conductive wire groups 30 includes bringing the plurality of first conductive wires 31a and 31b closer to each other in the second direction (the y direction) in the portion of each of the plurality of first conductive wire groups 30 where maximum gap $G_{max2}$ is defined than in bonded portion 30m and bonded portion 30p in the plan view of first front electrode 21.

In the plan view of first front electrode 21, the plurality of first conductive wires 31a and 31b are arranged in the second direction (the y direction). In the plan view of first front electrode 21, the plurality of first conductive wires 31a and 31b do not intersect with each other. First conductive wire 31a may be in contact with or spaced away from first conductive wire 31b adjacent thereto.

One example of a step of electrically connecting first front electrode 21 of first semiconductor element 20 and second front electrode 26 of second semiconductor element 25 to each other through the plurality of first conductive wire groups 30 will be described. As shown in FIGS. 36 and 37, the plurality of first conductive wires 31a and 31b are bonded to first front electrode 21 and second front electrode 26 with a wire bonder (not shown). In the plan view of first front electrode 21, the plurality of first conductive wires 31a and 31b are arranged, for example, in parallel to each other. Then, two first conductive wires 31a and 31b adjacent to each other are pinched by a jig (not shown) like tweezers. Two first conductive wires 31a and 31b adjacent to each other are deformed. As shown in FIG. 38, in the plan view of first front electrode 21, in the portion of each of the plurality of first conductive wire groups 30 where maximum gap $G_{max2}$ is defined, the plurality of first conductive wires 31a and 31b are closer to each other in the second direction (the y direction) than in bonded portion 30m and bonded portion 30p.

Another example of the step of electrically connecting first front electrode 21 of first semiconductor element 20 and second front electrode 26 of second semiconductor element 25 to each other through the plurality of first conductive wire groups 30 will be described. By controlling movement of a wire bonder (not shown), in the plan view of first front electrode 21, the plurality of first conductive wires 31a and 31b are bonded to first front electrode 21 and second front electrode 26 while the plurality of first conductive wires 31a and 31b are brought closer to each other in the second direction (the y direction) in the portion of each of the plurality of first conductive wire groups 30 where maximum gap $G_{max2}$ is defined than in bonded portions 30m and bonded portion 30p. This another example allows manufacturing of power module 1e in smaller number of steps than in an example of the step of electrically connecting first front electrode 21 of first semiconductor element 20 and second front electrode 26 of second semiconductor element 25 to each other through the plurality of first conductive wire groups 30.

As shown in FIGS. 36 to 38, the method of manufacturing power module 1e in the present embodiment includes electrically connecting first conductive layer 12 and second lead terminal 53 to each other through the plurality of second conductive wire groups 35. Electrically connecting first conductive layer 12 and second lead terminal 53 to each other through the plurality of second conductive wire groups 35 includes bringing the plurality of second conductive wires 36a and 36b closer to each other in the second direction (the y direction) in the portion of each of the plurality of second conductive wire groups 35 where maximum gap $G_{max3}$ is defined than in bonded portion 35m and bonded portion 35n in the plan view of first conductive layer 12.

In the plan view of first conductive layer 12, the plurality of second conductive wires 36a and 36b are arranged in the second direction (the y direction). In the plan view of first front electrode 21, the plurality of second conductive wires 36a and 36b do not intersect with each other. Second conductive wire 36a may be in contact with or spaced away from second conductive wire 36b adjacent thereto.

One example of a step of electrically connecting first conductive layer 12 and second lead terminal 53 to each other through the plurality of second conductive wire groups 35 will be described. As shown in FIGS. 36 and 37, the plurality of second conductive wires 36a and 36b are bonded to first conductive layer 12 and second lead terminal 53 with a wire bonder (not shown). In the plan view of first conductive layer 12, the plurality of second conductive wires 36a and 36b are arranged, for example, in parallel to each other. Then, two second conductive wires 36a and 36b adjacent to each other are pinched by a jig (not shown) like tweezers. Two second conductive wires 36a and 36b adjacent to each other are deformed. As shown in FIG. 38, in the plan view of first conductive layer 12, in the portion of each of the plurality of second conductive wire groups 35 where maximum gap $G_{max3}$ is defined, the plurality of second conductive wires 36a and 36b are closer to each other in the second direction (the y direction) than in bonded portion 35m and bonded portion 35n.

Another example of the step of electrically connecting first conductive layer 12 and second lead terminal 53 to each other through the plurality of second conductive wire groups 35 will be described. By controlling movement of a wire bonder (not shown), in the plan view of first conductive layer 12, the plurality of second conductive wires 36a and 36b are bonded to first conductive layer 12 and second lead terminal 53 while the plurality of second conductive wires 36a and 36b are brought closer to each other in the second direction (the y direction) in the portion of each of the plurality of second conductive wire groups 35 where maximum gap $G_{max3}$ is defined than in bonded portion 35m and bonded portion 35n. This another example allows manufacturing of power module 1e in smaller number of steps than in an example of the step of electrically connecting first conductive layer 12 and second lead terminal 53 to each other through the plurality of second conductive wire groups 35.

Then, as in the method of manufacturing power module 1 in the first embodiment, the method of manufacturing power module 1e in the present embodiment includes sealing first semiconductor element 20, second semiconductor element 25, a part of first lead terminal 52, a part of second lead terminal 53, a part of third lead terminal 54, the plurality of first conductive wire groups 30, the plurality of second conductive wire groups 35, and the plurality of third conductive wires 44 with sealing member 60. As in the method of manufacturing power module 1 in the first embodiment, in the method of manufacturing power module 1e in the present embodiment, air bubbles that were introduced in sealing member 60 in providing sealing member 60 and remain below the plurality of first conductive wires 31a and 31b readily pass between the pair of first conductive wire groups 30 adjacent to each other and escape to the outside of sealing member 60. Air bubbles that were introduced in sealing member 60 in providing sealing member 60 and remain below the plurality of second conductive wires 36a and 36b readily pass between the pair of second conductive wire groups 35 adjacent to each other and escape to the outside of sealing member 60. Lowering in insulating performance of sealing member 60 is prevented. Power module 1e improved in reliability is obtained.

Figure 39:
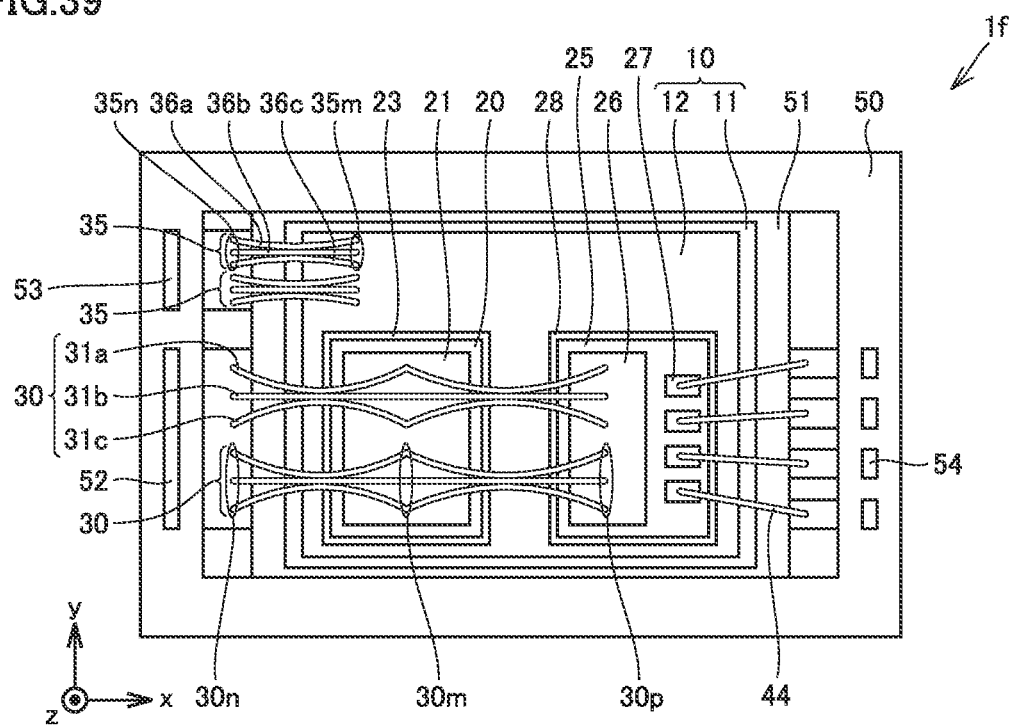
FIG. 39 is a schematic plan view of a power module according to a second modification of the second embodiment.

As in a power module 1f shown in FIG. 39, the plurality of first conductive wire groups 30 may each include three or more first conductive wires 31a, 31b, and 31c. The plurality of second conductive wire groups 35 may each include three or more second conductive wires 36a, 36b, and 36c.

Power modules 1e and 1f in the present embodiment achieve effects below similarly to power module 1 in the first embodiment.

In power modules 1e and 1f in the present embodiment, in the plan view of the first conductive member (first front electrode 21; first front electrode 21; first conductive layer 12), a plurality of conductive wires (the plurality of first conductive wires 31a, 31b, and 31c; the plurality of first conductive wires 31a, 31b, and 31c; the plurality of second conductive wires 36a, 36b, and 36c) are arranged in the second direction (the y direction). In the plan view of the first conductive member, in a portion of each of the plurality of conductive wire groups (the plurality of first conductive wire groups 30; the plurality of first conductive wire groups 30; the plurality of second conductive wire groups 35) where a maximum gap (maximum gap $G_{max1}$; maximum gap $G_{max2}$; maximum gap $G_{max3}$) is defined, the plurality of conductive wires are closer to each other in the second direction (the y direction) than in a first bonded portion (bonded portion 30m; bonded portion 30m; bonded portion 35m) and a second bonded portion (bonded portion 30n; bonded portion 30p; bonded portion 35n).

Therefore, air bubbles that were introduced in sealing member 60 in providing sealing member 60 and remain below the plurality of conductive wires readily pass between the pair of conductive wire groups adjacent to each other and escape to the outside of sealing member 60. Lowering in insulating performance of sealing member 60 is prevented. Power modules 1e and 1f are improved in reliability.

In power modules 1e and 1f in the present embodiment, the number of conductive wires can be increased and a gap between the pair of conductive wires adjacent to each other can be made smaller. Therefore, power modules 1e and 1f can handle a higher current while they are small in size. Furthermore, since power modules 1e and 1f in the present embodiment each include a structure that can allow elimination of the step of checking for air bubbles, they can achieve improved production efficiency.

In the method of manufacturing power modules 1e and 1f in the present embodiment, electrically connecting the first conductive member (first front electrode 21; first front electrode 21; first conductive layer 12) and the second conductive member (first lead terminal 52; second front electrode 26; second lead terminal 53) to each other through the plurality of conductive wire groups (the plurality of first conductive wire groups 30; the plurality of first conductive wire groups 30; the plurality of second conductive wire groups 35) includes bringing the plurality of conductive wires (the plurality of first conductive wires 31a, 31b, and 31c; the plurality of first conductive wires 31a, 31b, and 31c; the plurality of second conductive wires 36a, 36b, and 36c) closer to each other in the second direction (the y direction) in a portion of each of the plurality of conductive wire groups where a maximum gap (maximum gap $G_{max1}$; maximum gap $G_{max2}$; maximum gap $G_{max3}$) is defined than in a first bonded portion (bonded portion 30m; bonded portion 30m; bonded portion 35m) and a second bonded portion (bonded portion 30n; bonded portion 30p; bonded portion 35n) in the plan view of the first conductive member. In the plan view of the first conductive member, the plurality of conductive wires are arranged in the second direction (the y direction).

Therefore, air bubbles that were introduced in sealing member 60 in providing sealing member 60 and remain below the plurality of conductive wires readily pass between the pair of conductive wire groups adjacent to each other and escape to the outside of sealing member 60. Lowering in insulating performance of sealing member 60 is prevented. According to the method of manufacturing power modules 1e and 1f in the present embodiment, power modules 1e and 1f improved in reliability are obtained.

According to the method of manufacturing power modules 1e and 1f in the present embodiment, the number of conductive wires can be increased and a gap between the pair of conductive wires adjacent to each other can be made smaller. Therefore, small power modules 1e and 1f capable of handling a higher current are obtained. Furthermore, according to the method of manufacturing power modules 1e and 1f in the present embodiment, the step of checking for air bubbles can be eliminated and hence power modules 1e and 1f are obtained at improved production efficiency.

Third Embodiment

Figure 40:
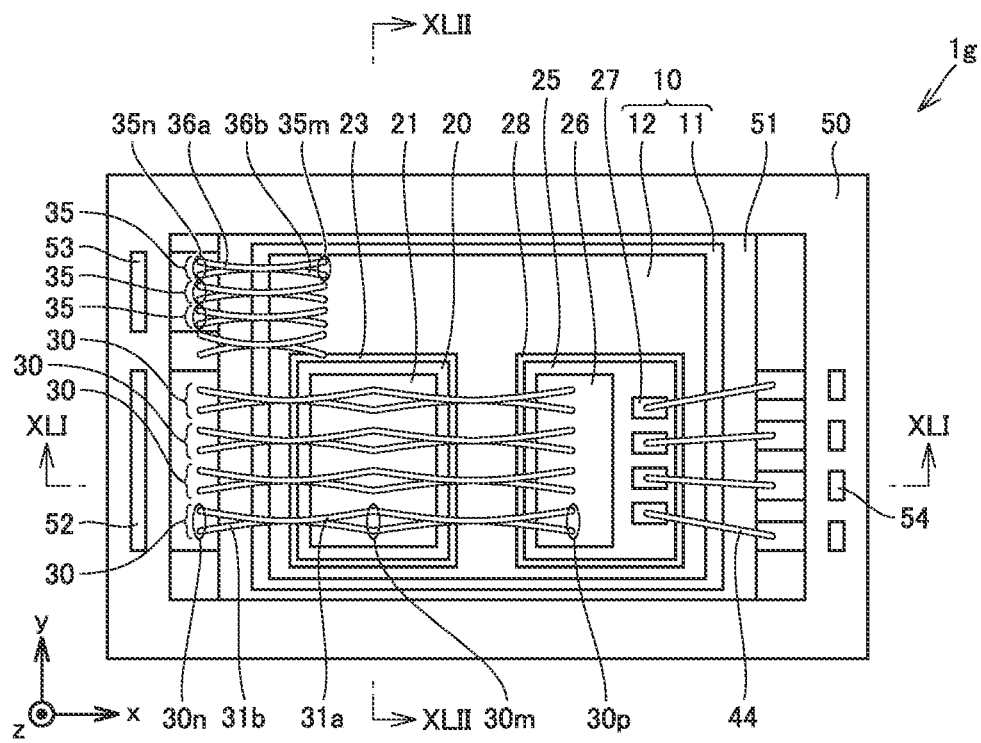
FIG. 40 is a schematic plan view of a power module according to a third embodiment.
Figure 41:
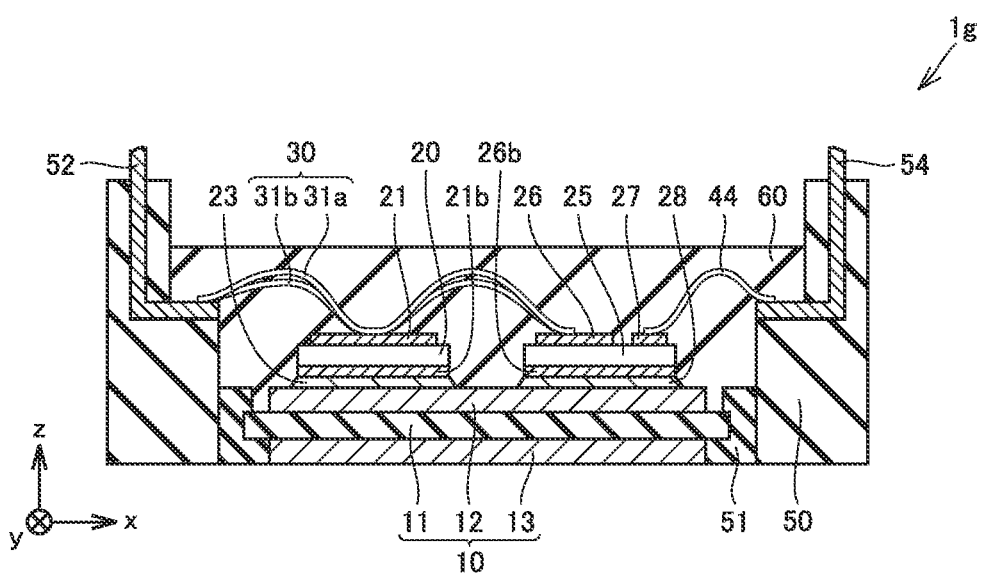
FIG. 41 is a schematic cross-sectional view along the line XLI-XLI shown in FIG. 40, of the power module according to the third embodiment.
Figure 42:
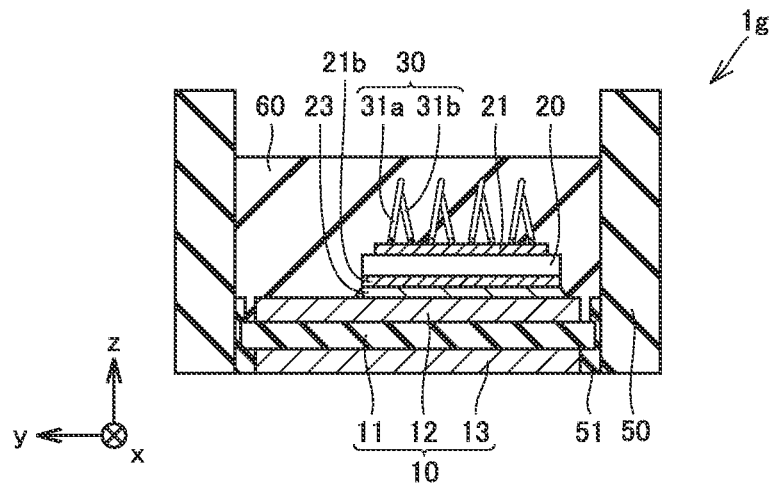
FIG. 42 is a schematic cross-sectional view along the line XLII-XLII shown in FIG. 40, of the power module according to the third embodiment.

A power module 1g in a third embodiment will be described with reference to FIGS. 40 to 42. Power module 1g in the present embodiment is similar in configuration to power module 1e in the second embodiment and mainly different in points below.

The plurality of first conductive wires 31a and 31b are different from each other in length between bonded portion 30m and bonded portion 30n. In the plan view of first front electrode 21, the plurality of first conductive wires 31a and 31b overlap each other in a portion of each of the plurality of first conductive wire groups 30 where a maximum gap is defined, between bonded portion 30m and bonded portion 30n. First conductive wire 31a and first conductive wire 31b intersect with each other at the top of first conductive wire 31a and the top of first conductive wire 31b.

The plurality of first conductive wires 31a and 31b are different from each other in length between bonded portion 30m and bonded portion 30p. In the plan view of first front electrode 21, the plurality of first conductive wires 31a and 31b overlap each other in a portion of each of the plurality of first conductive wire groups 30 where a maximum gap is defined, between bonded portion 30m and bonded portion 30p. First conductive wire 31a and first conductive wire 31b intersect with each other at the top of first conductive wire 31a and the top of first conductive wire 31b.

The plurality of second conductive wires 36a and 36b are different from each other in length between bonded portion 35m and bonded portion 35n. In the plan view of first conductive layer 12, the plurality of second conductive wires 36a and 36b overlap each other in a portion of each of the plurality of second conductive wire groups 35 where a maximum gap is defined, between bonded portion 35m and bonded portion 35n. Second conductive wire 36a and second conductive wire 36b intersect with each other at the top of second conductive wire 36a and the top of second conductive wire 36b.

The method of manufacturing power module 1g in the third embodiment includes a step as in the method of manufacturing power module 1e in the second embodiment and different in points below. In the method of manufacturing power module 1g in the present embodiment, in the plan view of first front electrode 21, the plurality of first conductive wires 31a and 31b are brought closer to each other in the second direction (the y direction) until the plurality of first conductive wires 31a and 31b overlap each other in the portion of each of the plurality of first conductive wire groups 30 where the maximum gap is defined, between bonded portion 30m and bonded portion 30n.

In the plan view of first front electrode 21, the plurality of first conductive wires 31a and 31b are brought closer to each other in the second direction (the y direction) until the plurality of first conductive wires 31a and 31b overlap each other in the portion of each of the plurality of first conductive wire groups 30 where the maximum gap is defined, between bonded portion 30m and bonded portion 30p. In the plan view of first conductive layer 12, the plurality of second conductive wires 36a and 36b are brought closer to each other in the second direction (the y direction) until the plurality of second conductive wires 36a and 36b overlap each other in the portion of each of the plurality of second conductive wire groups 35 where the maximum gap is defined, between bonded portion 35m and bonded portion 35n.

Figure 43:
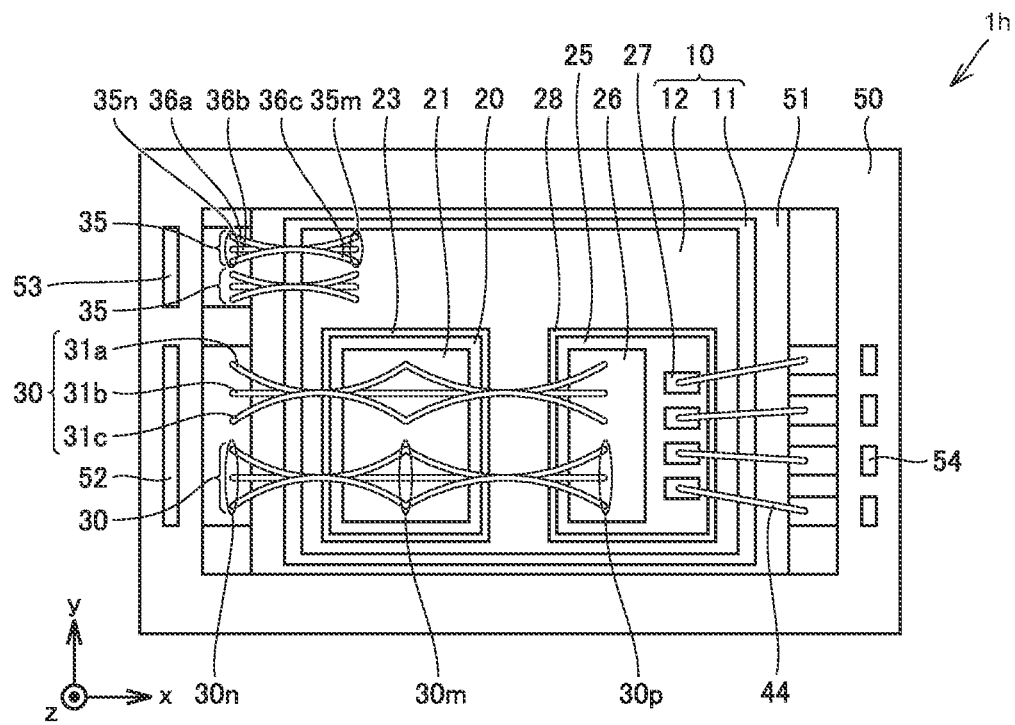
FIG. 43 is a schematic plan view of a power module according to a modification of the third embodiment.

Though a power module 1h shown in FIG. 43 is similar in configuration to power module 1g, the plurality of first conductive wire groups 30 may each include three or more first conductive wires 31a, 31b, and 31c. The plurality of second conductive wire groups 35 may each include three or more second conductive wires 36a, 36b, and 36c.

Power modules 1g and 1h in the present embodiment achieve effects below similarly to power modules 1d and 1e in the second embodiment.

In power modules 1g and 1h in the present embodiment, a plurality of conductive wires (the plurality of first conductive wires 31a, 31b, and 31c; the plurality of first conductive wires 31a, 31b, and 31c; the plurality of second conductive wires 36a, 36b, and 36c) are different from each other in length. In the plan view of the first conductive member (first front electrode 21; first front electrode 21; first conductive layer 12), the plurality of conductive wires do not intersect with each other. In the plan view of the first conductive member, in a portion of each of the plurality of conductive wire groups (the plurality of first conductive wire groups 30; the plurality of first conductive wire groups 30; the plurality of second conductive wire groups 35), the plurality of conductive wires overlap each other.

Therefore, the maximum gap between the plurality of conductive wires is further larger in the plan view of the first conductive member. Air bubbles that were introduced in sealing member 60 in providing sealing member 60 and remain below the plurality of conductive wires readily pass between the pair of conductive wire groups adjacent to each other and escape to the outside of sealing member 60. Lowering in insulating performance of sealing member 60 is prevented. Power modules 1g and 1h are improved in reliability. The number of conductive wires can be increased and the gap between the pair of conductive wires adjacent to each other can further be made smaller. Therefore, power modules 1g and 1h can handle a higher current while they are small in size. Furthermore, since power modules 1g and 1h each include a structure that can allow elimination of the step of checking for air bubbles, they can achieve improved production efficiency.

Fourth Embodiment

A power module 1i in a fourth embodiment will be described with reference to FIGS. 44 to 48. Power module 1i in the present embodiment is similar in configuration to power module 1 in the first embodiment and mainly different in including a first conductive wire group 80 and a second conductive wire group 85 instead of a plurality of first conductive wire groups 30 and a plurality of second conductive wire groups 35 (see FIGS. 1 to 3).

As shown in FIGS. 44 to 48, power module 1i further includes first conductive wire group 80, second conductive wire group 85, and the plurality of third conductive wires 44.

First conductive wire group 80 extends mainly along the first direction (the x direction). First conductive wire group 80 is constituted of a first conductive wire 81 and a second conductive wire 82 alternately arranged in the second direction (the y direction). In the plan view of first front electrode 21 (the plan view of second front electrode 26), first conductive wire 81 extends mainly along the first direction (the x direction). In the plan view of first front electrode 21, second conductive wire 82 extends mainly along the first direction (the x direction). The plan view of first front electrode 21 (the plan view of second front electrode 26) herein refers to a second plan view in the third direction (the z direction) perpendicular to the first direction and the second direction. In the plan view of first front electrode 21 (the second plan view in the third direction (the z direction)), first conductive wire 81 does not intersect with second conductive wire 82. For example, first conductive wire 81 has a diameter not smaller than 100 μm and not larger than 500 μm and second conductive wire 82 has a diameter not smaller than 100 μm and not larger than 500 μm.

Second conductive wire group 85 extends mainly along the first direction (the x direction). Second conductive wire group 85 is constituted of a first conductive wire 86 and a second conductive wire 87 alternately arranged in the second direction (the y direction). In the plan view of first conductive layer 12 (the plan view of second lead terminal 53 and the second plan view in the third direction (the z direction)), first conductive wire 86 extends mainly along the first direction (the x direction). In the plan view of first conductive layer 12 (the second plan view in the third direction (the z direction)), second conductive wire 87 extends mainly along the first direction (the x direction). In the plan view of first conductive layer 12, first conductive wire 86 does not intersect with second conductive wire 87. For example, first conductive wire 86 has a diameter not smaller than 100 μm and not larger than 500 μm and second conductive wire 87 has a diameter not smaller than 100 μm and not larger than 500 μm.

The plurality of third conductive wires 44 extend mainly along the first direction (the x direction). For example, the plurality of third conductive wires 44 each have a diameter of 0.15 mm. Third front electrode 27 of second semiconductor element 25 and third lead terminal 54 are electrically connected to each other through the plurality of third conductive wires 44.

First conductive wire group 80 (first conductive wire 81 and second conductive wire 82), second conductive wire group 85 (first conductive wire 86 and second conductive wire 87), and the plurality of third conductive wires 44 are, for example, aluminum wires, copper wires, copper wires coated with aluminum, or gold wires.

As shown in FIGS. 44, 45, 47, and 48, first front electrode 21 of first semiconductor element 20 and second front electrode 26 of second semiconductor element 25 are electrically connected to each other through first conductive wire group 80. Second front electrode 26 is spaced away from first front electrode 21 in the first direction (the x direction). First conductive wire group 80 includes a bonded portion 80m bonded to first front electrode 21 of first semiconductor element 20 and a bonded portion 80p bonded to second front electrode 26 of second semiconductor element 25.

In the second plan view in the third direction (the z direction), first conductive wire 81 and second conductive wire 82 adjacent to each other are spaced away from each other by at least a minimum gap g, between bonded portion 80m and bonded portion 80p. In bonded portion 80m, first conductive wire 81 and second conductive wire 82 may be arranged at a pitch p in the second direction (the y direction). In bonded portion 80p, first conductive wire 81 and second conductive wire 82 may be arranged at pitch p in the second direction (the y direction). Therefore, more first conductive wires 81 and second conductive wires 82 can be bonded to first front electrode 21 and second front electrode 26 while the gap between first conductive wire 81 and second conductive wire 82 adjacent to each other is widened as much as possible. Pitch p in bonded portion 80m may be equal to or different from pitch p in bonded portion 80p.

Pitch p is, for example, at most 4.0 times as large as the diameter of each of first conductive wire 81 and second conductive wire 82. Therefore, the number of first conductive wires 81 and second conductive wires 82 can be increased and a higher current can flow between first front electrode 21 of first semiconductor element 20 and second front electrode 26 of second semiconductor element 25 through first conductive wire group 80. Pitch p is, for example, at least 1.5 time as large as the diameter of each of first conductive wire 81 and second conductive wire 82.

Figure 44:
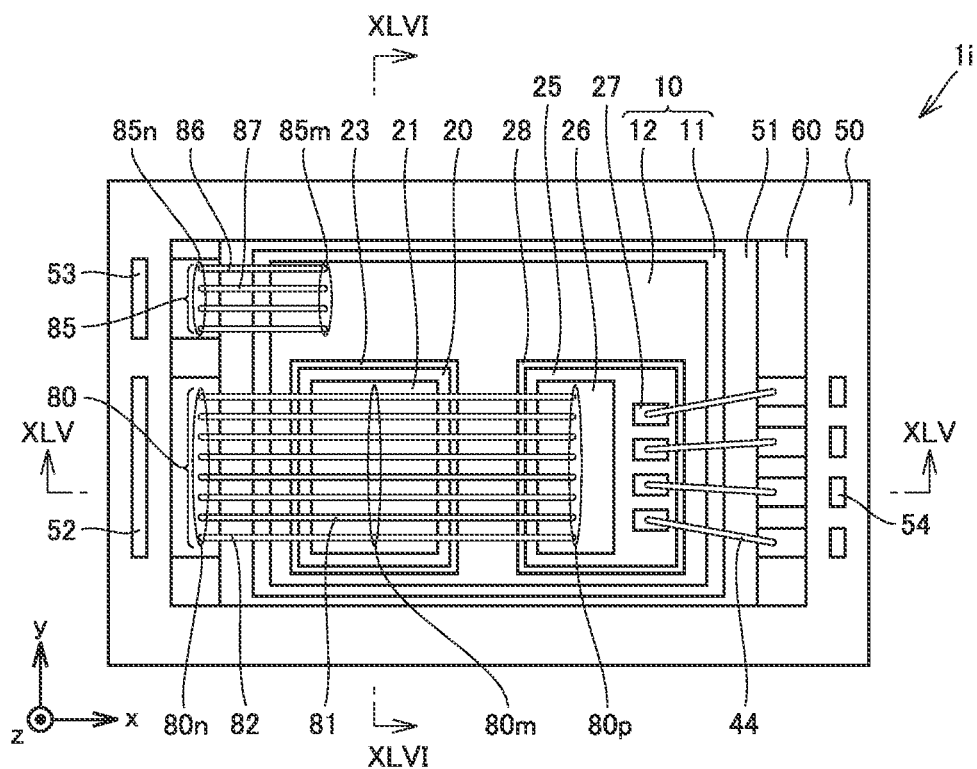
FIG. 44 is a schematic plan view of a power module according to a fourth embodiment.
Figure 45:
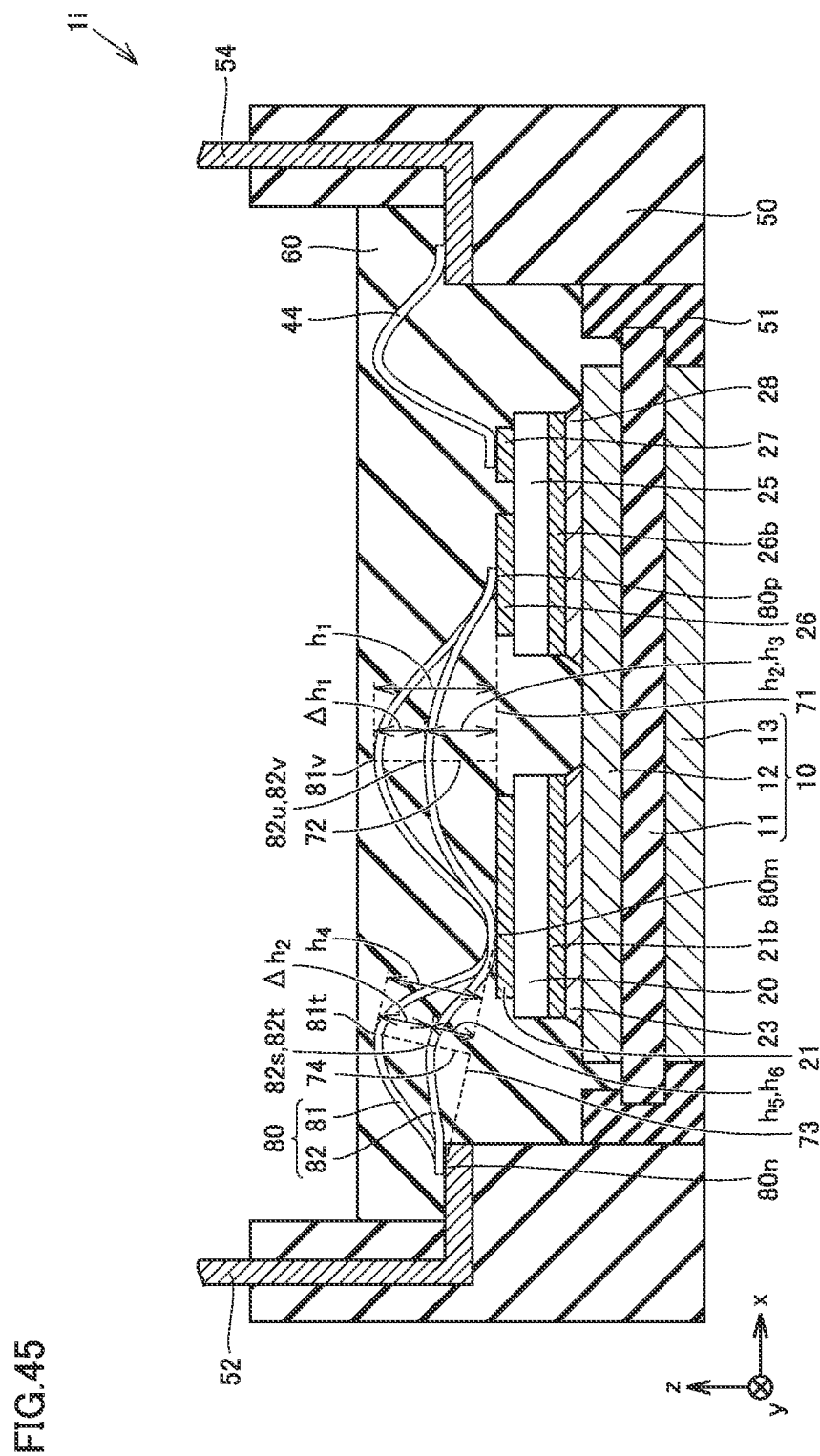
FIG. 45 is a schematic cross-sectional view along the line XLV-XLV shown in FIG. 44, of the power module according to the fourth embodiment.

As shown in FIGS. 44 and 45, first lead terminal 52 and first front electrode 21 of first semiconductor element 20 are electrically connected to each other through first conductive wire group 80. First front electrode 21 is spaced away from first lead terminal 52 in the first direction (the x direction). First conductive wire group 80 includes bonded portion 80n bonded to first lead terminal 52 and bonded portion 80m bonded to first front electrode 21 of first semiconductor element 20.

In the second plan view in the third direction (the z direction), first conductive wire 81 and second conductive wire 82 adjacent to each other are spaced away from each other by at least the minimum gap, between bonded portion 80n and bonded portion 80m. In bonded portion 80n, first conductive wire 81 and second conductive wire 82 may be arranged at pitch p in the second direction (the y direction). In bonded portion 80m, first conductive wire 81 and second conductive wire 82 may be arranged at pitch p in the second direction (the y direction). Therefore, more first conductive wires 81 and second conductive wires 82 can be bonded to first lead terminal 52 and first front electrode 21 while the gap between first conductive wire 81 and second conductive wire 82 adjacent to each other is widened as much as possible. Pitch p in bonded portion 80n may be equal to or different from pitch p in bonded portion 80m.

The minimum gap between first conductive wire 81 and second conductive wire 82, between bonded portion 80n and bonded portion 80m, may be equal to or different from minimum gap g between first conductive wire 81 and second conductive wire 82, between bonded portion 80m and bonded portion 80p.

Pitch p is, for example, at most 4.0 times as large as the diameter of each of first conductive wire 81 and second conductive wire 82. Therefore, the number of first conductive wires 81 and second conductive wires 82 can be increased and a higher current can flow between first lead terminal 52 and first front electrode 21 of first semiconductor element 20 through first conductive wire group 80. Pitch p is, for example, at least 1.5 time as large as the diameter of each of first conductive wire 81 and second conductive wire 82.

As shown in FIGS. 44 and 45, second lead terminal 53 and first conductive layer 12 are electrically connected to each other through second conductive wire group 85. First conductive layer 12 is spaced away from second lead terminal 53 in the first direction (the x direction). Second conductive wire group 85 includes bonded portion 85n bonded to second lead terminal 53 and bonded portion 85m bonded to first conductive layer 12.

In the second plan view in the third direction (the z direction), first conductive wire 86 and second conductive wire 87 adjacent to each other are spaced away from each other by at least the minimum gap, between bonded portion 85n and bonded portion 85m. In bonded portion 85n, first conductive wire 86 and second conductive wire 87 may be arranged at pitch p in the second direction (the y direction). In bonded portion 85m, first conductive wire 86 and second conductive wire 87 may be arranged at pitch p in the second direction (the y direction). Therefore, more first conductive wires 86 and second conductive wires 87 can be bonded to second lead terminal 53 and first conductive layer 12 while the gap between first conductive wire 86 and second conductive wire 87 adjacent to each other is widened as much as possible. Pitch p in bonded portion 85n may be equal to or different from pitch p in bonded portion 85m.

The minimum gap between first conductive wire 86 and second conductive wire 87, between bonded portion 85n and bonded portion 85m may be equal to or different from minimum gap g between first conductive wire 81 and second conductive wire 82, between bonded portion 80m and bonded portion 80p. The minimum gap between first conductive wire 86 and second conductive wire 87, between bonded portion 85n and bonded portion 85m, may be equal to or different from the minimum gap between first conductive wire 81 and second conductive wire 82, between bonded portion 80n and bonded portion 80m.

Pitch p is, for example, at most 4.0 times as large as the diameter of each of first conductive wire 86 and second conductive wire 87. Therefore, the number of first conductive wires 86 and second conductive wires 87 can be increased and a higher current can flow between first conductive layer 12 and second lead terminal 53 through second conductive wire group 85. Pitch p is, for example, at least 1.5 time as large as the diameter of each of first conductive wire 86 and second conductive wire 87.

Figure 48:
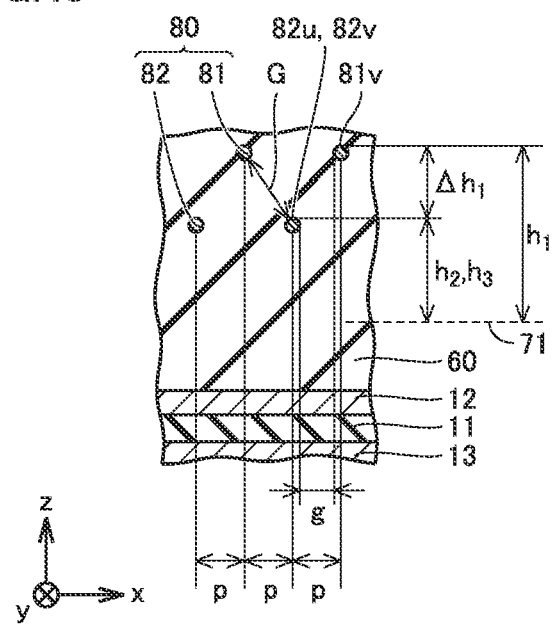
FIG. 48 is a partially enlarged schematic cross-sectional view along the line XLVIII-XLVIII shown in FIG. 47, of the power module according to the fourth embodiment.

As shown in FIGS. 45 and 48, in the first plan view in the second direction (the y direction), a first height $h_1$ of a first top 81v of first conductive wire 81 from a first line 71 that connects bonded portion 80m and bonded portion 80p to each other is larger than a second height $h_2$ of a first portion 82u of second conductive wire 82 from first line 71. First top 81v of first conductive wire 81 is a portion of first conductive wire 81 most distant from first line 71. First portion 82u of second conductive wire 82 is a portion of second conductive wire 82 on a second line 72 that passes through first top 81v and is perpendicular to first line 71 in the first plan view in the second direction (the y direction). A difference $\Delta h_1$ between first height $h_1$ and second height $h_2$ is at least 2.0 times and at most 5.0 times as large as the diameter of each of first conductive wire 81 and second conductive wire 82. Difference $\Delta h_1$ is at least six times and at most sixty times as large as a maximum diameter of a filler.

In the present embodiment, in the first plan view in the second direction (the y direction), a third height $h_3$ of a second top 82v from first line 71 is smaller than first height $h_1$. Second top 82v of second conductive wire 82 is a portion of second conductive wire 82 most distant from first line 71. First portion 82u of second conductive wire 82 is second top 82v of second conductive wire 82 with respect to first line 71.

In bonded portion 80m and bonded portion 80p, first conductive wire 81 stands up from first line 71 more steeply than second conductive wire 82. In the first plan view in the second direction (the y direction), a first intermediate portion of first conductive wire 81 is generally more distant from first line 71 than a second intermediate portion of second conductive wire 82. In the first plan view in the second direction (the y direction), the first intermediate portion of first conductive wire 81 is generally higher than the second intermediate portion of second conductive wire 82. In the first plan view in the second direction (the y direction), the first intermediate portion of first conductive wire 81 does not intersect with the second intermediate portion of second conductive wire 82. The first intermediate portion is a portion of first conductive wire 81 between bonded portion 80m and bonded portion 80p. The second intermediate portion is a portion of second conductive wire 82 between bonded portion 80m and bonded portion 80p.

First conductive wire 81 is longer than second conductive wire 82 between bonded portion 80m and bonded portion 80p. In a direction along first line 71, first top 81v of first conductive wire 81 is located at a position the same as second top 82v of second conductive wire 82. In a modification of the present embodiment, in the first plan view in the second direction (the y direction), first top 81v of first conductive wire 81 may be displaced from second top 82v of second conductive wire 82 in the direction along first line 71.

As shown in FIG. 45, in the first plan view in the second direction (the y direction), a first height $h_4$ of a first top 81t of first conductive wire 81 from a first line 73 that connects bonded portion 80n and bonded portion 80m to each other is larger than a second height $h_5$ of a first portion 82s of second conductive wire 82 from first line 73. First top 81t of first conductive wire 81 is a portion of first conductive wire 81 most distant from first line 73. First portion 82s of second conductive wire 82 is a portion of second conductive wire 82 on a second line 74 that passes through first top 81t and is perpendicular to first line 73 in the first plan view in the second direction (the y direction). A difference $\Delta h_2$ between first height $h_4$ and second height $h_5$ is at least 2.0 times and at most 5.0 times as large as the diameter of each of first conductive wire 81 and second conductive wire 82. Difference $\Delta h_2$ is at least six times and at most sixty times as large as the maximum diameter of the filler.

In the present embodiment, in the first plan view in the second direction (the y direction), a third height $h_6$ of a second top 82t from first line 73 is smaller than first height $h_4$. Second top 82t of second conductive wire 82 is a portion of second conductive wire 82 most distant from first line 73. First portion 82s of second conductive wire 82 is second top 82t of second conductive wire 82 with respect to first line 73.

In bonded portion 80n and bonded portion 80m, first conductive wire 81 stands up from first line 73 more steeply than second conductive wire 82. In the first plan view in the second direction (the y direction), a third intermediate portion of first conductive wire 81 is generally more distant from first line 73 than a fourth intermediate portion of second conductive wire 82. In the first plan view in the second direction (the y direction), the third intermediate portion of first conductive wire 81 is generally higher than the fourth intermediate portion of second conductive wire 82. In the first plan view in the second direction (the y direction), the third intermediate portion of first conductive wire 81 does not intersect with the fourth intermediate portion of second conductive wire 82. The third intermediate portion is a portion of first conductive wire 81 between bonded portion 80n and bonded portion 80m. The fourth intermediate portion is a portion of second conductive wire 82 between bonded portion 80n and bonded portion 80m.

First conductive wire 81 is longer than second conductive wire 82 between bonded portion 80n and bonded portion 80m. In a direction along first line 73, first top 81t of first conductive wire 81 is located at a position the same as second top 82t of second conductive wire 82. In a modification of the present embodiment, in the first plan view in the second direction (the y direction), first top 81t of first conductive wire 81 may be displaced from second top 82t of second conductive wire 82 in the direction along first line 73.

Second conductive wire group 85 may be similar in configuration to first conductive wire group 80 that connects first lead terminal 52 and first front electrode 21 of first semiconductor element 20 to each other.

Figure 47:
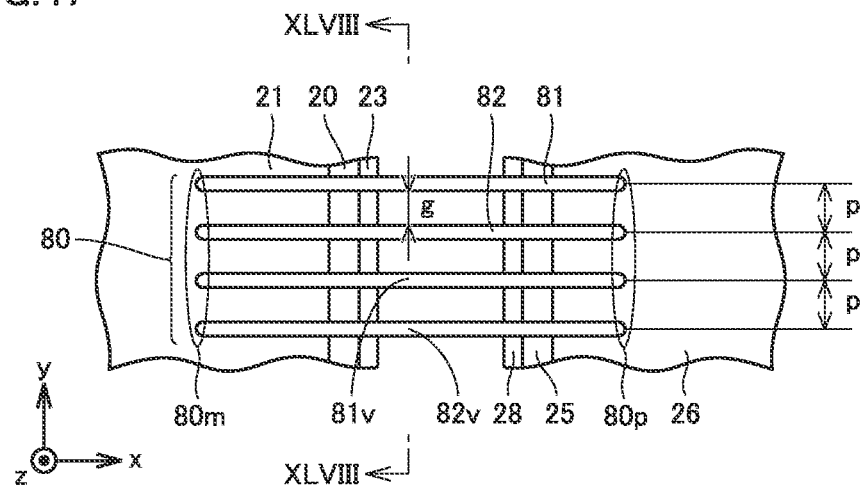
FIG. 47 is a partially enlarged schematic plan view of the power module according to the fourth embodiment.

A function of first conductive wire group 80 that connects first front electrode 21 of first semiconductor element 20 and second front electrode 26 of second semiconductor element 25 to each other will be described with reference to FIGS. 45, 47, and 48. Difference $\Delta h_1$ between first height $h_1$ and second height $h_2$ is larger than minimum gap g between first conductive wire 81 and second conductive wire 82 adjacent to each other, between the first bonded portion and the second bonded portion in the second plan view in the third direction (the z direction). Therefore, a gap G between first conductive wire 81 and second conductive wire 82 is widened. First conductive wire 81 and second conductive wire 82 are alternately arranged in the second direction (the y direction). Gap G between first conductive wire 81 and second conductive wire 82 can efficiently be widened without increasing minimum gap g. Air bubbles that were introduced in sealing member 60 in providing sealing member 60 and remain below first conductive wire 81 and second conductive wire 82 readily pass through gap G between first conductive wire 81 and second conductive wire 82 adjacent to each other and escape to the outside of sealing member 60. Gap G is, for example, not smaller than 1.05 mm. Gap G may be not smaller than 1.10 mm or 1.20 mm.

Figure 49:
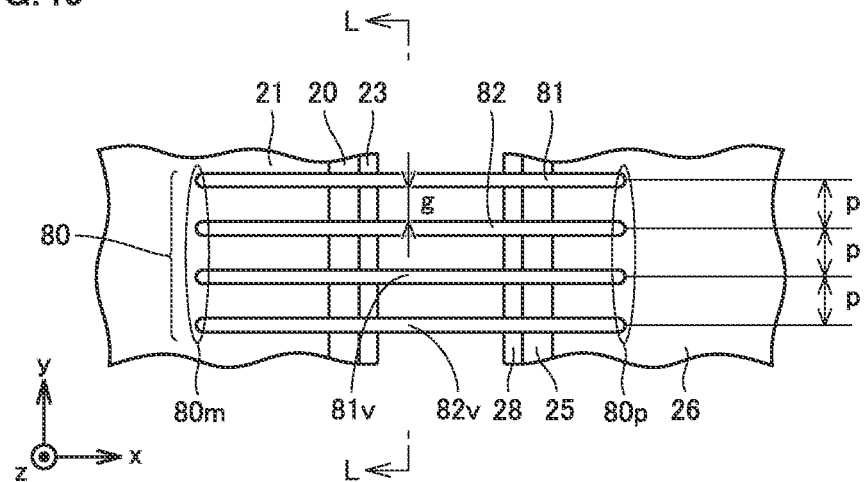
FIG. 49 is a partially enlarged schematic plan view of a power module according to a comparative example.
Figure 50:
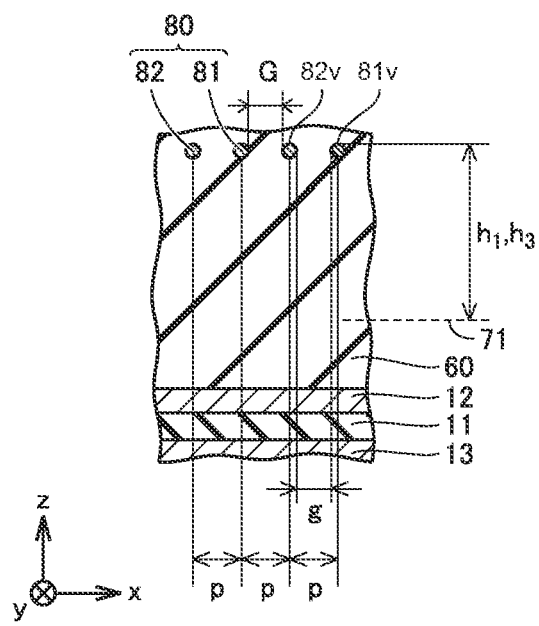
FIG. 50 is a partially enlarged schematic cross-sectional view along the line L-L shown in FIG. 49, of the power module according to the comparative example.

In contrast, in a power module in a comparative example shown in FIGS. 49 and 50, first top 81v of first conductive wire 81 and second top 82v of second conductive wire 82 are located at the same height and at the same position in the first direction (the x direction). In the power module in the comparative example, a gap between first conductive wire 81 and second conductive wire 82 adjacent to each other is narrower than in power module 1i in the present embodiment. Therefore, air bubbles that were introduced in sealing member 60 in providing sealing member 60 may remain in sealing member 60 below first conductive wire 81 and second conductive wire 82. Such air bubbles lower insulating performance of sealing member 60 and reliability of power module 1i.

First conductive wire group 80 that connects first lead terminal 52 and first front electrode 21 of first semiconductor element 20 to each other is also similar in function to first conductive wire group 80 that connects first front electrode 21 of first semiconductor element 20 and second front electrode 26 of second semiconductor element 25 to each other. Second conductive wire group 85 may also be similar in function to first conductive wire group 80 that connects first lead terminal 52 and first front electrode 21 of first semiconductor element 20 to each other.

A method of manufacturing power module 1i in the fourth embodiment will be described with reference to FIGS. 44 to 46 and 51 to 54.

Figure 51:
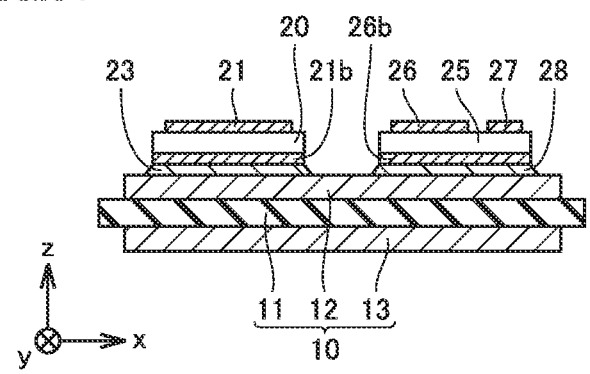
FIG. 51 is a schematic cross-sectional view showing one step in a method of manufacturing a power module according to the fourth embodiment.

As shown in FIG. 51, the method of manufacturing power module 1i in the present embodiment includes mounting first semiconductor element 20 and second semiconductor element 25 on circuit substrate 10. Specifically, first conductive layer 12 is bonded to the first main surface of insulating substrate 11 and second conductive layer 13 is bonded to the second main surface of insulating substrate 11. Circuit substrate 10 is thus prepared. Then, first semiconductor element 20 and second semiconductor element 25 are mounted on circuit substrate 10 by means of first conductive joint member 23 and second conductive joint member 28. For example, when first conductive joint member 23 and second conductive joint member 28 are solder, first semiconductor element 20 and second semiconductor element 25 are soldered to first conductive layer 12 of circuit substrate 10 by reflow soldering.

Figure 52:
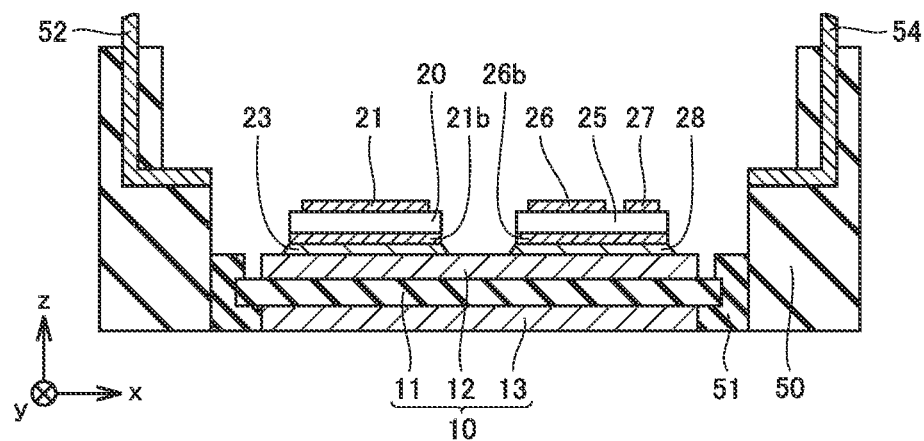
FIG. 52 is a schematic cross-sectional view showing a step next to the step shown in FIG. 51, in the method of manufacturing a power module according to the fourth embodiment.

As shown in FIG. 52, the method of manufacturing power module 1i in the present embodiment includes attaching circuit substrate 10 to case 50. For example, circuit substrate 10 is joined to case 50 with joint member 51 such as a silicone resin adhesive.

Figure 53:
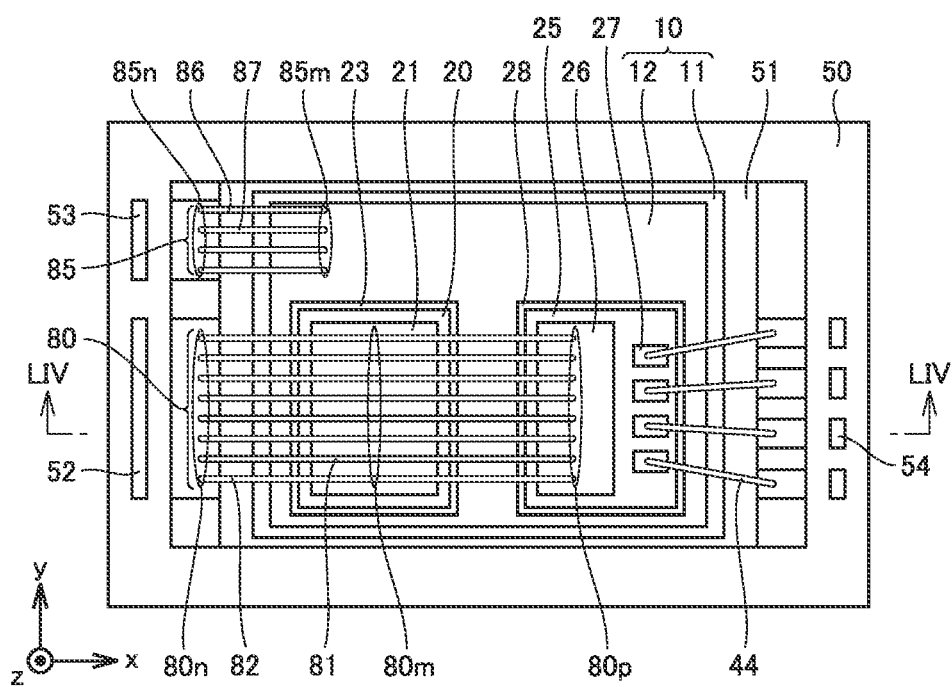
FIG. 53 is a schematic plan view showing a step next to the step shown in FIG. 52, in the method of manufacturing a power module according to the fourth embodiment.
Figure 54:
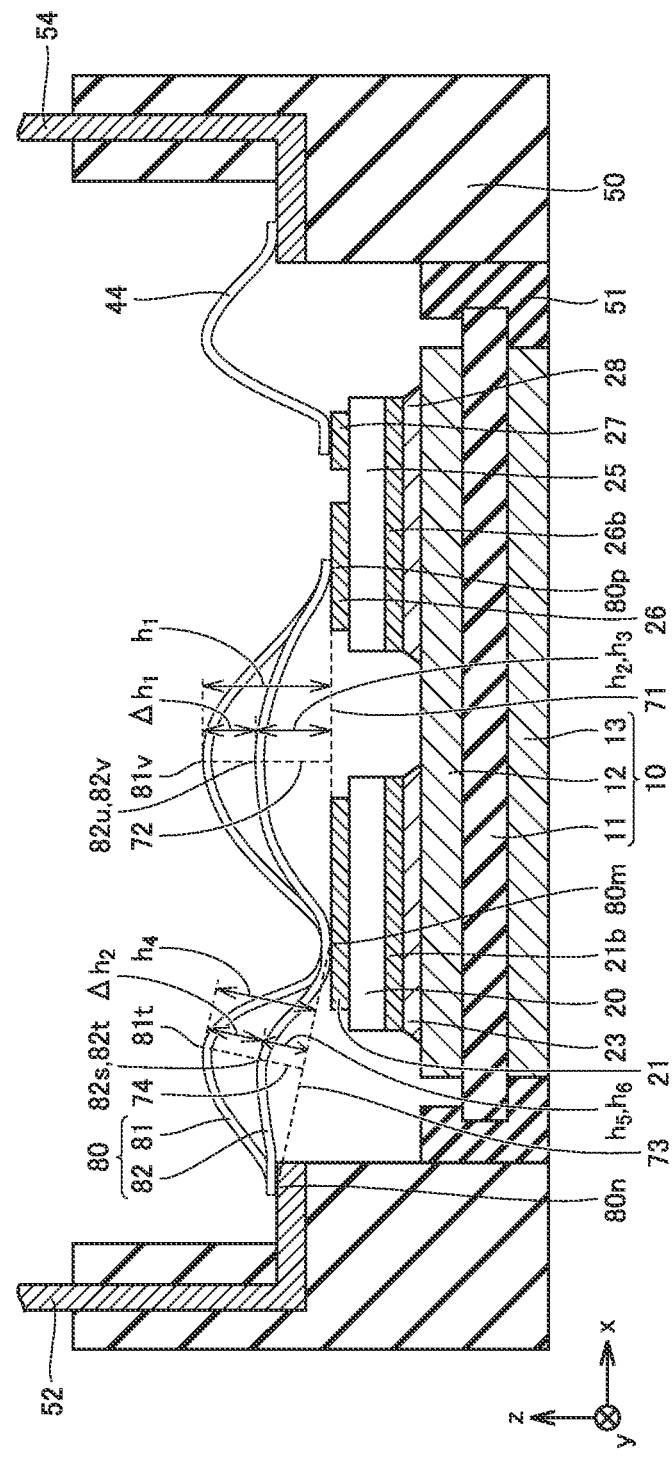
FIG. 54 is a schematic cross-sectional view along the line LIV-LIV, of the step shown in FIG. 53 in the method of manufacturing a power module according to the fourth embodiment.
Figure 55:
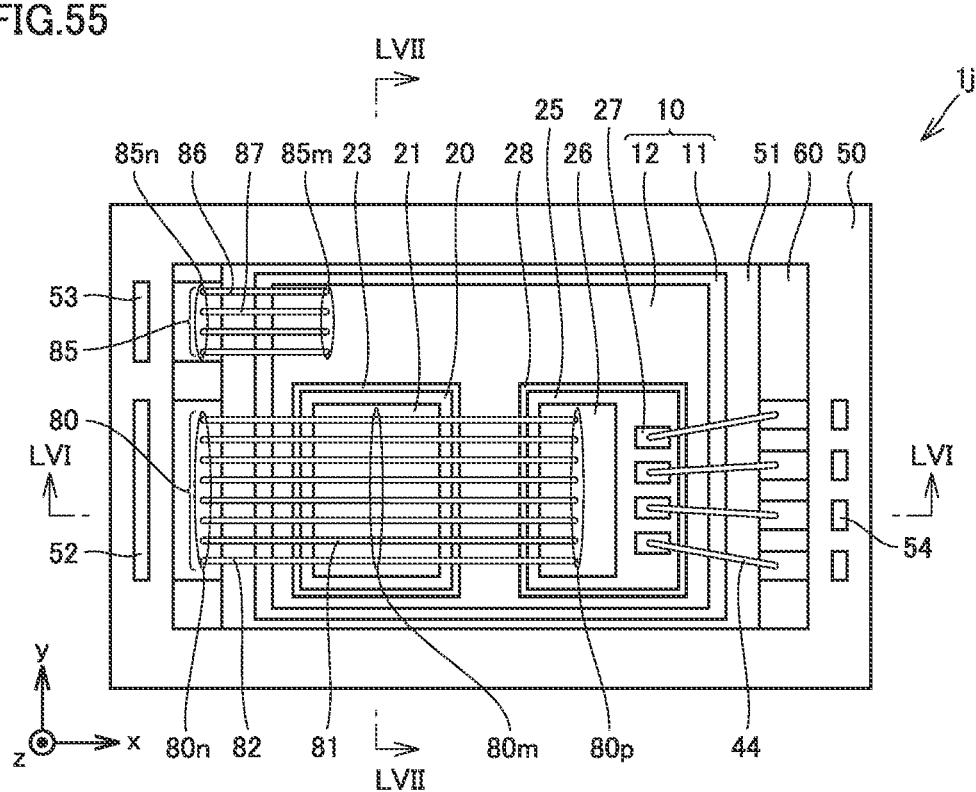
FIG. 55 is a schematic plan view of a power module according to a fifth embodiment.

As shown in FIGS. 53 and 54, the method of manufacturing power module 1i in the present embodiment includes electrically connecting first front electrode 21 of first semiconductor element 20 and second front electrode 26 of second semiconductor element 25 to each other through first conductive wire group 80. Second front electrode 26 is spaced away from first front electrode 21 in the first direction (the x direction). First conductive wire group 80 is constituted of first conductive wire 81 and second conductive wire 82 alternately arranged in the second direction (the y direction) intersecting with the first direction (the x direction). First conductive wire group 80 includes bonded portion 80m bonded to first front electrode 21 of first semiconductor element 20 and bonded portion 80p bonded to second front electrode 26. Specifically, first conductive wire 81 and second conductive wire 82 are bonded to first front electrode 21 in bonded portion 80m and bonded to second front electrode 26 in bonded portion 80p with a wire bonder (not shown).

Difference $\Delta h_1$ between first height $h_1$ and second height $h_2$ is larger than minimum gap g between first conductive wire 81 and second conductive wire 82 adjacent to each other, between bonded portion 80m and bonded portion 80p in the second plan view in the third direction (the z direction). First height $h_1$ refers to the first height of first top 81v of first conductive wire 81 from first line 71 that connects bonded portion 80m and bonded portion 80p to each other in the first plan view in the second direction (the y direction). Second height $h_2$ refers to a height of first portion 82u of second conductive wire 82 from first line 71 in the first plan view in the second direction (the y direction). First portion 82u is the portion of second conductive wire 82 on second line 72 that passes through first top 81v and is perpendicular to first line 71 in the first plan view in the second direction (the y direction).

In the first plan view in the second direction (the y direction), first height $h_1$ of first top 81v of first conductive wire 81 from first line 71 is larger than second height $h_2$ of first portion 82u of second conductive wire 82 from first line 71. Difference $\Delta h_1$ between first height $h_1$ and second height $h_2$ is at least 2.0 times and at most 5.0 times as large as the diameter of each of first conductive wire 81 and second conductive wire 82. Difference $\Delta h_1$ is at least six times and at most sixty times as large as the maximum diameter of the filler.

In the first plan view in the second direction (the y direction), third height $h_3$ of second top 82v from first line 71 is smaller than first height $h_1$. First portion 82u of second conductive wire 82 is second top 82v of second conductive wire 82 with respect to first line 71.

In bonded portion 80m and bonded portion 80p, first conductive wire 81 stands up from first line 71 more steeply than second conductive wire 82. In the first plan view in the second direction (the y direction), the first intermediate portion of first conductive wire 81 is generally more distant from first line 71 than the second intermediate portion of second conductive wire 82. In the first plan view in the second direction (the y direction), the first intermediate portion of first conductive wire 81 is generally higher than the second intermediate portion of second conductive wire 82. In the first plan view in the second direction (the y direction), the first intermediate portion of first conductive wire 81 does not intersect with the second intermediate portion of second conductive wire 82. The first intermediate portion is the portion of first conductive wire 81 between bonded portion 80m and bonded portion 80p. The second intermediate portion is the portion of second conductive wire 82 between bonded portion 80m and bonded portion 80p.

First conductive wire 81 is longer than second conductive wire 82 between bonded portion 80m and bonded portion 80p. In the direction along first line 71, first top 81v of first conductive wire 81 is located at a position the same as second top 82v of second conductive wire 82. In a modification of the present embodiment, in the first plan view in the second direction (the y direction), first top 81v of first conductive wire 81 may be displaced from second top 82v of second conductive wire 82 in the direction along first line 71.

As shown in FIGS. 53 and 54, a method of manufacturing power module 1i in the present embodiment includes electrically connecting first lead terminal 52 and first front electrode 21 of first semiconductor element 20 to each other through first conductive wire group 80. First front electrode 21 is spaced away from first lead terminal 52 in the first direction (the x direction). First conductive wire group 80 is constituted of first conductive wire 81 and second conductive wire 82 alternately arranged in the second direction (the y direction) intersecting with the first direction (the x direction). First conductive wire group 80 includes bonded portion 80n bonded to first lead terminal 52 and bonded portion 80m bonded to first front electrode 21 of first semiconductor element 20. Specifically, first conductive wire 81 and second conductive wire 82 are bonded to first lead terminal 52 in bonded portion 80n and bonded to first front electrode 21 in bonded portion 80m with a wire bonder (not shown).

Difference $\Delta h_2$ between first height $h_4$ and second height $h_5$ is larger than the minimum gap between first conductive wire 81 and second conductive wire 82 adjacent to each other, between bonded portion 80n and bonded portion 80m in the second plan view in the third direction (the z direction). First height $h_4$ refers to a height of first top 81t of first conductive wire 81 from first line 73 that connects bonded portion 80n and bonded portion 80m to each other in the first plan view in the second direction (the y direction). Second height $h_5$ refers to a height of first portion 82s of second conductive wire 82 from first line 73 in the first plan view in the second direction (the y direction). First portion 82s is a portion of second conductive wire 82 on second line 74 that passes through first top 81t and is perpendicular to first line 73 in the first plan view in the second direction (the y direction).

In the first plan view in the second direction (the y direction), first height $h_4$ of first top 81t of first conductive wire 81 from first line 73 is larger than second height $h_5$ of first portion 82s of second conductive wire 82 from first line 73. Difference $\Delta h_2$ between first height $h_4$ and second height $h_5$ is at least 2.0 times and at most 5.0 times as large as the diameter of each of first conductive wire 81 and second conductive wire 82. Difference $\Delta h_2$ is at least six times and at most sixty times as large as the maximum diameter of the filler.

In the first plan view in the second direction (the y direction), third height $h_6$ of second top 82t from first line 73 is smaller than first height $h_4$. First portion 82s of second conductive wire 82 is second top 82t of second conductive wire 82 with respect to first line 73.

In bonded portion 80n and bonded portion 80m, first conductive wire 81 stands up from first line 73 more steeply than second conductive wire 82. In the first plan view in the second direction (the y direction), the third intermediate portion of first conductive wire 81 is generally more distant from first line 73 than the fourth intermediate portion of second conductive wire 82. In the first plan view in the second direction (the y direction), the third intermediate portion of first conductive wire 81 is generally higher than the fourth intermediate portion of second conductive wire 82. In the first plan view in the second direction (the y direction), the third intermediate portion of first conductive wire 81 does not intersect with the fourth intermediate portion of second conductive wire 82. The third intermediate portion is a portion of first conductive wire 81 between bonded portion 80n and bonded portion 80m. The fourth intermediate portion is a portion of second conductive wire 82 between bonded portion 80n and bonded portion 80m.

First conductive wire 81 is longer than second conductive wire 82 between bonded portion 80n and bonded portion 80m. In the direction along first line 73, first top 81t of first conductive wire 81 is located at a position the same as second top 82t of second conductive wire 82. In a modification of the present embodiment, in the first plan view in the second direction (the y direction), first top 81t of first conductive wire 81 may be displaced from second top 82t of second conductive wire 82 in the direction along first line 73.

As shown in FIGS. 53 and 54, the method of manufacturing power module 1i in the present embodiment includes electrically connecting second lead terminal 53 and first conductive layer 12 to each other through second conductive wire group 85. First conductive layer 12 is spaced away from second lead terminal 53 in the first direction (the x direction). Second conductive wire group 85 is constituted of first conductive wire 86 and second conductive wire 87 alternately arranged in the second direction (the y direction) intersecting with the first direction (the x direction). Second conductive wire group 85 includes bonded portion 85n bonded to second lead terminal 53 and bonded portion 85m bonded to first conductive layer 12. Specifically, first conductive wire 86 and second conductive wire 87 are bonded to second lead terminal 53 in bonded portion 85n and bonded to first conductive layer 12 in bonded portion 85m with a wire bonder (not shown). Second conductive wire group 85 may be similar in configuration to first conductive wire group 80 that connects first lead terminal 52 and first front electrode 21 of first semiconductor element 20 to each other.

As shown in FIGS. 53 and 54, the method of manufacturing power module 1i in the present embodiment includes electrically connecting third front electrode 27 of second semiconductor element 25 and third lead terminal 54 to each other through the plurality of third conductive wires 44. Specifically, the plurality of third conductive wires 44 are bonded to third front electrode 27 of second semiconductor element 25 and third lead terminal 54 with a wire bonder (not shown). A step of bonding the plurality of first conductive wire groups 80, the plurality of second conductive wire groups 85, and the plurality of third conductive wires 44 may be performed before the step of attaching circuit substrate 10 to case 50.

Figure 46:
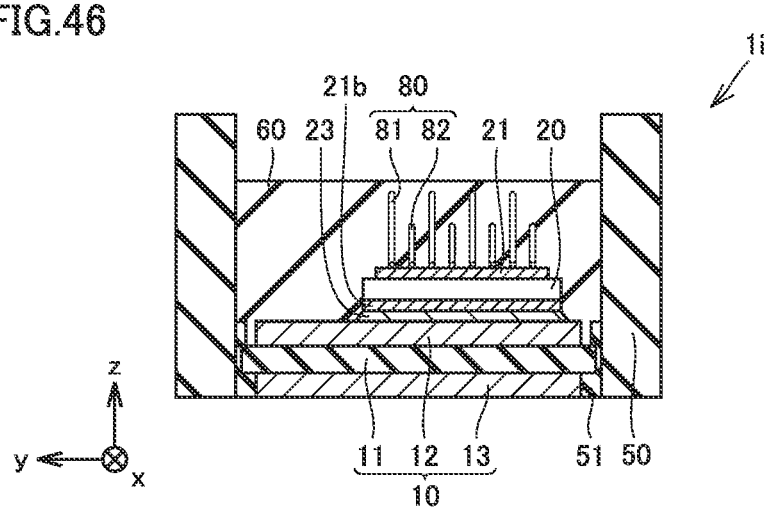
FIG. 46 is a schematic cross-sectional view along the line XLVI-XLVI shown in FIG. 44, of the power module according to the fourth embodiment.

The method of manufacturing power module 1i in the present embodiment includes sealing first semiconductor element 20, second semiconductor element 25, a part of first lead terminal 52, a part of second lead terminal 53, a part of third lead terminal 54, first conductive wire group 80, second conductive wire group 85, and the plurality of third conductive wires 44 with sealing member 60. Power module 1i shown in FIGS. 44 to 46 is thus obtained.

In a first example of the step of sealing with sealing member 60, for example, a sealing material is held in a pressure-reduced atmosphere at 500 Pa and defoamed. An insulating resin that can directly be potted such as an epoxy resin or a silicone resin is adopted as the sealing material. The sealing material is supplied into case 50 by direct potting. The insulating resin that can directly be potted has a viscosity, for example, not lower than 5 Pa·S. The insulating resin that can directly be potted has a viscosity, for example, not lower than 7 Pa·S. The insulating resin that can directly be potted has a viscosity, for example, not lower than 10 Pa·S. The insulating resin that can directly be potted has a viscosity, for example, not higher than 30 Pa·S. As a viscosity of the sealing material is higher, air bubbles are more likely to be introduced in the sealing material in providing sealing member 60 and air bubbles are less likely to escape from the sealing material. A viscosity of the insulating resin herein is measured at a temperature not lower than 40° C. and not higher than 90° C.

Then, the sealing material is heated at a temperature, for example, not lower than 40° C. and not higher than 90° C. The heated sealing material is supplied into case 50 and provided in case 50. The sealing material is defoamed. For example, the sealing material may be defoamed by being held in a pressure-reduced atmosphere. Specifically, case 50 containing the sealing material is held in the reduced-pressure atmosphere, for example, not lower than 700 Pa and not higher than 1500 Pa. In another example, the sealing material may be defoamed by being vibrated. In one example, case 50 containing the sealing material is vibrated. The sealing material is vibrated at a frequency, for example, not lower than 10 Hz and not higher than 1 kHz. Then, the sealing material is cured. Sealing member 60 is thus provided.

In a second example of the step of sealing with sealing member 60, sealing member 60 is provided by transfer molding without using case 50. Specifically, the sealing material is held in a pressure-reduced atmosphere, for example, at 500 Pa and defoamed. Circuit substrate 10 on which first semiconductor element 20 and second semiconductor element 25 are mounted, a part of first lead terminal 52, a part of second lead terminal 53, a part of third lead terminal 54, the plurality of first conductive wire groups 80, the plurality of second conductive wire groups 85, and the plurality of third conductive wires 44 are set in a mold. The sealing material is injected into the mold. An insulating resin lower in viscosity than the insulating resin that can directly be potted is adopted as the sealing material. The sealing material has a viscosity, for example, not lower than 0.2 Pa·S. The sealing material has a viscosity, for example, not higher than 2.0 Pa·S. The sealing material is, for example, silicone gel. As in the first example, the sealing material is cured by being defoamed. Sealing member 60 is thus provided.

Though power module 1$i$ in the present embodiment includes two semiconductor elements (first semiconductor element 20 and second semiconductor element 25), it may include at least one semiconductor element. For example, though power module 1$i$ in the present embodiment is a 1-in-1 type power module 1$i$ including a pair of a diode (first semiconductor element 20) and an IGBT (second semiconductor element 25), it may be a 2-in-1 type power module 1$i$ including two pairs of a diode (first semiconductor element 20) and an IGBT (second semiconductor element 25) or a 6-in-1 type power module 1$i$ including six pairs of a diode (first semiconductor element 20) and an IGBT (second semiconductor element 25).

Effects of power module 1$i$ and a method of manufacturing the same in the present embodiment will be described.

Power module 1$i$ in the present embodiment includes a first conductive member (first front electrode 21; first lead terminal 52), a second conductive member (second front electrode 26; first front electrode 21) spaced away from the first conductive member in the first direction (the x direction), a conductive wire group (first conductive wire group 80) that electrically connects the first conductive member and the second conductive member to each other, and sealing member 60 that seals at least a part of the first conductive member, at least a part of the second conductive member, and the conductive wire group. The conductive wire group is constituted of first conductive wire 81 and second conductive wire 82 alternately arranged in the second direction (the y direction) intersecting with the first direction. The conductive wire group includes a first bonded portion (bonded portion 80$m$; bonded portion 80$n$) bonded to the first conductive member and a second bonded portion (bonded portion 80$p$; bonded portion 80$m$) bonded to the second conductive member. In the first plan view in the second direction, first height $h_1$ or $h_4$ of first top 81$v$ or 81$t$ of first conductive wire 81 from first line 71 or 73 that connects the first bonded portion and the second bonded portion to each other is larger than second height $h_2$ or $h_5$ of first portion 82$u$ or 82$s$ of second conductive wire 82 from first line 71 or 73. First portion 82$u$ or 82$s$ is a portion of second conductive wire 82 on second line 72 or 74 that passes through first top 81$v$ or 81$t$ and is perpendicular to first line 71 or 73 in the first plan view. Difference $\Delta h_1$ or $\Delta h_2$ between first height $h_1$ or $h_4$ and second height $h_2$ or $h_5$ is larger than the minimum gap between first conductive wire 81 and second conductive wire 82 adjacent to each other, between the first bonded portion (bonded portion 80$m$; bonded portion 80$n$) and the second bonded portion (bonded portion 80$p$; bonded portion 80$m$) in the second plan view in the third direction (the z direction) perpendicular to the first direction and the second direction.

The method of manufacturing power module 1$i$ in the present embodiment includes electrically connecting the first conductive member (first front electrode 21; first lead terminal 52) and the second conductive member (second front electrode 26; first front electrode 21) spaced away from the first conductive member in the first direction (the x direction) to each other through the conductive wire group (first conductive wire group 80; first conductive wire group 80). The conductive wire group is constituted of first conductive wire 81 and second conductive wire 82 alternately arranged in the second direction (the y direction) intersecting with the first direction. The method of manufacturing power module 1$i$ in the present embodiment includes sealing at least a part of the first conductive member, at least a part of the second conductive member, and the conductive wire group with sealing member 60. The conductive wire group includes a first bonded portion (bonded portion 80$m$; bonded portion 80$n$) bonded to the first conductive member and a second bonded portion (bonded portion 80$p$; bonded portion 80$m$) bonded to the second conductive member. In the first plan view in the second direction, first height $h_1$ or $h_4$ of first top 81$v$ or 81$t$ of first conductive wire 81 from first line 71 or 73 that connects the first bonded portion and the second bonded portion to each other is larger than second height $h_2$ or $h_5$ of first portion 82$u$ or 82$s$ of second conductive wire 82 from first line 71 or 73. First portion 82$u$ or 82$s$ is a portion of second conductive wire 82 on second line 72 or 74 that passes through first top 81$v$ or 81$t$ and is perpendicular to first line 71 or 73 in the first plan view. Difference $\Delta h_1$ or $\Delta h_2$ between first height $h_1$ or $h_4$ and second height $h_2$ or $h_5$ is larger than the minimum gap between first conductive wire 81 and second conductive wire 82 adjacent to each other, between the first bonded portion and the second bonded portion in the second plan view in the third direction (the z direction) perpendicular to the first direction and the second direction.

Therefore, a gap (see, for example, gap G in FIG. 48) between first conductive wire 81 and second conductive wire 82 is widened. Furthermore, first conductive wire 81 and second conductive wire 82 are alternately arranged in the second direction (the y direction). The gap between first conductive wire 81 and second conductive wire 82 can efficiently be widened without increasing the minimum gap. Therefore, air bubbles that were introduced in sealing member 60 in providing sealing member 60 and remain below first conductive wire 81 and second conductive wire 82 readily pass through a gap between first conductive wire 81 and second conductive wire 82 adjacent to each other and escape to the outside of sealing member 60. Lowering in insulating performance of sealing member 60 is prevented.

In power module 1$i$ and the method of manufacturing the same in the present embodiment, difference $\Delta h_1$ or $\Delta h_2$ between first height $h_1$ or $h_4$ and second height $h_2$ or $h_5$ is at least 2.0 times and at most 5.0 times as large as the diameter of each of first conductive wire 81 and second conductive wire 82.

Difference $\Delta h_1$ or $\Delta h_2$ between first height $h_1$ or $h_4$ of first top 81$v$ or 81$t$ of first conductive wire 81 and second height $h_2$ or $h_5$ of first portion 82$u$ or 82$s$ of second conductive wire 82 is at least 2.0 times as large as the diameter of each of first conductive wire 81 and second conductive wire 82. A gap (see, for example, gap G in FIG. 48) between first conductive wire 81 and second conductive wire 82 is widened. Furthermore, first conductive wire 81 and second conductive wire 82 are alternately arranged in the second direction (the y direction). The gap between first conductive wire 81 and second conductive wire 82 can efficiently be widened without increasing the minimum gap. Therefore, air bubbles that were introduced in sealing member 60 in providing sealing member 60 and remain below first conductive wire 81 and second conductive wire 82 readily pass through a gap between first conductive wire 81 and second conductive wire 82 adjacent to each other and escape to the outside of sealing member 60. Lowering in insulating performance of sealing member 60 is prevented.

Difference $\Delta h_1$ or $\Delta h_2$ between first height $h_1$ or $h_4$ of first top 81$v$ or 81$t$ of first conductive wire 81 and second height $h_2$ or $h_5$ of first portion 82$u$ or 82$s$ of second conductive wire 82 is at most 5.0 times as large as the diameter of each of first conductive wire 81 and second conductive wire 82. Therefore, electrical isolation between second conductive wire 82 and circuit substrate 10 can be ensured while the entire first conductive wire 81 and the entire second conductive wire 82 are sealed with sealing member 60. Since first conductive wire 81 is not excessively higher in electrical resistance than second conductive wire 82, a current that flows through second conductive wire 82 can be prevented from excessively becoming higher than a current that flows through first conductive wire 81 and break of second conductive wire 82 can be prevented. Power module 1i in the present embodiment is improved in reliability. According to the method of manufacturing power module 1i in the present embodiment, power module 1i improved in reliability is obtained.

In power module 1i and the method of manufacturing the same in the present embodiment, in the first plan view in the second direction (the y direction), third height $h_3$ or $h_6$ of second top 82v or 82t from first line 71 or 73 is smaller than first height $h_1$ or $h_4$. In the first bonded portion (bonded portion 80m; bonded portion 80n) and the second bonded portion (bonded portion 80p; bonded portion 80m), first conductive wire 81 stands up from first line 71 or 73 more steeply than second conductive wire 82. Power module 1i in the present embodiment is improved in reliability. According to the method of manufacturing power module 1i in the present embodiment, power module 1i improved in reliability is obtained.

In power module 1i and the method of manufacturing the same in the present embodiment, first portion 82u or 82s of second conductive wire 82 is second top 82v or 82t of second conductive wire 82 with respect to first line 71 or 73. In the direction along first line 71 or 73, first top 81v or 81t of first conductive wire 81 is located at a position the same as second top 82v or 82t of second conductive wire 82. Power module 1i in the present embodiment is improved in reliability. According to the method of manufacturing power module 1i in the present embodiment, power module 1i improved in reliability is obtained.

In power module 1i and the method of manufacturing the same in the present embodiment, in the first plan view in the second direction (the y direction), first top 81v or 81t of first conductive wire 81 may be displaced from second top 82v or 82t of second conductive wire 82 in the direction along first line 71 or 73. Therefore, difference $\Delta h_1$ or $\Delta h_2$ between first height $h_1$ or $h_4$ and second height $h_2$ or $h_5$ is further larger and a gap between first conductive wire 81 and second conductive wire 82 is further widened. Air bubbles that were introduced in sealing member 60 in providing sealing member 60 and remain below first conductive wire 81 and second conductive wire 82 readily pass through a gap between first conductive wire 81 and second conductive wire 82 adjacent to each other and escape to the outside of sealing member 60. Lowering in insulating performance of sealing member 60 is prevented. Power module 1i in the present embodiment is improved in reliability. According to the method of manufacturing power module 1i in the present embodiment, power module 1i improved in reliability is obtained.

In power module 1i and the method of manufacturing the same in the present embodiment, sealing member 60 contains an insulating resin and a filler dispersed in the insulating resin. Difference $\Delta h_1$ or $\Delta h_2$ between first height $h_1$ or $h_4$ and second height $h_2$ or $h_5$ is at least six times and at most sixty times as large as the maximum diameter of the filler. Therefore, the gap between first conductive wire 81 and second conductive wire 82 is widened. Air bubbles that were introduced in sealing member 60 in providing sealing member 60 and remain below first conductive wire 81 and second conductive wire 82 readily pass through a gap between first conductive wire 81 and second conductive wire 82 adjacent to each other and escape to the outside of sealing member 60. Lowering in insulating performance of sealing member 60 is prevented. Power module 1i in the present embodiment is improved in reliability. According to the method of manufacturing power module 1i in the present embodiment, power module 1i improved in reliability is obtained.

In the method of manufacturing power module 1i in the present embodiment, sealing includes providing the sealing material, defoaming the sealing material, and forming sealing member 60 by curing the sealing material. Therefore, air bubbles remaining in sealing member 60 are suppressed. According to the method of manufacturing power module 1i in the present embodiment, power module 1i improved in reliability is obtained.

Fifth Embodiment

A power module 1j in a fifth embodiment will be described with reference to FIGS. 55 to 59. Power module 1j in the present embodiment is similar in configuration to power module 1i in the fourth embodiment and the method of manufacturing power module 1j in the present embodiment includes steps similar to those in the method of manufacturing power module 1i in the fourth embodiment, and they are mainly different in points below.

Figure 56:
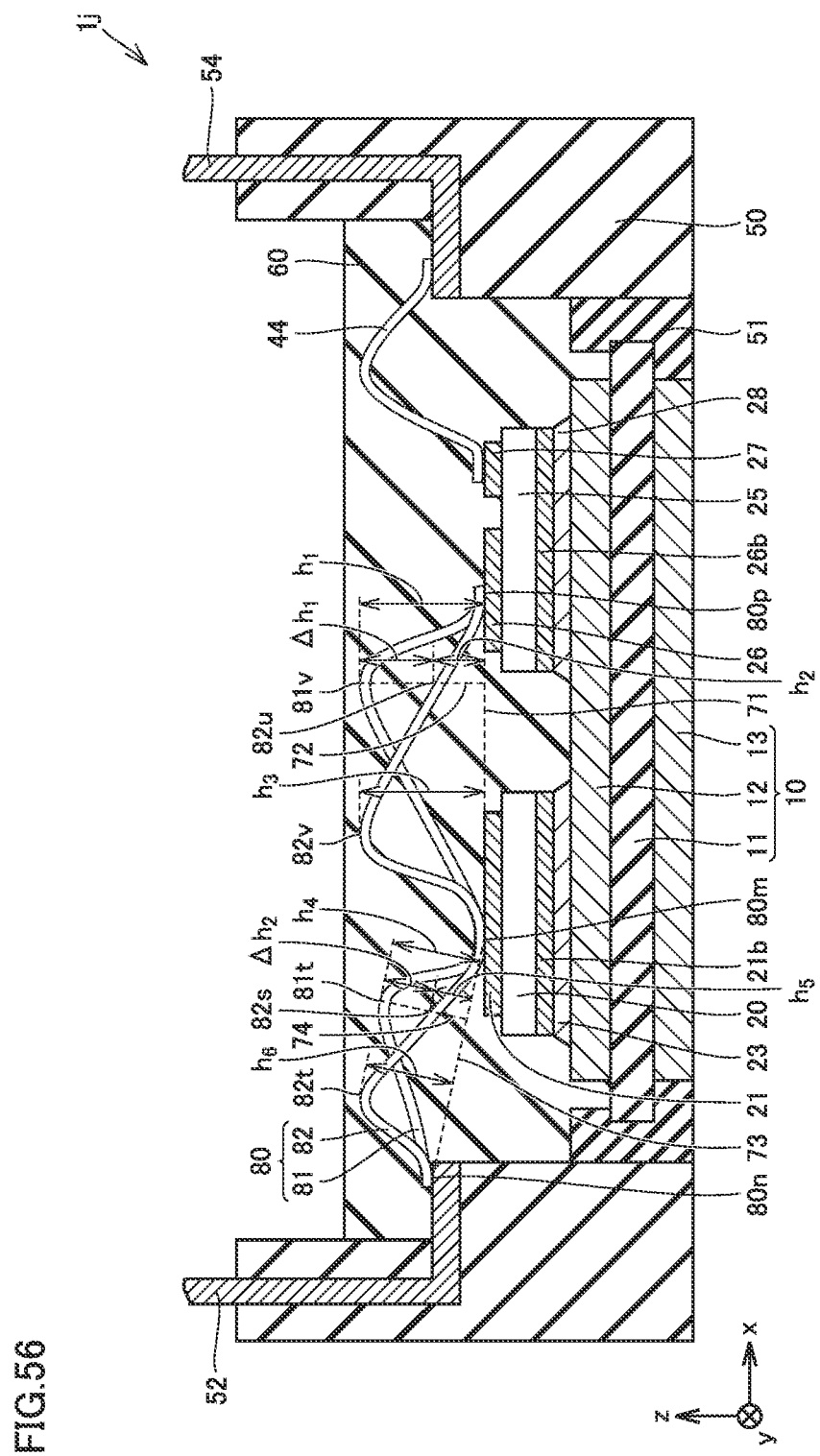
FIG. 56 is a schematic cross-sectional view along the line LVI-LVI shown in FIG. 55, of the power module according to the fifth embodiment.
Figure 57:
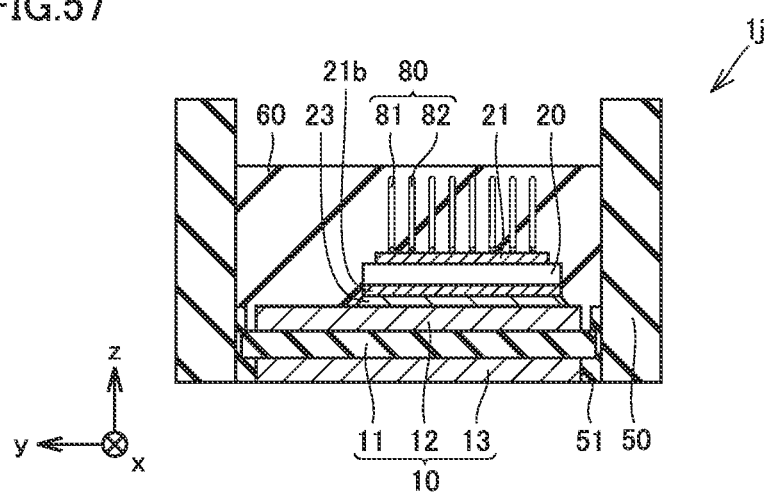
FIG. 57 is a schematic cross-sectional view along the line LVII-LVII shown in FIG. 55, of the power module according to the fifth embodiment.
Figure 58:
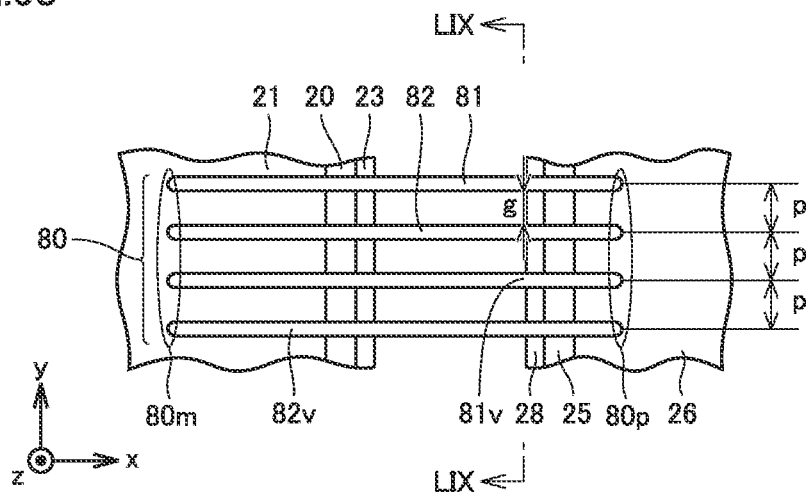
FIG. 58 is a partially enlarged schematic plan view of the power module according to the fifth embodiment.
Figure 59:
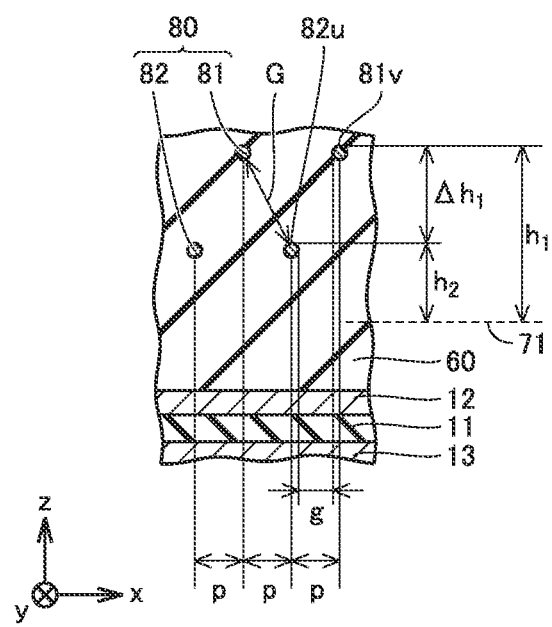
FIG. 59 is a partially enlarged schematic cross-sectional view along the line LIX-LIX shown in FIG. 58, of the power module according to the fifth embodiment.

Referring to FIGS. 56, 58, and 59, in the present embodiment, in the first plan view in the second direction (the y direction), first top 81v of first conductive wire 81 is displaced from second top 82v of second conductive wire 82 in the direction along first line 71. In bonded portion 80m, second conductive wire 82 stands up from first line 71 more steeply than first conductive wire 81. In bonded portion 80p, first conductive wire 81 stands up from first line 71 more steeply than second conductive wire 82. In the first plan view in the second direction (the y direction), the first intermediate portion of first conductive wire 81 intersects with the second intermediate portion of second conductive wire 82. The first intermediate portion is a portion of first conductive wire 81 between bonded portion 80m and bonded portion 80p. Second intermediate portion is a portion of second conductive wire 82 between bonded portion 80m and bonded portion 80p.

First portion 82u of second conductive wire 82 is located between second top 82v of second conductive wire 82 and bonded portion 80p. First conductive wire 81 is equal in length to second conductive wire 82 between bonded portion 80m and bonded portion 80p. A first length of first conductive wire 81 being equal to a second length of second conductive wire 82 herein means that the first length of first conductive wire 81 is not lower than 97% and not higher than 103% of the second length of second conductive wire 82. As shown in FIG. 56, in the first plan view in the second direction (the y direction), third height $h_3$ of second top 82v from first line 71 is equal to first height $h_1$.

Referring to FIG. 56, in the present embodiment, in the first plan view in the second direction (the y direction), first top 81t of first conductive wire 81 is displaced from second top 82t of second conductive wire 82 in the direction along first line 71. In bonded portion 80n, second conductive wire 82 stands up from first line 73 more steeply than first conductive wire 81. In bonded portion 80m, first conductive wire 81 stands up from first line 73 more steeply than second conductive wire 82. In the first plan view in the second direction (the y direction), the third intermediate portion of first conductive wire 81 intersects with the fourth intermediate portion of second conductive wire 82. The third intermediate portion is a portion of first conductive wire 81 between bonded portion 80n and bonded portion 80m. The fourth intermediate portion is a portion of second conductive wire 82 between bonded portion 80n and bonded portion 80m.

First portion 82s of second conductive wire 82 is located between second top 82t of second conductive wire 82 and bonded portion 80m. First conductive wire 81 is equal in length to second conductive wire 82 between bonded portion 80n and bonded portion 80m. As shown in FIG. 56, in the first plan view in the second direction (the y direction), third height $h_6$ of second top 82t from first line 73 is equal to first height $h_4$.

Second conductive wire group 85 may be similar in configuration to first conductive wire group 80 that connects first lead terminal 52 and first front electrode 21 of first semiconductor element 20 to each other.

Figure 60:
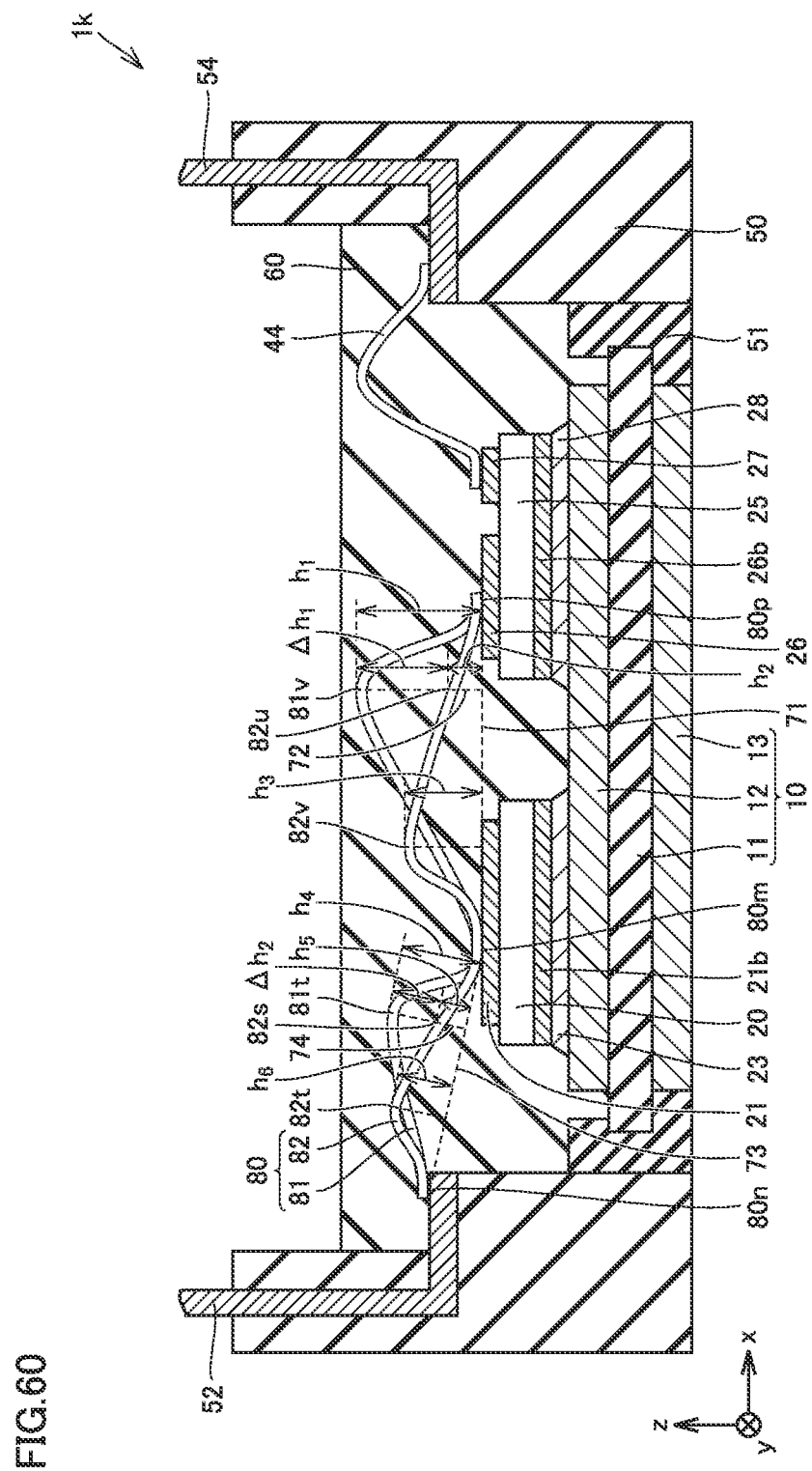
FIG. 60 is a schematic cross-sectional view of a power module according to a modification of the fifth embodiment.
Figure 61:
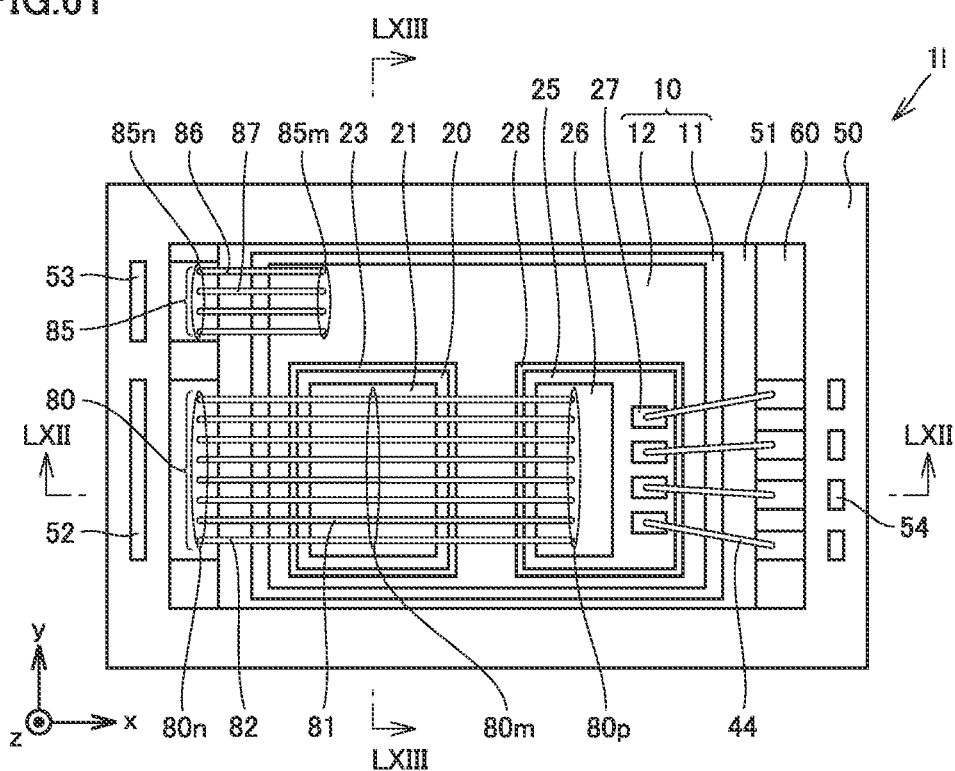
FIG. 61 is a schematic plan view of a power module according to a sixth embodiment.

Referring to FIG. 60, in a power module 1k in a modification of the present embodiment, in the first plan view in the second direction (the y direction), third height $h_3$ of second top 82v from first line 71 may be smaller than first height $h_1$. In the first plan view in the second direction (the y direction), third height $h_6$ of second top 82t from first line 73 may be smaller than first height $h_4$. Therefore, difference $\Delta h_1$ or $\Delta h_2$ between first height $h_1$ or $h_4$ and second height $h_2$ or $h_5$ becomes larger and a gap (see, for example, gap G in FIG. 59) between first conductive wire 81 and second conductive wire 82 is further widened.

Power modules 1j and 1k and the method of manufacturing the same in the present embodiment achieve effects below in addition to the effects achieved by power module 1i and the method of manufacturing the same in the fourth embodiment.

In power modules 1j and 1k and the method of manufacturing the same in the present embodiment, in the first plan view in the second direction (the y direction), first top 81v or 81t of first conductive wire 81 is displaced from second top 82v or 82t of second conductive wire 82 in the direction along first line 71 or 73. In the first bonded portion (bonded portion 80m; bonded portion 80n), second conductive wire 82 stands up from first line 71 or 73 more steeply than first conductive wire 81. In the second bonded portion (bonded portion 80p; bonded portion 80m), first conductive wire 81 stands up from first line 71 or 73 more steeply than second conductive wire 82.

Therefore, even though third height $h_3$ or $h_6$ of second top 82v or 82t is equal to first height $h_1$ or $h_4$ of first top 81v or 81t in the first plan view in the second direction (the y direction), difference $\Delta h_1$ or $\Delta h_2$ between first height $h_1$ or $h_4$ and second height $h_2$ or $h_5$ becomes larger and the gap between first conductive wire 81 and second conductive wire 82 is further widened. Air bubbles that were introduced in sealing member 60 in providing sealing member 60 and remain below first conductive wire 81 and second conductive wire 82 readily pass through a gap between first conductive wire 81 and second conductive wire 82 adjacent to each other and escape to the outside of sealing member 60. Lowering in insulating performance of sealing member 60 is prevented. Power modules 1j and 1k in the present embodiment are improved in reliability. According to the method of manufacturing power modules 1j and 1k in the present embodiment, power modules 1j and 1k improved in reliability are obtained.

In power module 1k and the method of manufacturing the same in the present embodiment, in the first plan view in the second direction (the y direction), third height $h_3$ or $h_6$ of second top 82v or 82t from first line 71 or 73 is smaller than first height $h_1$ or $h_4$. Therefore, difference $\Delta h_1$ or $\Delta h_2$ between first height $h_1$ or $h_4$ and second height $h_2$ or $h_5$ becomes larger and the gap between first conductive wire 81 and second conductive wire 82 is further widened. Air bubbles that were introduced in sealing member 60 in providing sealing member 60 and remain below first conductive wire 81 and second conductive wire 82 readily pass through a gap between first conductive wire 81 and second conductive wire 82 adjacent to each other and escape to the outside of sealing member 60. Lowering in insulating performance of sealing member 60 is prevented. Power module 1k in the present embodiment is improved in reliability. According to the method of manufacturing power module 1k in the present embodiment, power module 1k improved in reliability is obtained.

In power modules 1j and 1k in the present embodiment, first conductive wire 81 is equal in length to second conductive wire 82 between the first bonded portion (bonded portion 80m; bonded portion 80n) and the second bonded portion (bonded portion 80p; bonded portion 80m). Therefore, electrical isolation between second conductive wire 82 and circuit substrate 10 can be ensured while the entire first conductive wire 81 and the entire second conductive wire 82 are sealed with sealing member 60. Furthermore, first conductive wire 81 is substantially equal in electrical resistance to second conductive wire 82. A current equally flows through first conductive wire 81 and second conductive wire 82 and break of first conductive wire 81 and second conductive wire 82 can be prevented. Power modules 1j and 1k in the present embodiment are improved in reliability. According to the method of manufacturing power modules 1j and 1k in the present embodiment, power modules 1j and 1k improved in reliability are obtained.

Sixth Embodiment

A power module 1l in a sixth embodiment will be described with reference to FIGS. 61 to 65. Power module 1l in the present embodiment is similar in configuration to power module 1i in the fourth embodiment and the method of manufacturing power module 1l in the present embodiment includes steps similar to those in the method of manufacturing power module 1i in the fourth embodiment, and they are mainly different in points below.

Figure 62:
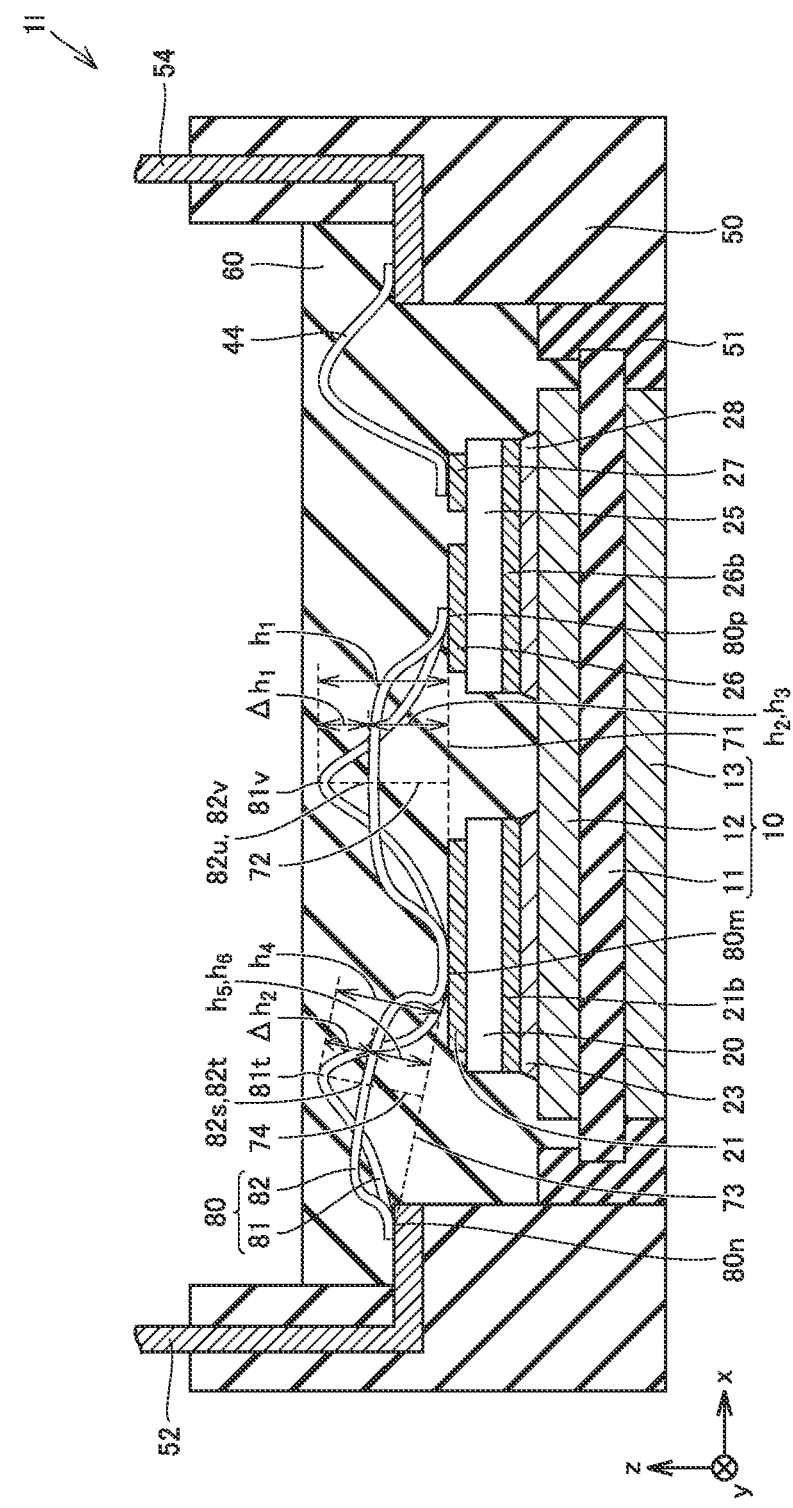
FIG. 62 is a schematic cross-sectional view along the line LXII-LXII shown in FIG. 61, of the power module according to the sixth embodiment.
Figure 63:
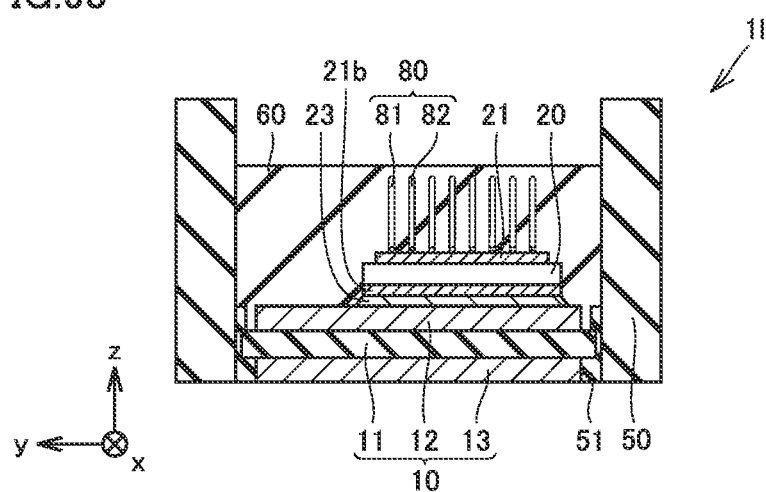
FIG. 63 is a schematic cross-sectional view along the line LXIII-LXIII shown in FIG. 61, of the power module according to the sixth embodiment.
Figure 64:
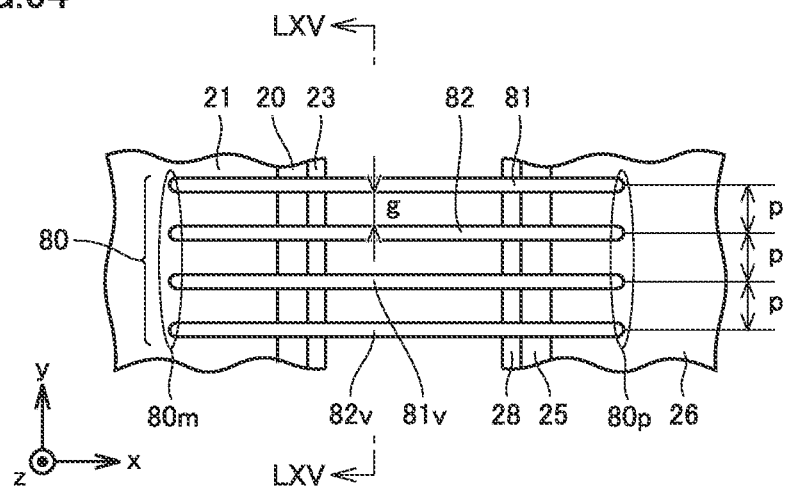
FIG. 64 is a partially enlarged schematic plan view of the power module according to the sixth embodiment.
Figure 65:
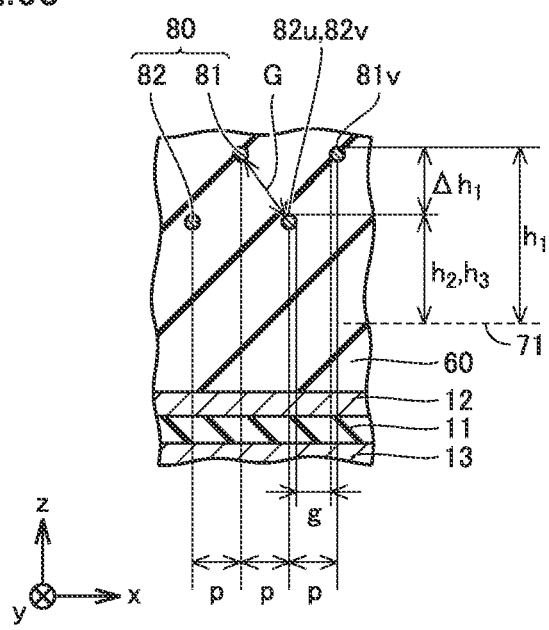
FIG. 65 is a partially enlarged schematic cross-sectional view along the line LXV-LXV shown in FIG. 64, of the power module according to the sixth embodiment.

Referring to FIGS. 62, 64, and 65, in the present embodiment, in the first plan view in the second direction (the y direction), third height $h_3$ of second top 82v from first line 71 is smaller than first height $h_1$. In bonded portion 80m and bonded portion 80p, first conductive wire 81 stands up from first line 71 more gently than second conductive wire 82.

In the first plan view in the second direction (the y direction), the first intermediate portion of first conductive wire 81 intersects with the third intermediate portion of second conductive wire 82. The first intermediate portion of first conductive wire 81 is a portion between bonded portion 80m and first top 81v. The third intermediate portion of second conductive wire 82 is a portion between bonded portion 80m and second top 82v. In the first plan view in the second direction (the y direction), the second intermediate portion of first conductive wire 81 intersects with the fourth intermediate portion of second conductive wire 82. The second intermediate portion of first conductive wire 81 is a portion between bonded portion 80p and first top 81v. The fourth intermediate portion of second conductive wire 82 is a portion between bonded portion 80p and second top 82v.

In the present embodiment, first conductive wire 81 is equal in length to second conductive wire 82 between bonded portion 80m and bonded portion 80p. First portion 82u of second conductive wire 82 is second top 82v of second conductive wire 82 with respect to first line 71. In a modification of the present embodiment, in the first plan view in the second direction (the y direction), first top 81v of first conductive wire 81 may be displaced from second top 82v of second conductive wire 82 in the direction along first line 71.

Referring to FIG. 62, in the present embodiment, in the first plan view in the second direction (the y direction), third height $h_6$ of second top 82t from first line 73 is smaller than first height $h_4$. In bonded portion 80n and bonded portion 80m, first conductive wire 81 stands up from first line 71 more gently than second conductive wire 82.

In the first plan view in the second direction (the y direction), a fifth intermediate portion of first conductive wire 81 intersects with a seventh intermediate portion of second conductive wire 82. The fifth intermediate portion of first conductive wire 81 is a portion between bonded portion 80n and first top 81t. The seventh intermediate portion of second conductive wire 82 is a portion between bonded portion 80n and second top 82t. In the first plan view in the second direction (the y direction), a sixth intermediate portion of first conductive wire 81 intersects with an eighth intermediate portion of second conductive wire 82. The sixth intermediate portion of first conductive wire 81 is a portion between bonded portion 80m and first top 81t. The eighth intermediate portion of second conductive wire 82 is a portion between bonded portion 80m and second top 82t.

In the present embodiment, first conductive wire 81 is equal in length to second conductive wire 82 between bonded portion 80n and bonded portion 80m. First portion 82s of second conductive wire 82 is second top 82t of second conductive wire 82 with respect to first line 73. In a modification of the present embodiment, in the first plan view in the second direction (the y direction), first top 81t of first conductive wire 81 may be displaced from second top 82t of second conductive wire 82 in the direction along first line 73.

Second conductive wire group 85 may be similar in configuration to first conductive wire group 80 that connects first lead terminal 52 and first front electrode 21 of first semiconductor element 20 to each other.

Effects of power module 1l and the method of manufacturing the same in the present embodiment will be described.

In power module 1l and the method of manufacturing the same in the present embodiment, in the first plan view in the second direction (the y direction), third height $h_3$ or $h_6$ of second top 82v or 82t from first line 71 or 73 is smaller than first height $h_1$ or $h_4$. In the first bonded portion (bonded portion 80m; bonded portion 80n) and the second bonded portion (bonded portion 80p; bonded portion 80m), first conductive wire 81 stands up from first line 71 or 73 more gently than second conductive wire 82. Power module 1l and the method of manufacturing the same in the present embodiment achieve effects the same as those achieved by power module 1i and the method of manufacturing the same in the fourth embodiment.

In power module 1l in the present embodiment, first conductive wire 81 is equal in length to second conductive wire 82 between the first bonded portion (bonded portion 80m; bonded portion 80n) and the second bonded portion (bonded portion 80p; bonded portion 80m). Therefore, electrical isolation between second conductive wire 82 and circuit substrate 10 can be ensured while the entire first conductive wire 81 and the entire second conductive wire 82 are sealed with sealing member 60. Furthermore, first conductive wire 81 is substantially equal in electrical resistance to second conductive wire 82. A current equally flows through first conductive wire 81 and second conductive wire 82 and break of first conductive wire 81 and second conductive wire 82 can be prevented. Power module 1l in the present embodiment is improved in reliability. According to the method of manufacturing power module 1l in the present embodiment, power module 1l improved in reliability is obtained.

Seventh Embodiment

The present embodiment is application of power modules 1 to 11 in the first to sixth embodiments to a power conversion apparatus. An example in which a power conversion apparatus 200 in the present embodiment is a three-phase inverter will be described below, although the power conversion apparatus is not particularly limited.

Figure 66:
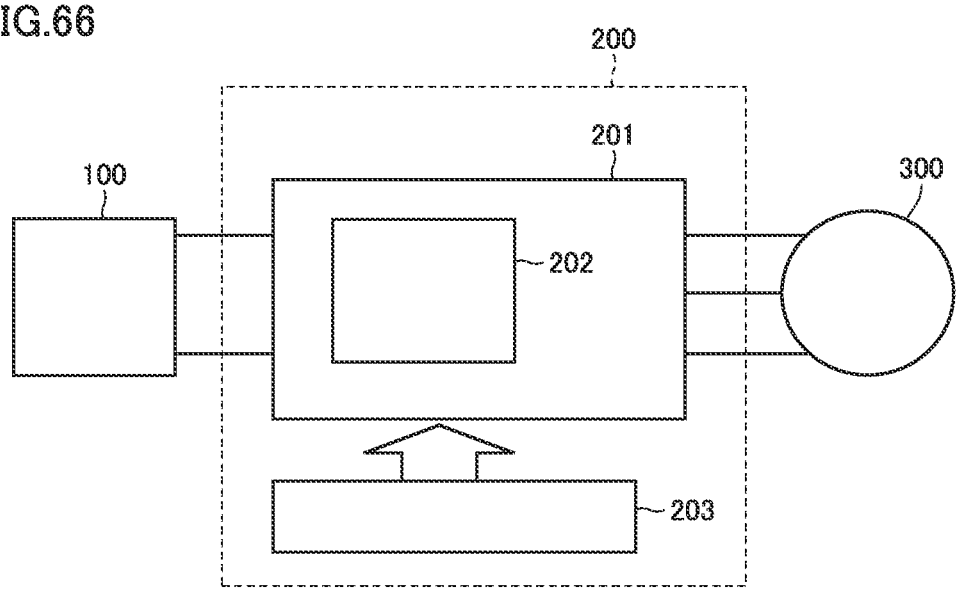
FIG. 66 is a block diagram showing a configuration of a power conversion system according to a seventh embodiment.

A power conversion system shown in FIG. 66 includes a power supply 100, power conversion apparatus 200, and a load 300. Power supply 100 is a direct-current (DC) power supply and supplies DC power to power conversion apparatus 200. Though power supply 100 is not particularly limited, it may be implemented, for example, by a DC system, a solar cell, or a storage battery, or by a rectification circuit or an AC/DC converter connected to an alternating-current (AC) system. Power supply 100 may be implemented by a DC/DC converter that converts DC power output from the DC system to different DC power.

Power conversion apparatus 200 is a three-phase inverter connected between power supply 100 and load 300, and it converts DC power supplied from power supply 100 into AC power and supplies AC power to load 300. As shown in FIG. 66, power conversion apparatus 200 includes a main conversion circuit 201 that converts DC power into AC power and outputs AC power and a control circuit 203 that outputs a control signal for controlling main conversion circuit 201 to main conversion circuit 201.

Load 300 is a three-phase motor driven by AC power supplied from power conversion apparatus 200. Though load 300 is not particularly limited, it is a motor mounted on various electrical appliances and used, for example, as a motor for a hybrid vehicle, an electric vehicle, a rail car, an elevator, or an air-conditioner.

Details of power conversion apparatus 200 will be described below. Main conversion circuit 201 includes a switching element (not shown) and a freewheeling diode (not shown). As the switching element switches a voltage supplied from power supply 100, main conversion circuit 201 converts DC power supplied from power supply 100 into AC power and supplies AC power to load 300. Though a specific circuit configuration of main conversion circuit 201 is various, main conversion circuit 201 according to the present embodiment is a two-level three-phase full bridge circuit and may be constituted of six switching elements and six freewheeling diodes in anti-parallel to respective switching elements. Any of power modules 1 to 11 in the first to sixth embodiments described above is applied to at least any of the switching elements and the freewheeling diodes of main conversion circuit 201. Every two switching elements of the six switching elements are connected in series to implement upper and lower arms, and the upper and lower arms implement phases (the U phase, the V phase, and the W phase) of the full bridge circuit. Output terminals of the upper and lower arms, that is, three output terminals of main conversion circuit 201, are connected to load 300.

Main conversion circuit 201 includes a drive circuit (not shown) that drives each switching element. The drive circuit may be contained in a semiconductor module 202 or may be provided separately from semiconductor module 202. The drive circuit generates a drive signal for driving the switching element included in main conversion circuit 201 and supplies the drive signal to a control electrode of the switching element of main conversion circuit 201. Specifically, the drive signal that sets the switching element to on and the drive signal that sets the switching element to off are output to the control electrode of each switching element in accordance with the control signal from control circuit 203. When the switching element is to be maintained in the on state, the drive signal is a voltage signal (an on signal) not lower than a threshold voltage of the switching element, and when the switching element is to be maintained in the off state, the drive signal is a voltage signal (an off signal) not higher than a threshold voltage of the switching element.

Control circuit 203 controls the switching element of main conversion circuit 201 such that desired electric power is supplied to load 300. Specifically, a time period (an on time period) during which each switching element of main conversion circuit 201 should be on is calculated based on electric power to be supplied to load 300. For example, main conversion circuit 201 can be controlled under pulse width modulation (PWM) control in which the on time period of the switching element is modulated in accordance with a voltage to be output. Then, a control command (a control signal) is output to a drive circuit provided in main conversion circuit 201 such that an on signal is output to the switching element to be turned on and an off signal is output to the switching element to be turned off at each time point. The drive circuit outputs the on signal or the off signal as the drive signal to a control electrode of each switching element, in accordance with the control signal.

In power conversion apparatus 200 according to the present embodiment, any of power modules 1 to 11 according to the first to sixth embodiments is applied as semiconductor module 202 included in main conversion circuit 201. Therefore, power conversion apparatus 200 according to the present embodiment is improved in reliability.

Though an example in which the present invention is applied to a two-level three-phase inverter is described in the present embodiment, the present invention can be applied to various power conversion apparatuses without being limited as such. Though a two-level power conversion apparatus is adopted in the present embodiment, a three-level power conversion apparatus or a multi-level power conversion apparatus may be applicable. When the power conversion apparatus supplies electric power to a single-phase load, the present invention may be applied to a single-phase inverter. When the power conversion apparatus supplies electric power to a DC load, the present invention may be applied to a DC/DC converter or an AC/DC converter.

The power conversion apparatus to which the present invention is applied is not limited to an example in which a motor is adopted as the load, and the power conversion apparatus may be incorporated, for example, in a power supply apparatus of an electro-discharge machine or a laser beam machine or a power supply apparatus of an induction heating cooker or a contactless power feed system. The power conversion apparatus to which the present invention is applied can be used as a power conditioner of a photovoltaic power generation system or a power storage system.

It should be understood that the first to seventh embodiments disclosed herein are illustrative and non-restrictive in every respect. At least two of the first to seventh embodiments disclosed herein may be combined unless there is inconsistency. The scope of the present invention is defined by the terms of the claims rather than the description above and is intended to include any modifications within the scope and meaning equivalent to the terms of the claims.

REFERENCE SIGNS LIST 1, 1a, 1b, 1c, 1d, 1e, 1f, 1g, 1h, 1i, 1j, 1k, 1l power module; 10 circuit substrate; 11 insulating substrate; 12 first conductive layer; 13 second conductive layer; 20 first semiconductor element; 21 first front electrode; 21b first back electrode; 23 first conductive joint member; 25 second semiconductor element; 26 second front electrode; 26b second back electrode; 27 third front electrode; 28 second conductive joint member; 30, 30b first conductive wire group; 30m, 30n, 30p, 35m, 35n bonded portion; 31a, 31b, 31c first conductive wire; 35, 35b second conductive wire group; 36a, 36b, 36c second conductive wire; 44 third conductive wire; 50 case; 51 joint member; 52 first lead terminal; 53 second lead terminal; 54 third lead terminal; 60 sealing member; 71, 73 first line; 72, 74 second line; 80 first conductive wire group; 80m, 80n, 80p, 85m, 85n bonded portion; 81, 86 first conductive wire; 81t, 81v first top; 82, 87 second conductive wire; 82s, 82u first portion; 82t, 82v second top; 85 second conductive wire group; 100 power supply; 200 power conversion apparatus; 201 main conversion circuit; 202 semiconductor module; 203 control circuit; 300 load; $h_1$, $h_4$ first height; $h_2$, $h_5$ second height; $h_3$, $h_6$ third height; p pitch

The invention claimed is:

1. A power module comprising:

a first conductive member;

a second conductive member spaced away from the first conductive member in a first direction;

a plurality of conductive wire groups that electrically connect the first conductive member and the second conductive member to each other; and an insulating sealing member, formed of a homogenous material, that seals at least a part of the first conductive member, at least a part of the second conductive member, and the plurality of conductive wire groups, the plurality of conductive wire groups being arranged in parallel in a second direction perpendicular to the first direction, each of the plurality of conductive wire groups being constituted of a plurality of conductive wires, the plurality of conductive wires being covered only with the insulating sealing member, the plurality of conductive wire groups each including a first bonded portion bonded to the first conductive member and a second bonded portion bonded to the second conductive member, in a plan view of the first conductive member, a maximum gap in the second direction between intermediate portions of a pair of the conductive wire groups directly adjacent to each other being larger than a first gap in the second direction between the first bonded portions of the pair of conductive wire groups, and the intermediate portions being located between the first bonded portion and the second bonded portion, in the plan view, the maximum gap in the second direction between the intermediate portions of the pair of conductive wire groups being larger than a second gap in the second direction between the second bonded portions of the pair of conductive wire groups wherein the plurality of conductive wires intersect with each other at the intermediate portions.

2. The power module according to claim 1, wherein
in the plan view, positions of tops of the plurality of conductive wires are different from each other, and
the plurality of conductive wires are equal in length to each other.

3. The power module according to claim 1, wherein
the first conductive member is a first electrode of a first semiconductor element,
the second conductive member is a second electrode of a second semiconductor element,
the first electrode is located at a height different from the second electrode, and
in the plan view, tops of the plurality of conductive wires overlap each other.

4. The power module according to claim 1, wherein
in the plan view, the plurality of conductive wires are arranged in the second direction, and
in the plan view, in a portion of each of the plurality of conductive wire groups where the maximum gap is defined, the plurality of conductive wires are closer to each other in the second direction than in the first bonded portion and the second bonded portion.

5. The power module according to claim 4, wherein
the plurality of conductive wires are different from each other in length,
in the plan view, a bonded portion of each of the plurality of wires corresponding to the first bonded portion, a respective bonded portion of each of the plurality of wires corresponding to the second bonded portion and a bonded portion of each of the plurality of wires corresponding to a third bonded portion being arranged along a single straight line, and
in the plan view, in the portion of each of the plurality of conductive wire groups, the plurality of conductive wires overlap each other.

6. The power module according to claim 1, wherein
portions of the pair of conductive wire groups where the maximum gap is defined are different from each other in height.

7. A power conversion apparatus comprising:
a main conversion circuit that includes the power module according to claim 1 and converts input electric power and outputs resultant electric power; and
a control circuit that outputs a control signal for controlling the main conversion circuit to the main conversion circuit.

8. A power module comprising:
a first conductive member;
a second conductive member spaced away from the first conductive member in a first direction;
a conductive wire group that electrically connects the first conductive member and the second conductive member to each other; and
an insulating sealing member, formed of a homogenous material, that seals at least a part of the first conductive member, at least a part of the second conductive member, and the conductive wire group,
the conductive wire group being constituted of a first conductive wire and a second conductive wire alternately arranged in a second direction that intersects with the first direction,
the first conductive wire and the second conductive wire being covered only with the insulating sealing member,
the conductive wire group including a first bonded portion bonded to the first conductive member and a second bonded portion bonded to the second conductive member,
in a first plan view in the second direction, a first height of a first top of the first conductive wire from a first line that connects the first bonded portion and the second bonded portion to each other being larger than a second height of a first portion of the second conductive wire from the first line,
the first portion being a portion of the second conductive wire on a second line that passes through the first top and is perpendicular to the first line in the first plan view, and
a difference between the first height and the second height being larger than a minimum gap between the first conductive wire and the second conductive wire adjacent to each other, between the first bonded portion and the second bonded portion in a second plan view in a third direction perpendicular to the first direction and the second direction.

9. The power module according to claim 8, wherein
the difference between the first height and the second height is at least 2.0 times and at most 5.0 times as large as a diameter of each of the first conductive wire and the second conductive wire.

10. The power module according to claim 8, wherein
in the first plan view, a third height of a second top of the second conductive wire from the first line is smaller than the first height, and
in the first bonded portion and the second bonded portion, the first conductive wire more steeply stands up from the first line than the second conductive wire.

* * * * *